(12) United States Patent
Nakagawa et al.

(10) Patent No.: US 10,619,046 B2
(45) Date of Patent: Apr. 14, 2020

(54) CURABLE RESIN COMPOSITION, CURED PRODUCT THEREOF, AND SEMICONDUCTOR DEVICE

(71) Applicant: DAICEL CORPORATION, Osaka-shi, Osaka (JP)

(72) Inventors: Yasunobu Nakagawa, Ohtake (JP); Shinya Yabuno, Ohtake (JP)

(73) Assignee: DAICEL CORPORATION, Osaka-shi (JP)

( * ) Notice: Subject to any disclaimer, the term of this patent is extended or adjusted under 35 U.S.C. 154(b) by 2 days.

(21) Appl. No.: 16/087,990

(22) PCT Filed: Mar. 23, 2017

(86) PCT No.: PCT/JP2017/011570
§ 371 (c)(1),
(2) Date: Sep. 24, 2018

(87) PCT Pub. No.: WO2017/164265
PCT Pub. Date: Sep. 28, 2017

(65) Prior Publication Data
US 2019/0106571 A1  Apr. 11, 2019

(30) Foreign Application Priority Data
Mar. 25, 2016  (JP) .................. 2016-062495

(51) Int. Cl.
| | | |
|---|---|---|
| *C08L 83/04* | (2006.01) | |
| *H01L 23/31* | (2006.01) | |
| *H01L 33/56* | (2010.01) | |
| *G02B 1/04* | (2006.01) | |
| *C09D 183/04* | (2006.01) | |
| *H01L 23/29* | (2006.01) | |
| *C08G 77/12* | (2006.01) | |
| *C08G 77/00* | (2006.01) | |
| *C08G 77/20* | (2006.01) | |
| *C08G 77/04* | (2006.01) | |

(52) U.S. Cl.
CPC ............ *C08L 83/04* (2013.01); *C09D 183/04* (2013.01); *G02B 1/04* (2013.01); *G02B 1/041* (2013.01); *H01L 23/296* (2013.01); *H01L 23/31* (2013.01); *H01L 33/56* (2013.01); *C08G 77/045* (2013.01); *C08G 77/12* (2013.01); *C08G 77/20* (2013.01); *C08G 77/80* (2013.01); *C08L 2205/025* (2013.01); *C08L 2205/03* (2013.01); *C08L 2205/035* (2013.01); *H01L 2224/48091* (2013.01); *H01L 2924/181* (2013.01)

(58) Field of Classification Search
CPC ........ C08G 77/12; C08G 77/20; C08G 77/08; C08L 83/04; C09D 183/04; C09D 183/14; H01L 23/296; H01L 23/31
See application file for complete search history.

(56) References Cited

U.S. PATENT DOCUMENTS

| | | | | |
|---|---|---|---|---|
| 5,674,966 A | * | 10/1997 | McDermott | ........... C08G 77/20 525/477 |
| 2006/0073347 A1 | | 4/2006 | Morita et al. | |
| 2014/0332987 A1 | | 11/2014 | Kamuro et al. | |
| 2015/0340299 A1 | | 11/2015 | Nakagawa et al. | |
| 2016/0289388 A1 | | 10/2016 | Fu et al. | |

FOREIGN PATENT DOCUMENTS

| | | |
|---|---|---|
| JP | 2004-143361 A | 5/2004 |
| JP | 2015-74751 A | 4/2015 |
| WO | WO 2013/094625 A1 | 6/2013 |
| WO | WO 2014/109349 A1 | 7/2014 |
| WO | WO 2015/099934 A1 | 7/2015 |
| WO | WO 2015/178475 A1 | 11/2015 |

OTHER PUBLICATIONS

International Search Report (PCT/ISA/210) issued in PCT/JP2017/011570, dated Apr. 18, 2017.

* cited by examiner

*Primary Examiner* — Kuo Liang Peng
(74) *Attorney, Agent, or Firm* — Birch, Stewart, Kolasch & Birch, LLP

(57) ABSTRACT

An object of the present invention is to provide a curable resin composition for forming a less tacky cured product having excellent gas barrier properties, heat resistance, light resistance, flexibility and heat shock resistance. The curable resin composition comprises the following components (A), (B), (C), and (D), wherein a content of the component (C) is 0.3 to 20 wt %, based on the total amount of the composition:
(A): a polyorganosiloxane represented by an average unit formula: $(SiO_{4/2})_{a1}(R^1SiO_{3/2})_{a2}(R^1{}_2SiO_{2/2})_{a3}(R^1{}_3SiO_{1/2})_{a4}$, wherein each $R^1$ is alkyl, aryl, alkenyl, etc., and a percentage of the alkyl is 50 to 98 mol %, a percentage of the aryl is 1 to 50 mol %, and a percentage of the alkenyl is 1 to 35 mol %, based on the total amount of $R^1$, and a1>0, a2>0, a3≥0, a4>0, 0.5≤a1/a2≤10, and a1+a2+a3+a4=1;
(B): a polyorganosiloxane represented by an average composition formula: $R^2{}_mH_nSiO_{[(4-m-n)/2]}$ wherein $R^2$ is alkyl or aryl, and 0.7≤m≤2.1, 0.001≤n≤1.0, and 0.8≤m+n≤3;
(C): a straight-chain polyorganosiloxane represented by a general formula (III-1):

[Chem. 1]

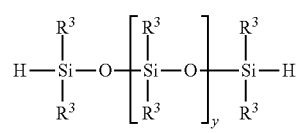

(III-1)

wherein $R^3$ is alkyl, and y is an integer of not less than 1 and not more than 100; and
(D): a hydrosilylation catalyst.

20 Claims, 1 Drawing Sheet

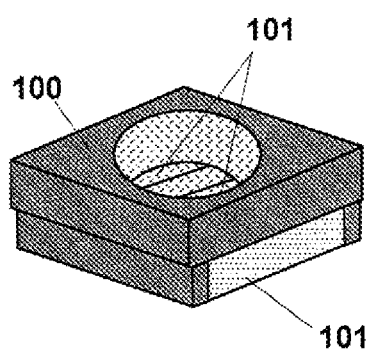 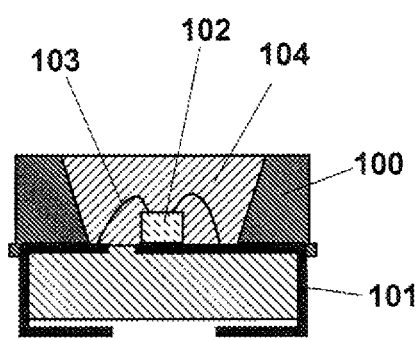
(a)          (b)

CURABLE RESIN COMPOSITION, CURED PRODUCT THEREOF, AND SEMICONDUCTOR DEVICE

TECHNICAL FIELD

The present invention relates to a curable resin composition, a cured product thereof, an encapsulating agent using the curable resin composition, and a semiconductor device (in particular, an optical semiconductor device) obtained by using the encapsulating agent to encapsulate a semiconductor element (in particular, an optical semiconductor element). In addition, the present invention also relates to a semiconductor device (in particular, an optical semiconductor device) having a lens obtained by curing the above curable resin composition. The present application claims priority of Japanese Patent Application No. 2016-062495, filed in Japan on Mar. 25, 2016, the content of which is herein incorporated by reference.

BACKGROUND ART

In recent years, optical semiconductor devices have been made to have a higher output and brightness. Then, optical lenses and encapsulants that encapsulate each optical semiconductor element used in such optical semiconductor devices have increasingly been required to have further higher transparency, heat resistance, and light resistance. Meanwhile, electrode corrosion causes a problem such as a decrease in luminous intensity over time, so that excellent gas barrier properties against corrosion gas including, as representative examples, sulfur compounds such as $SO_x$ and $H_2S$ have been required at the same time.

As encapsulants for optical semiconductor devices, in particular, for high brightness and high current lighting applications, mainly used are methyl silicone (methyl silicone-based encapsulants) excellent in heat resistance and light resistance (see, for example, Patent Literature 1).

Also, widely used are phenyl silicone-based encapsulants having relatively good gas barrier properties against corrosive gas (see, for example, Patent Literature 2).

CITATION LIST

Patent Literature

Patent Literature 1: WO2014/109349
Patent Literature 2: Japanese Patent Laid-Open No. 2004-143361

SUMMARY OF INVENTION

Technical Problem

Due to high transparency, heat resistance, and light resistance, the methyl silicone-based encapsulants described in Patent Literature 1 have better barrier properties against corrosive gas than conventional methyl silicone-based encapsulants. However, the properties are still insufficient, so that electrode corrosion cannot be fully prevented. In addition, when the methyl silicone-based encapsulants are used, the surface thereof is likely to be tacky, so that dust and other things are attached. This has caused a problem, namely a decrease in luminous intensity.

Here, while the phenyl silicone-based encapsulants described in Patent Literature 2 exhibit increased gas barrier properties and can be used to prevent electrode corrosion in a certain degree, the heat resistance and light resistance thereof are far from those of the methyl silicone-based encapsulants, so that they have not been suited for, in particular, high output and high brightness lighting applications.

In view of such background situations, while the methyl silicone-based encapsulants excellent in heat resistance and light resistance have been used for, in particular, high output and high brightness lighting applications, a step of coating an electrode with a coating liquid before encapsulation so as to prevent corrosion is added and/or gold, which is free of corrosion, is used for the electrode itself. However, the problem is that the manufacturing step is complicated and the cost is high, etc. Meanwhile, usage of the phenyl silicone-based encapsulants having poor heat resistance and light resistance has been limited to applications with low current and low output and low illuminance.

Thus, desired are encapsulants that are used for optical semiconductors and have both increased heat resistance, light resistance and gas barrier properties.

In recent years, larger packages of optical semiconductor devices (LED packages) have been made, and accordingly, encapsulants have been required to have flexibility. Conventional silicone resins, however, have poor flexibility. Accordingly, when the resins used as encapsulants for the larger LED packages are subjected to a thermal shock such as a hot/cold cycle (cyclic repetition of heating and cooling), problems such as lighting failure due to fracture of a bonding wire caused by the occurrence of cracks have occurred.

Accordingly, an object of the present invention is to provide a curable resin composition that can be cured to form a less tacky material (cured product) having increased gas barrier properties against, in particular, corrosive gas (e.g., $H_2S$ gas, $SO_x$ gas) and excellent heat resistance, light resistance, flexibility and heat shock resistance.

In addition, another object of the present invention is to provide an encapsulating agent using the above curable resin composition and a semiconductor device (in particular, an optical semiconductor device) with excellent quality and durability as obtained by using the encapsulating agent to encapsulate a semiconductor element (in particular, an optical semiconductor element).

Further, another object of the present invention is to provide a lens-forming resin composition using the above curable resin composition and a semiconductor device (in particular, an optical semiconductor device) with excellent quality and durability, which semiconductor device has a lens as obtained by curing the above lens-forming resin composition.

Solution to Problem

The present inventors have conducted intensive studies to solve the above problems and have found that when a curable resin composition, in which a structural unit ratio (Q-unit/T-unit) is adjusted and a polyorganosiloxane having as alkyl group such as a methyl group and an aryl group such as a phenyl group in a molecule as an essential component is contained, is blended with a specific amount of a straight-chain dialkyl silicone resin having a hydrosilyl group (SiH group) at both ends and a specific degree of polymerization and is cured, a less tacky cured product having increased gas barrier properties against, in particular, corrosive gas, excellent in heat resistance, light resistance, flexibility and heat shock resistance can be formed, thereby completed the present invention.

Specifically, the present invention provides a curable resin composition comprising the following components (A), (B), (C) and (D), wherein a content (amount blended) of the component (C) is not less than 0.3 wt % and not more than 20 wt %, based on the total amount (100 wt %) of the curable resin composition:

(A): a polyorganosiloxane represented by the following average unit formula (I):

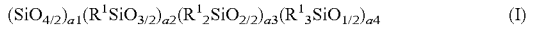

$$(SiO_{4/2})_{a1}(R^1SiO_{3/2})_{a2}(R^1{}_2SiO_{2/2})_{a3}(R^1{}_3SiO_{1/2})_{a4} \quad (I)$$

wherein each $R^1$ is the same or different and is an alkyl group having 1 to 10 carbon atoms, an aryl group having 6 to 14 carbon atoms, an alkenyl group having 2 to 8 carbon atoms, an alkoxy group having 1 to 10 carbon atoms, or a hydroxyl group, when a percentage of the alkyl group is X mol %, a percentage of the aryl group is Y mol %, and a percentage of the alkenyl group is Z mol % based on the total amount (100 mol %) of $R^1$, X is 50 to 98 mol %, Y is 1 to 50 mol %, and Z is 1 to 35 mol %, and a1, a2, a3, and a4 are numbers satisfying a1>0, a2>0, a3≥0, a4>0, 0.5≤a1/a2≤10, and a1+a2+a3+a4=1;

(B): a polyorganosiloxane represented by the following average composition formula (II):

$$R^2{}_mH_nSiO_{[(4-m-n)/2]} \quad (II)$$

wherein each $R^2$ is the same or different and is an alkyl group having 1 to 10 carbon atoms or an aryl group having 6 to 14 carbon atoms and at least one of $R^2$ is an aryl group, at least 2 hydrogen atoms are bonded to the silicon atom, and m and n are numbers satisfying 0.7≤m≤2.1, 0.001≤n≤1, and 0.8≤m+n≤3;

(C): a straight-chain polyorganosiloxane that is a liquid having a viscosity at 25° C. of 10000 mPa·s or less, represented by the following general formula (III-1):

[Chem. 1]

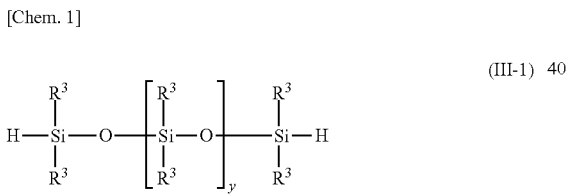

(III-1)

wherein each $R^3$ is the same or different and represents an alkyl group having 1 to 10 carbon atoms, and y represents an integer of not less than 1 and not more than 100; and (D): a hydrosilylation catalyst In the curable resin composition, the component (A) may be a polyorganosiloxane that has a weight-average molecular weight of not less than 500 and not more than 50000 in terms of polystyrene, has a molecular weight distribution of not less than 1 and not more than 4, and is a liquid or solid having a viscosity at 25° C. of 10 mPa·s or more.

In the component (A) of the curable resin composition, a ratio of X to Y (X/Y) may be 0.5 to 25.

The curable resin composition may further comprise the following component (E):

(E): a polyorganosiloxysilalkylene having a group containing one or more aliphatic carbon-carbon unsaturated bonds in a molecule.

The curable resin composition may further comprise the following component (F):

(F): at least one zinc compound selected from the group consisting of zinc carboxylates and zinc-β-diketone complexes.

In the curable resin composition, a content of the component (F) may be 0.01 to 1 wt %, based on the total amount (100 wt %) of the curable resin composition.

The curable resin composition may further comprise the following component (G):

(G): a ladder-type polyorganosilsesquioxane having one or more alkenyl groups and one or more aryl groups in a molecule.

In the curable resin composition, the component (B) may have at least two structural units represented by $(R^{2'}{}_2HSiO_{1/2})$ where each $R^{2'}$ is the same or different and is an alkyl group having 1 to 10 carbon atoms or an aryl group having 6 to 14 carbon atoms.

In the curable resin composition, the component (B) may comprise a component (B1) at a content of not less than 1 wt % and not more than 99 wt %, the component (B1) being represented by the following formula (II-1):

[Chem. 2]

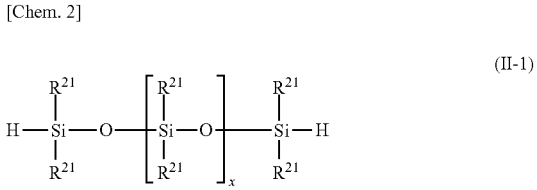

(II-1)

wherein each $R^{21}$ is the same or different and represents an alkyl group having 1 to 10 carbon atoms or an aryl group having 6 to 14 carbon atoms, at least one of $R^{21}$ is an aryl group, and x represents an integer of 0 to 1000, and the component (B1) being a liquid having a viscosity at 25° C. of 10000 mPa·s or less.

The curable resin composition may further comprise an isocyanurate compound (H) represented by the following formula (2):

[Chem. 3]

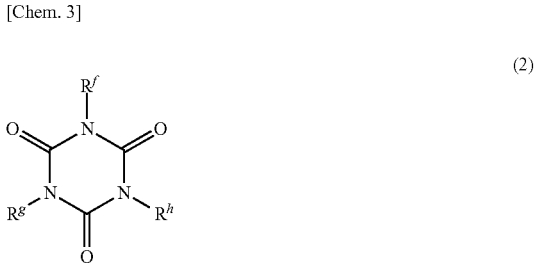

(2)

wherein $R^f$, $R^g$, and $R^h$ are the same or different and each represent a group represented by formula (2a) or a group represented by formula (2b), provided that at least one of $R^f$, $R^g$, and $R^h$ is a group represented by formula (2b):

[Chem. 4]

(2a)

wherein $R^i$ is a hydrogen atom, or a straight-chain or branched-chain $C_{1-8}$ alkyl group; and

[Chem. 5]

(2b)

wherein $R^j$ is a hydrogen atom or a straight-chain or branched-chain $C_{1-8}$ alkyl group.

The curable resin composition may further comprise a silane coupling agent (I).

In addition, the present invention provides a cured product of the curable resin composition.

The cured product may have a refractive index at 589 nm of not less than 1.46 and not more than 1.54.

In addition, the curable resin composition may be an encapsulating agent.

In addition, the curable resin composition may be a lens-forming resin composition.

Further, the present invention provides a semiconductor device having a semiconductor element and an encapsulant that encapsulates the semiconductor element, wherein the encapsulant is a cured product of the curable resin composition (encapsulating agent).

Furthermore, the present invention provides a semiconductor device having a semiconductor element and a lens, wherein the lens is a cured product of the curable resin composition (lens-forming resin composition).

Moreover, the present invention provides a semiconductor device having a semiconductor element, an encapsulant that encapsulates the semiconductor element, and a lens, wherein the encapsulant is a cured product of the curable resin composition (encapsulating agent) and the lens is a cured product of the curable resin composition (lens-forming resin composition).

In the semiconductor device, the cured product may have a refractive index at 589 nm of not less than 1.46 and not more than 1.54.

The semiconductor device may be an optical semiconductor device.

More specifically, the present invention relates to the following items.

[1] A curable resin composition comprising the following components (A), (B), (C) and (D), wherein a content (amount blended) of the component (C) is not less than 0.3 wt % and not more than 20 wt %, based on the total amount (100 wt %) of the curable resin composition:

(A): a polyorganosiloxane represented by the following average unit formula (I):

$(SiO_{4/2})_{a1}(R^1SiO_{3/2})_{a2}(R^1{}_2SiO_{2/2})_{a3}(R^1{}_3SiO_{1/2})_{a4}$  (I)

wherein each $R^1$ is the same or different and is an alkyl group having 1 to 10 carbon atoms (preferably a methyl group), an aryl group having 6 to 14 carbon atoms (preferably a phenyl group), an alkenyl group having 2 to 8 carbon atoms (preferably a vinyl group), an alkoxy group having 1 to 10 carbon atoms (preferably a methoxy group, an ethoxy group), or a hydroxyl group, when a percentage of the alkyl group is X mol %, a percentage of the aryl group is Y mol %, and a percentage of the alkenyl group is Z mol % based on the total amount (100 mol %) of $R^1$, x is 50 to 98 mol %, Y is 1 to 50 mol %, and Z is 1 to 35 mol %, and a1, a2, a3, and a4 are numbers satisfying a1>0, a2>0, a3≥0, a4>0, 0.5≤a1/a2≤10, and a1+a2+a3+a4=1;

(B): a polyorganosiloxane represented by the following average composition formula (II):

$R^2{}_mH_nSiO_{[(4-m-n)/2]}$  (II)

wherein each $R^2$ is the same or different and is an alkyl group having 1 to 10 carbon atoms (preferably a methyl group) or an aryl group having 6 to 14 carbon atoms (preferably a phenyl group) and at least one of $R^2$ is an aryl group (preferably a phenyl group), at least 2 hydrogen atoms are bonded to the silicon atom, and m and n are numbers satisfying 0.7≤m≤2.1, 0.001≤n≤1, and 0.8≤m+n≤3;

(C) a straight-chain polyorganosiloxane that is a liquid having a viscosity at 25° C. of 10000 mPa·s or less, represented by the following general formula (III-1):

[Chem. 6]

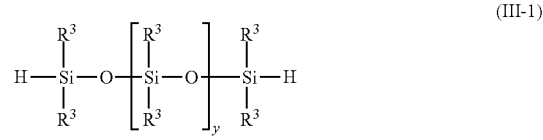

(III-1)

wherein each $R^3$ is the same or different and represents an alkyl group having 1 to 10 carbon atoms (preferably a methyl group), and y represents an integer of not less than 1 and not more than 100; and (D): a hydrosilylation catalyst.

[2] The curable resin composition according to item [1], wherein X is 55 to 95 mol % (preferably 60 to 90 mol %).

[3] The curable resin composition according to item [1] or [2], wherein Y is 3 to 40 mol % (preferably 5 to 30 mol %).

[4] The curable resin composition according to any one of items [1] to [3], wherein Z is 2 to 25 mol % (preferably 3 to 15 mol %).

[5] The curable resin composition according to any one of items [1] to [4], wherein the component (A) is a polyorganosiloxane that has a weight-average molecular weight of not less than 500 and not more than 50000 in terms of polystyrene, has a molecular weight distribution of not less than 1 and not more than 4, and is a liquid or solid having a viscosity at 25° C. of 10 mPa·s or more.

[6] The curable resin composition according to any one of items [1] to [5], wherein a ratio of X to Y (X/Y) in the component (A) is 0.5 to 25 (preferably 1 to 20 and more preferably 2 to 15).

[7] The curable resin composition according to any one of items [1] to [6], wherein a1 is 0.05 to 0.8 (preferably 0.07 to 0.6 and more preferably 0.1 to 0.4).

[8] The curable resin composition according to any one of items [1] to [7], wherein a2 is 0.01 to 0.8 mol % (preferably 0.03 to 0.5 and more preferably 0.05 to 0.3).

[9] The curable resin composition according to any one of items [1] to [8], wherein a3 is 0 to 0.9 (preferably 0 to 0.6 and more preferably 0 to 0.3).

[10] The curable resin composition according to any one of items [1] to [9], wherein a4 is 0.01 to 0.9 (preferably 0.3 to 0.8 and more preferably 0.5 to 0.7).

[11] The curable resin composition according to any one of items [1] to [10], wherein a1/a2 is 0.6 to 8 (preferably 0.7 to 6, more preferably 1 to 5, more preferably 1.2 to 5, more preferably 1.5 to 5, and particularly preferably 2 to 5).

[12] The curable resin composition according to any one of items [1] to [11], wherein the component (A) comprises a polyorganosiloxane represented by the following average unit formula:

$(SiO_{4/2})_{a5}(R^{1a}SiO_{3/2})_{a6}(R^{1a}{}_2R^{1b}SiO_{1/2})_{a7}(R^{1a}{}_3SiO_{1/2})_{a8}$ wherein each $R^{1a}$ is the same or different and is an alkyl group having 1 to 10 carbon atoms (preferably a methyl group), an aryl group having 6 to 14 carbon atoms (preferably a phenyl group), an alkoxy group having 1 to 10 carbon atoms (preferably a methoxy group, an ethoxy group), or a hydroxyl group, $R^{1b}$ is the same or different and represents an alkenyl group having 2 to 8 carbon atoms (preferably a vinyl group), when a percentage of the alkyl group is X mol %, a percentage of the aryl group is Y mol %, and a percentage of the alkenyl group is Z mol % based on the total amount (100 mol %) or $R^{1a}$ and $R^{1b}$, X is 50 to 98 mol %, Y is 1 to 50 mol %, and Z is 1 to 35 mol %, and a5, a6, a7, and a8 are numbers satisfying a5>0, a6>0, a7>0, a8≥0, a5+a6+a7+a8=1, and 0.5≤a5/a6≤10.

[13] The curable resin composition according to item [12], wherein a5 is 0.05 to 0.8 mol (preferably 0.07 to 0.6 and more preferably 0.1 to 0.4).

[14] The curable resin composition according to item [12] or [13], wherein a6 is 0.01 to 0.8 (preferably 0.03 to 0.5 and more preferably 0.05 to 0.3).

[15] The curable resin composition according to any one of items [12] or [14], wherein a7 is 0.01 to 0.4 (preferably 0.02 to 0.2).

[16] The curable resin composition according to any one of items [12] or [15], wherein a8 is 0.05 to 0.7 (preferably 0.2 to 0.5).

[17] The curable resin composition according to any one of items [12] or [16], wherein a7+a8 is 0.1 to 0.9 (preferably 0.3 to 0.8 and more preferably 0.5 to 0.7).

[18] The curable resin composition according to any one of items [12] or [17], wherein a7/a6 is 0.6 to 8 (preferably 0.7 to 0.6, more preferably 1 to 5, more preferably 1.2 to 5, more preferably 1.5 to 5, and particularly preferably 2 to 5).

[19] The curable resin composition according to any one of items [12] or [18], wherein a7/(a7+a8) is 0.005 to 0.95 (preferably 0.01 to 0.92).

[20] The curable resin composition according to any one of items [12] or [19], wherein a5/(a5+a6+a7+a8) is 0.05 to 0.95 (preferably 0.10 to 0.92).

[21] The curable resin composition according to any one of items [1] or [20], wherein the weight-average molecular weight (Mw) of the component (A) is not less than 500 and not more than 50000 (preferably not less than 600 and not more than 40000, more preferably not less than 700 and not more than 20000, and particularly preferably not less than 1000 and not more than 10000).

[22] The curable resin composition according to any one of items [1] or [21], wherein the molecular weight distribution (Mw/Mn) of the component (A) is not less than 1 and not more than 4 (preferably 1 to 3.5, more preferably 1 to 3, and particularly preferably 1 to 2.5).

[23] The curable resin composition according to any one of items [1] or [22], wherein the viscosity at 25° C. of the component (A) is 10 mPa·s or more (preferably 100 mPa·s or more and more preferably 500 mPa·s or more).

[24] The curable resin composition according to any one of items [1] or [23], wherein the viscosity at 25° C. of the component (A) is 1000000 mPa·s or less (preferably 100000 mPa·s or less).

[25] The curable resin composition according to any one of items [1] or [24], wherein a content (amount blended) of the component (A) is 20 to 99 wt % (more preferably 40 to 97 wt % and still more preferably 50 to 95 wt %), based on the total amount (100 wt %) of the curable resin composition.

[26] The curable resin composition according to any one of items [1] or [25], wherein when a percentage of the alkyl group based on the total amount (100 mol %) of $R^2$ is X' mol % in the component (B), X' is 20 to 95 mol % (more preferably 30 to 93 mol % and still more preferably 40 to 90 mol %).

[27] The curable resin composition according to any one of items [1] or [26], wherein when a percentage of the aryl group based on the total amount (100 mol %) of $R^2$ is Y' mol % in the component (B), Y' is 1 to 80 mol % (preferably 3 to 60 mol % and more preferably 5 to 40 mol %).

[28] The curable resin composition according to any one of items [1] to [27], wherein when a percentage of the SiH group (a hydrosilyl group) based on the total amount (100 mol %) of $R^2$ is Z' mol % in the component (B), Z' is 2 to 70 mol % (preferably 5 to 60 mol % and more preferably 10 to 55 mol %).

[29] The curable resin composition according to any one of items [1] to [28], wherein, a ratio of a content (X') of the alkyl group to a content (Y') of the aryl group (X'/Y') in the component (B) is 1/100 to 100/1 (preferably 10/100 to 100/10 and more preferably 20/100 to 100/20).

[30] The curable resin composition according to any one of items [1] to [29], wherein m is 0.8 to 2.1 (preferably 1 to 2).

[31] The curable resin composition according to any one of items [1] to [30], wherein n is 0.01 to 1 (preferably 0.2 to 1).

[32] The curable resin composition according to any one of items [1] to [31], wherein m+n is 1 to 2.9 (preferably 1.5 to 2.8).

[33] The curable resin composition according to any one of items [1] to [32], wherein the component (B) comprises at least two (preferably 2 to 4 and more preferably 2) structural units (M-units) represented by $(R^{2'}_2HSiO_{1/2})$ in a molecule where each $R^{2'}$ is the same or different and is an alkyl group having 1 to 10 carbon, atoms (preferably a methyl group) or an aryl group having 6 to 14 carbon, atoms (preferably a phenyl group).

[34] The curable resin composition according to any one of items [1] to [33], wherein the form of component (B) is a liquid having a viscosity at 25° C. of 0.1 to 1 billion mPa·s (preferably 0.1 to 100000 mPa·s or less).

[35] The curable resin composition according to any one of items [1] to [34], wherein the component (B) comprises a polyorganosiloxane having at least two structural units (M-units) represented by $(R^{2a}_2HSiO_{1/2})$, the polyorganosiloxane being represented by the following average unit formula

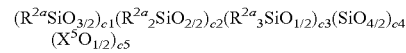

$$(R^{2a}SiO_{3/2})_{c1}(R^{2a}_2SiO_{2/2})_{c2}(R^{2a}_3SiO_{1/2})_{c3}(SiO_{4/2})_{c4}(X^5O_{1/2})_{c5}$$

wherein each $R^{2a}$ is the same or different and is a hydrogen atom, an alkyl group having 1 to 10 carbon atoms (preferably a methyl group), or an aryl group having 6 to 14 carbon atoms (preferably phenyl group), $X^5$ is a hydrogen atom or an alkyl group (preferably a methyl group), and c1 is 0 or a positive number, c2 is 0 or a positive number, c3 is 0 or a positive number, c4 is 0 or a positive number, c5 is 0 or a positive number, and (c1+c2+c3) is a positive number.

[36] The curable resin composition according to item [35], wherein a percentage of the hydrogen atom based on the total amount (100 mol %) of $R^{2a}$ is 2 to 70 mol %.

[37] The curable resin composition according to any one of items [1] to [36], wherein the component (B) comprises a straight-chain polyorganosiloxane having two or more hydrosilyl groups at both ends of the molecule.

[38] The curable resin composition according to item [37], wherein a percentage of the hydrogen atom (silicon-bonded hydrogen atom) based on the total amount (100 mol %) of groups bonded to the silicon atoms is 2 to 70 mol %.

[39] The curable resin composition according to item [37] or [38], wherein a percentage of the alkyl group (in particular, the methyl group) based on the total amount (100 mol %) of groups bonded to the silicon atoms is 20 to 95 mol % (preferably 40 to 95 mol %).

[40] The curable resin composition according to any one of items [37] to [39], wherein a percentage of the aryl group (in particular, the phenyl group) based on the total amount (100 mol %) of groups bonded to the silicon atoms is 1 to 80 mol %.

[41] The curable resin composition according to any one of items [37] to [40], wherein the component (B) comprises a straight-chain polyorganosiloxane (hereinafter sometimes referred to as a component (B1)) represented by the following formula (II-1):

[Chem. 7]

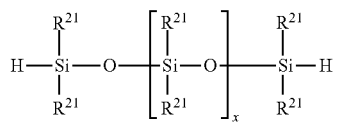

(II-1)

wherein each $R^{21}$ is the same or different and represents an alkyl group having 1 to 10 carbon atoms (preferably a methyl group) or an aryl group having 6 to 14 carbon atoms (preferably a phenyl group), at least one of $R^{21}$ is an aryl group (preferably a phenyl group), and x is an integer of 0 to 1000 (preferably an integer of 1 to 100).

[42] The curable resin composition according to item [41], wherein the component (B), a content of the component (B1) is not less than 1 wt % and not more than 99 wt % (preferably not less than 10 wt % and not more than 50 wt %).

[43] The curable resin composition according to item [41] or [42], wherein the component (B1) is a liquid at 25° C.

[44] The curable resin composition according to any one of items [41] or [43], wherein the component (B1) has a viscosity at 25° C. of 10000 mPa·s or less (preferably 5000 mPa·s or less).

[45] The curable resin composition according to any one of items [41] or [42], wherein the component (B1) has a viscosity at 25° C. of 1 mPa·s or more (preferably 5 mPa·s or more).

[45] The curable resin composition according to any one of items [1] or [45], wherein the component (B) comprises, in a molecule, a branched-chain polyorganosiloxane having two or more M-units represented by $(R_2HSiO_{1/2})$ and a siloxane unit (T-unit) represented by $RSiO_{3/2}$ where R is an alkyl group having 1 to 10 carbon atoms (preferably a methyl group) or an aryl group having 6 to 14 carbon atoms (preferably a phenyl group) and at least one R is an aryl group (preferably a phenyl group).

[47] The curable resin composition according to item [46], wherein a percentage of the alkyl group (in particular, the methyl group) based on the total amount (100 mol %) of groups bonded to the silicon atoms is 20 to 95 mol % (preferably 50 to 90 mol %).

[48] The curable resin composition according to item [46] or [47], wherein a percentage of the aryl group (in particular, the phenyl group) based on the total amount (100 mol %) of groups bonded to the silicon atoms is 1 to 80 mol %.

[49] The curable resin composition according to any one of items [46] or [48], wherein the branched-chain polyorganosiloxane is represented by the average unit formula according to item [35] where the c1 is a positive number.

[50] The curable resin composition according to item [49], wherein c2/c1 is a number of 0 to 10.

[51] The curable resin composition according to item [49] or [50], wherein c3/c1 is a number of 0 to 0.5.

[52] The curable resin composition according to any one of items [49] or [51], wherein c4/(c1+c2+c3+c4) is a number of 0 to 0.3.

[53] The curable resin composition according to any one of items [49] or [52], wherein c5/(c1+c2+c3+c4) is a number of 0 to 0.4.

[54] The curable resin composition according to any one of items [46] or [53], wherein a weight-average molecular weight of the branched-chain polyorganosiloxane as measured by GPC in terms of standard polystyrene is 100 to 50000 (preferably 150 to 40000, more preferably 150 to 10000, and still more preferably 200 to 3000).

[55] The curable resin composition according to any one of items [1] or [54], wherein the weight-average molecular weight (Mw) of the component (B) is not less than 100 and not more than 50000 (preferably not less than 150 and not more than 40000, more preferably not less than 175 and not more than 20000, and particularly preferably not less than 200 and not more than 10000).

[56] The curable resin composition according to any one of items [1] to [55], wherein the component has a molecular weight distribution (Mw/Mn) of sot less than 1 and not more than 4 (preferably 1 to 3.5, more preferably 1 to 3, and particularly preferably 1 to 2.5).

[57] The curable resin composition according to any one of items [1] to [56], wherein the component (B) has a viscosity at 25° C. of 1 mPa·s or more (preferably 5 mPa·s or more).

[58] The curable resin composition according to any one of items [1] to [57], wherein the component (B) has a viscosity at 25 of 10000 mPa·s or less (preferably 5000 mPa·s or less).

[59] The curable resin composition according to any one of items [1] to [58], wherein the component (B) comprises at least one compound selected from the group consisting of 1,1,5,5-tetramethyl-3,3-diphenyltrisiloxane and 3-phenyl-1, 1,3,5,5-pentamethyltrisiloxane.

[60] The curable resin composition according to any one of items [1] to [59], wherein a content (amount blended) of the component (B) is 5 to 50 wt % (preferably 7 to 30 wt % and more preferably 10 to 25 wt %), based on the total amount (100 wt %) of the curable resin composition.

[61] The curable resin composition according to any one of items [1] or [60], wherein a content (amount blended) of the component (B) per 100 parts by weight of the component (A) is 1 to 200 parts by weight (preferably 5 to 100 parts by weight and more preferably 10 to 50 parts by weight).

[62] The curable resin composition according to any one of items [1] to [61], wherein y in the formula (III-1) is an integer of 2 to 90 (preferably 3 to 80).

[63] The curable resin composition according to any one of items [1] to [62], wherein the upper limit of the viscosity at 25° C. of the component (C) is 10000 mPa·s (preferably 5000 mPa·s).

[59] The curable resin composition according to any one of items [1] to [63], wherein the lower limit of the viscosity at 25° C. of the component (C) is 1 mPa·s (preferably 5 mPa·s).

[65] The curable resin composition according to any one of items [1] to [64], wherein the weight-average molecular weight (Mw) of the component (C) is not less than 100 and not more than 50000 (preferably not less than 150 and not more than 40000, more preferably not less than 175 and not more than 20000, and particularly preferably not less than 200 and not more than 10000).

[66] The curable resin composition according to any one of items [1] to [65], wherein the molecular weight distribution (Mw/Mn) of the component (C) is not less than 1 and not more than 4 (preferably 1 to 3.5, more preferably 1 to 3, and particularly preferably 1 to 2.5).

[67] The curable resin composition according to any one of items [1] to [66], wherein the component (C) comprises at least one selected from the group consisting of 1,1,3,3,5,5-hexamethyltrisiloxane, 1,1,3,3,5,5,7,7-octamethyltetrasiloxane, and 1,1,3,3,5,5,7,7,9,9-decamethylpentasiloxane.

[68] The curable resin composition according to any one of items [1] to [67], wherein the content (amount blended) of the component (C) is 0.4 to 17.5 wt % (preferably 0.5 to 15 wt %).

[69] The curable resin composition according to any one of items [1] to [68], wherein the content (amount blended) of the component (C) per 100 parts by weight of the component (A) is 0.5 to 50 parts by weight (preferably 0.6 to 40 parts by weight and more preferably 0.6 to 30 parts by weight).

[70] The curable resin composition according to any one of items [1] to [69], wherein the content (amount blended) of the component (C) per 100 parts by weight of the component (B) is 1 to 100 parts by weight (preferably 2 to 75 parts by weight and more preferably 3 to 50 parts by weight).

[71] The curable resin composition according to any one of items [1] to [70], wherein the content (amount blended) of the component (C) is 0.3 to 40 parts by weight (preferably 0.4 to 35 parts by weight and more preferably 0.5 to 30 parts by weight), based on a total amount of the component (A) and the component (B) of 100 parts by weight.

[72] The curable resin composition according to any one of items [1] to [71], wherein the component (D) is at least one compound selected from the group consisting of platinum-based catalysts (preferably, platinum fine powder, platinum black, platinum-supporting silica fine powder, platinum-supporting activated carbon, chloroplatinic acid, complexes of chloroplatinic acid and an alcohol, aldehyde, or ketone, olefin complexes of platinum, carbonyl complexes of platinum (preferably a platinum-carbonyl vinylmethyl complex), platinum-vinylmethylsiloxane complexes (preferably, a platinum-divinyltetramethyldisiloxane complex, a platinum-cyclovinylmethylsiloxane complex), platinum-phosphine complexes, and platinum-phosphite complexes), palladium-based catalysts (preferably, catalysts in which a palladium atom is contained instead of the platinum atom in each of the above platinum-based catalysts), and rhodium-based catalysts (preferably, catalysts in which a rhodium atom is contained instead of the platinum atom in each of the above platinum-based catalysts).

[73] The curable resin composition according to any one of items [1] to [72], wherein a content (amount blended) of the component (D) is $1\times10^{-8}$ to $1\times10^{-2}$ mol (preferably $1\times10^{-6}$ to $1\times10^{-3}$ mol), based on the total amount (1 mol) of aliphatic carbon-carbon doable bonds (in particular, as alkenyl group) contained in the curable resin composition.

[74] The curable resin composition according to any one of items [1] to [73], wherein in the content (amount blended) of the component (D) an amount by weight of the platinum, palladium, or rhodium, is an amount within a range of 0.01 to 1000 ppm, (preferably an amount within a range of 0.1 to 500 ppm).

[75] The curable resin composition according to any one of items [1] to [74], further comprising the following component (E):

(E): a polyorganosiloxysilalkylene having a group containing one or more aliphatic carbon-carbon unsaturated bonds (preferably a vinyl group) in a molecule.

[76] The curable resin composition according to item [75], wherein the component (E) is a polyorganosiloxane having a group containing one or more aliphatic carbon-carbon unsaturated bonds in a molecule, and containing, as a main chain, a siloxane bond (—Si—O—Si—) and a bond represented by —Si—$R^4$—Si— (where $R^4$ represents a divalent hydrocarbon group; hereinafter referred to as a "silalkylene bond").

[77] The curable resin composition according to item [76], wherein the divalent hydrocarbon group ($R^4$) is a straight-chain or branched-chain alkylene group (e.g., a group represented by —$[CH_2]_t$— where t represents an integer of 1 or more) or a divalent alicyclic hydrocarbon group (preferably, a straight-chain or branched-chain alkylene group, particularly preferably an ethylene group).

[78] The curable resin composition according to any one of items [75] to [77], wherein a group bonded to the silicon atom other than groups containing the aliphatic carbon-carbon unsaturated bond, of the component (E) is a hydrogen atom, a monovalent hydrocarbon group, or a monovalent hetrocyclic group (preferably, a methyl group, an ethyl group, a propyl group, an isopropyl group, a butyl group, a hexyl group, an octyl group, a decyl group, a phenyl group, a naphthyl group, an anthryl group, a benzyl group, a phenethyl group, a pyridyl group, a furyl group, a thienyl group, a vinyl group, an allyl group, a styryl group (e.g., a p-styryl group), substituted hydrocarbon groups (e.g., a 2-(3,4-epoxycyclohexyl)ethyl group, a 3-glycidylpropyl group, a 3-methacryloxypropyl group, a 3-acryloxypropyl group, an N-2-(aminoethyl)-3-aminopropyl group, a 3-aminopropyl group, an N-phenyl-3-aminopropyl group, a 3-mercaptopropyl group, a 3-isocyanatepropyl group)).

[79] The curable resin composition according to any one of items [75] to [78], wherein the component (E) comprises a polyorganosiloxysilalkylene represented by the following average unit formula:

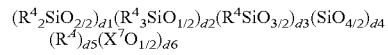

wherein each $R^4$ is the same or different and is a hydrogen atom, a monovalent hydrocarbon group, or a monovalent hetrocyclic group (preferably an alkyl group having 1 to 10 carbon atoms (in particular, a methyl group), an aryl group having 4 to 14 carbon atoms (in particular, a phenyl group), an alkenyl group having 2 to 8 carbon atoms (in particular, a vinyl group)), provided that a portion of $R^4$ is a group containing an aliphatic carbon-carbon unsaturated bond (preferably an alkenyl group having 2 to 8 carbon atoms, in particular, a vinyl group) and a ratio of the group is controlled to be one or more in a molecule; $R^4$ is a divalent hydrocarbon group (in particular, an ethylene group); $X^7$ is a hydrogen atom or a alkyl group (in particular, a methyl); and d1 is a positive number (preferably 1 to 200), d2 is a positive number (preferably 1 to 200), d3 is 0 or a positive number (preferably 1 to 10), d4 is 0 or a positive number (preferably 0 to 5), d5 is a positive number (preferably 1 to 100), and d6 is 0 or a positive number.

[80] The curable resin composition according to item [79], wherein a percentage of the group containing an aliphatic carbon-carbon unsaturated bond based on the total amount (100 mol %) of $R^4$ is 0.1 to 40 mol %.

[81] The curable resin composition according to item [79] or [80], wherein (d3+d4) is a positive number.

[82] The curable resin composition according to any one of items [75] or [81], wherein the component (E) comprises a polyorganosiloxysilalkylene having a structure represented by the following formula (IV-1):

[Chem. 8]

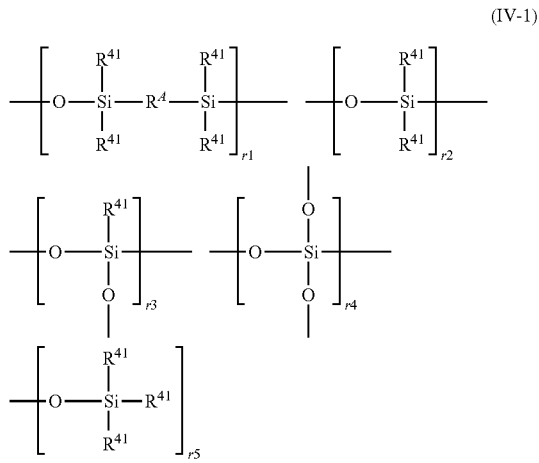

(IV-1)

wherein each $R^{41}$ is the same or different and is a hydrogen atom, a monovalent hydrocarbon group, or a monovalent hetrocyclic group (preferably an alkyl group having 1 to 10 carbon atoms (in particular, a methyl group), an aryl group having 4 to 14 carbon atoms (in particular, a phenyl group), an alkenyl group having 2 to 8 carbon atoms (in particular, a vinyl group)), provided that at least one of $R^{41}$ is a group containing an aliphatic carbon-carbon unsaturated bond (preferably an alkenyl group having 2 to 8 carbon atoms, in particular, a vinyl group); $R^4$ is a divalent hydrocarbon group (among them, a $C_{2-4}$ alkylene group, in particular, an ethylene group); r1 represents an integer of 1 or more (preferably 1 to 100); r2 represents an integer of 0 or 1 or more (preferably 0 to 400); r3 represents an integer of 0 or 1 or more (preferably 0 to 50); r4 represents an integer of 0 or 1 or more (preferably 0 to 50); and r5 represents an integer of 0 or 1 or more (preferably 0 to 50).

[83] The curable resin composition according to item [82], wherein the component (E) comprises a branched-chain polyorganosiloxysilalkylene where in the formula (III-1), r1 represents an integer of 1 or more (preferably 1 to 100); r2 represents an integer of 1 or more (preferably 1 to 400); r3 represents an integer of 1 or more (preferably 1 to 50); r4 is 0; and r5 represents an integer of 1 or more (preferably 1 to 50).

[84] The curable resin composition according to item [82] or [83], wherein the component (E) comprises a straight-chain polyorganosiloxysilalkylene where in the formula (III-1), r1 represents an integer of 1 or more (preferably 1 to 100); r2 represents an integer of 1 or more (preferably 1 to 400); r3 and r4 are 0; and r5 represents an integer of 1 or more (preferably 1 to 50).

[85] The curable resin composition according to any one of items [75] or [84], wherein the component (E) has a weight-average molecular weight (Mw) of not less than 500 and not more than 50000 (preferably not less than 700 and not more than 20000 and more preferably not less than 1000 and not more than 10000).

[86] The curable resin composition according to any one of items [75] or [85], wherein the component (E) has a molecular weight distribution (Mw/Mn) of not less than 1 and not more than 4 (preferably 1 to 3.5).

[87] The curable resin composition according to any one of items [75] or [86], wherein the component (E) has a viscosity at 25° C. of 100 mPa·s or more (preferably 500 mPa·s or more).

[88] The curable resin composition according to any one of items [75] or [87], wherein the component (E) has a viscosity at 25° C. of 50000 mPa·s or less (preferably 10000 mPa·s or less).

[89] The curable resin composition according to any one of items [75] or [88], wherein a content (amount blended) of the component (E) is 1 to 50 wt % (preferably 1 to 40 wt % and more preferably 5 to 30 wt %), based on the total amount (100 wt %) of the curable resin composition.

[90] The curable resin composition according to any one of items [75] or [89], wherein a content (amount blended) of the component (E) per 100 parts by weight of the component (A) is 1 to 200 parts by weight (preferably 5 to 100 parts by weight and more preferably 10 to 50 parts by weight).

[91] The curable resin composition according to any one of items [1] or [90], further comprising the following component (F):

(F): at least one zinc compound selected from the group consisting of zinc carboxylates and zinc-β-diketone complexes.

[92] The curable resin composition according to item [91], wherein the zinc carboxylates are at least one compound selected from the group consisting of zinc naphthenate, zinc octylate, zinc acetoacetate, zinc (meth)acrylate, and zinc neodecanate, preferably zinc naphthenate or zinc octylate, and more preferably zinc octylate.

[93] The curable resin composition according to item [91] or [92], wherein the zinc-β-diketone complexes include zinc-β-diketone complexes represented by the following formula (1):

[Zn(L1)(L2)]    (1)

wherein L1 and L2 are the same or different and each represent an anion or enolate anion of a β-diketone or β-ketoester represented by the following formula (1a):

$R^{31}COCHR^{32}COR^{33}$    (1a)

wherein $R^{31}$ represents a substituted or unsubstituted $C_{1-30}$ alkyl group; $R^{32}$ represents a hydrogen atom or a substituted or unsubstituted $C_{1-30}$ alkyl group (preferably a hydrogen atom); $R^{33}$ represents a substituted or unsubstituted $C_{1-30}$ alkyl group, a substituted or unsubstituted aromatic hetrocyclic group, or a —$OR^{34}$ group (where $R^{34}$ represents a substituted or unsubstituted $C_{1-30}$ alkyl group); $R^{31}$ and $R^{32}$ may be bonded together to form a ring; and $R^{32}$ and $R^{33}$ may be bonded together to form a ring.

[94] The curable resin composition according to any one of items [91] or [93], wherein the zinc-β-diketone complexes include compounds represented by the following formula (1'):

[Chem. 9]

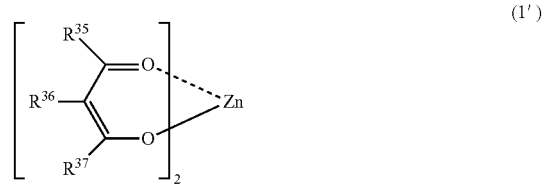

(1')

wherein $R^{35}$ represents a substituted or unsubstituted $C_{1-30}$ alkyl group; $R^{36}$ represents a hydrogen atom or a substituted or unsubstituted $C_{1-30}$ alkyl group; $R^{37}$ represents a substituted or unsubstituted $C_{1-30}$ alkyl group, a substituted or unsubstituted aromatic hetrocyclic group, or a —$OR^{38}$ group; $R^{38}$ represents a substituted or unsubstituted $C_{1-30}$ alkyl group; $R^{35}$ and $R^{36}$ may be bonded together to form a ring; and $R^{36}$ and $R^{37}$ may be bonded together to form a ring.

[95] The curable resin composition according item [93] or [94], wherein the "$C_{1-30}$ alkyls" of $R^{31}$, $R^{32}$, $R^{33}$, $R^{34}$, $R^{35}$, $R^{36}$, $R^{37}$, and $R^{38}$ are each independently a $C_{1-20}$ alkyl group (more preferably a $C_{2-15}$ alkyl group, still more preferably a $C_{3-10}$ alkyl group, particularly preferably a branched-chain $C_{3-10}$ alkyl group, and most preferably an isopropyl group, an isobutyl group, a t-butyl group, and s-butyl group, an isopentyl group, or a t-pentyl group).

[96] The curable resin composition according to any one of items [93] or [95], wherein the "aromatic hetrocyclic groups" of $R^{33}$ and $R^{37}$ are each independently a pyridyl group, a pyrimidinyl group, a pyrazolyl group, a pyridazinyl group, a pyrazinyl group, a triazinyl group, a furanyl group, a thienyl group, an indolyl group, an oazolyl group, a thiazolyl group, or an imidazolyl group.

[97] The curable resin composition according to any one of items [93] or [96], wherein the "substituents" of $R^{31}$, $R^{32}$, $R^{33}$, $R^{34}$, $R^{35}$, $R^{36}$, $R^{37}$, and $R^{38}$ are each independently at least one selected from the group consisting of a halogen atom, a hydroxy group, and a carboxy group.

[98] The curable resin composition according to any one of items [91] or [97], wherein the zinc-β-diketone complexes are at least one compound selected from the group consisting of zinc bisacetylacetonate, bis(octane-2,4-dionate)zinc, zinc bis(2,2,7-trimethyl-3,5-octanedionate), and zinc bisdipivaloylmethane.

[99] The curable resin composition according to any one of items [91] or [98], wherein a content of zinc based on the total amount (100 wt %) of the component (F) is 2 to 30 wt % (preferably 4 to 25 wt % and particularly preferably 6 to 20 wt %).

[100] The curable resin composition according to any one of items [91] or [99], wherein a content of the component (F) is not less than 0.01 parts by weight and less than 1 part by weight (preferably not less than 0.03 parts by weight and less than 0.8 parts by weight and more preferably not less than 0.05 parts by weight and less than 0.6 parts by weight), based on the total amount (100 parts by weight) of the compounds (A) and (B).

[101] The curable resin composition according to any one of items [91] or [100], wherein a content of the component (F) is 0.01 to 1 wt % (preferably 0.05 to 0.5 wt %), based on the total amount (100 wt %) of the curable resin composition.

[102] The curable resin composition according to any one of items [1] or [101] further comprising the following component (G):
(G): a ladder-type polyorganosilsesquioxane having one or more alkenyl groups (preferably a vinyl group) and one or more aryl groups (preferably a phenyl group) in a molecule.

[103] The curable resin composition according to item [102], wherein the percentage of the alkenyl group in the entire component (G) (100 wt %) is 2.0 to 10.0 wt % (preferably 3.0 to 5.0 wt %).

[104] The curable resin composition according to item [102] or [103], wherein the percentage of the aryl group in the entire component (G) (100 wt %) is 10.0 to 30.0 wt % (preferably 10.0 to 20.0 wt %).

[105] The curable resin composition according to any one of items [102] or [104], wherein the percentage of the alkyl group in the entire component (G) (100 wt %) is 20.0 to 35.0 wt % (preferably 20.0 to 30.0 wt %).

[106] The curable resin composition according to any one of items [102] or [105], wherein the component (G) comprises a ladder-type polyorganosilsesquioxane (hereinafter, referred to as ladder-type polyorganosilsesquioxane (a)) having two or more alkenyl groups (preferably a vinyl group) and one or more aryl groups (preferably a phenyl group) in a molecule.

[107] The curable resin composition according to item [106], wherein the ladder-type polyorganosilsesquioxane (a) has a 5% weight-reduction temperature ($T_{d5}$) under nitrogen atmosphere of 150° C. or more (preferably 240° C. or more, more preferably 260° C. to 500° C., particularly preferably 262° C. or more, and most preferably 265° C. or more).

[108] The curable resin composition according to item [106] or [107], wherein the ladder-type polyorganosilsesquioxane (a) has a viscosity at 25° C. of 30000 mPa·s or less (for example, 1 to 30000 mPa·s, preferably 25000 mPa·s or less, and more preferably 10000 mPa·s or less).

[109] The curable resin composition according to any one of items [106] or [108], wherein the ladder-type polyorganosilsesquioxane (a) is a ladder-type polyorganosilsesquioxane represented by the following formula (V-2):

[Chem. 10]

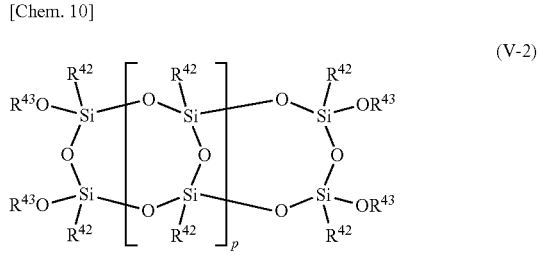

(V-2)

wherein each $R^{42}$ is the same or different and represents a hydrogen atom or a substituted or unsubstituted monovalent hydrocarbon group (preferably an alkenyl group (in particular, a vinyl group), an aryl group (in particular, a phenyl group), and an alkyl group (in particular, a methyl group)); p represents an integer of 0 or more (preferably an integer of 1 or more and particularly preferably an integer of 2 or more); and $R^{43}$ is a group bonded to a molecular chain end of the ladder structure (hereinafter, also referred to as "terminal group"), which is the same or different and represents a hydrogen atom, an alkyl group, a monovalent group represented by the following formula (V-2-1), a monovalent group represented by the following formula (V-2-2), or a monovalent group represented by the following formula (V-2-3):

[Chem. 11]

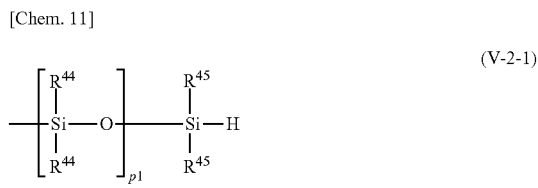

(V-2-1)

wherein each $R^{44}$ is the same or different and represents a hydrogen atom or a substituted or unsubstituted monovalent hydrocarbon group (preferably an alkyl group); each $R^{45}$ is the same or different and represents a substituted or unsubstituted monovalent hydrocarbon group (preferably an alkyl group); p1 represents an integer of 0 or more (preferably an integer of 0 to 5, more preferably an integer of 0 to 3, and still more preferably 0);

[Chem. 12]

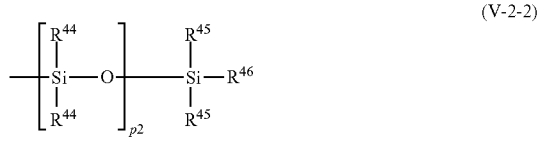

(V-2-2)

wherein each $R^{44}$ is the same or different and represents a hydrogen atom or a substituted or unsubstituted monovalent hydrocarbon group (preferably an alkyl); each $R^{45}$ is the same or different and represents a substituted or unsubstituted monovalent hydrocarbon group (preferably an alkyl group); $R^{46}$ is an alkenyl group (preferably a vinyl group); p2 represents an integer of 0 or more (preferably an integer of 0 to 5, more preferably an integer of 0 to 3, and still more preferably 0);

[Chem. 13]

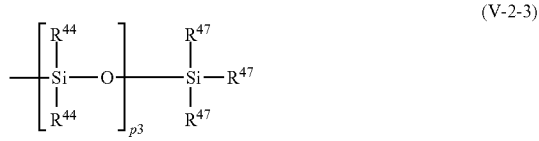

(V-2-3)

wherein each $R^{44}$ is the same or different and represents a hydrogen atom or a substituted or unsubstituted monovalent hydrocarbon group (preferably an alkyl group); each $R^{47}$ is the same or different and represents a monovalent saturated aliphatic hydrocarbon group (preferably an alkyl group and a cycloalkyl group, more preferably an alkyl group, and particularly preferably a methyl group); p3 represents an integer of 0 or more (preferably an integer of 0 to 5, more preferably an integer of 0 to 3, and still more preferably 0).

[110] The curable resin composition according to item [109], wherein the percentage (total content) of the aryl group, the alkenyl group and the alkyl group is 50 to 100 wt % (preferably 70 to 100 wt % and more preferably 80 to 100 wt %), based on the total amount (100 wt %) of $R^{42}$ in the formula (V-2) of the ladder-type polyorganosilsesquioxane (a).

[111] The curable resin composition according to item [109] or [110], wherein the percentage (content) of the aryl group (preferably a phenyl group) is 30 to 90 mol % (preferably 40 to 80 mol % and more preferably 50 to 70 mol %), based on the total amount (100 mol %) of $R^{42}$ in the formula (V-2).

[102] The curable resin composition according to any one of items [109] or [111], wherein the percentage (content) of the alkenyl group is 5 to 30 mol % (preferably 10 to 25 mol % and more preferably 15 to 20 mol %), based on the total amount (100 wt %) of $R^{42}$ in the formula (V-2).

[113] The curable resin composition according to any one of items [109] or [112], wherein the percentage (content) of the alkyl group is 0 to 90 mol % (preferably 1 to 80 mol % and more preferably 5 to 70 mol %), based on the total amount (100 mol %) of $R^{42}$ in the formula (V-2).

[114] The curable resin composition according to any one of items [109] or [113], wherein any one of $R^{42}$ in the formula (V-2) is an alkenyl group.

[115] The curable resin composition according to any one of items [109] or [114], wherein the ladder-type polyorganosilsesquioxane (a) comprises a compound represented by the formula (V-2) having a monovalent group represented by the formula (V-2-1), wherein any one of $R^{44}$ and $R^{45}$ is an alkenyl group.

[116] The curable resin composition according to any one of items [109] or [115], wherein the ladder-type polyorganosilsesquioxane (a) comprises a compound represented by the formula (V-2) having a monovalent group represented by the formula (V-2-2), wherein any one of $R^{44}$ and $R^{45}$ is an alkenyl group.

[117] The curable resin composition according to any one of items [109] or [116], wherein the ladder-type polyorganosilsesquioxane (a) comprises a compound represented by the formula (V-2) having a monovalent group represented by the formula (V-2-3), wherein any one of $R^{44}$ is an alkenyl group.

[118] The curable resin composition according to any one of items [102] or [117], wherein the component (G) comprises a ladder-type polyorganosilsesquioxane (hereinafter referred to as "ladder-type polyorganosilsesquioxane (b)") having a polyorganosilsesquioxane residue (sometimes referred to as "polyorganosilsesquioxane residue (a)") containing a structural unit (T-unit) represented by a formula (V-3-1) and a structural unit (M-unit) represented by a formula (V-3-2) in some or all of the molecular chain ends of a polyorganosilsesquioxane having a ladder structure:

[Chem. 14]

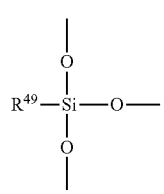

(V-3-1)

wherein each $R^{49}$ represents an alkenyl group (preferably a $C_{2-10}$ alkenyl group, more preferably a $C_{2-4}$ alkenyl group, and still more preferably a vinyl group);

[Chem. 15]

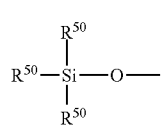

(V-3-2)

wherein each $R^{50}$ is the same or different an represents a substituted or unsubstituted monovalent hydrocarbon group, (preferably an alkyl group, more preferably a $C_{1-20}$ alkyl group, still more preferably a $C_{1-10}$ alkyl group, particularly preferably $C_{1-4}$ alkyl group, and most preferably a methyl group).

[119] The curable resin composition according to any item [118], wherein all of $R^{50}$ is a methyl group.

[120] The curable resin composition according to item [118] or [119], wherein the polyorganosilsesquioxane residue (a) further has a structural unit represented by the following formula (V-3-1'):

[Chem. 16]

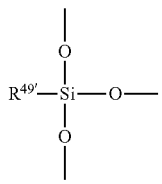

(V-3-1')

wherein each $R^{49'}$ represents a monovalent group other than an alkenyl group (for example, a hydrogen atom, a halogen atom, an organic group other than an alkenyl group, a monovalent oxygen-containing group, a monovalent nitrogen-containing group or a monovalent sulfur-containing group).

[121] The curable resin composition according to any one of items [118] or [120], wherein the polyorganosilsesquioxane having a ladder structure in the ladder-type polyorganosilsesquioxane (b) comprises a compound represented by the following formula (V-3):

[Chem. 17]

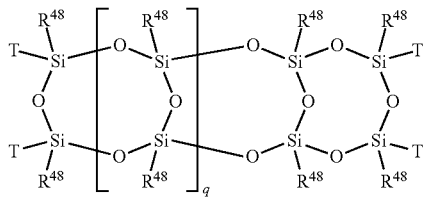

(V-3)

wherein q is an integer of 1 or more (for example, 1 to 5000, preferably an integer of 1 to 2000, and more preferably an integer of 1 to 1000); each $R^{46}$ is the same or different and represents a hydrogen atom or a substituted or unsubstituted monovalent hydrocarbon group; T represents a terminal group; and some or all of T are each the polyorganosilsesquioxane residue (a).

[122] The curable resin composition according to any one of items [118] or [121], wherein the percentage of substituted or unsubstituted monovalent hydrocarbon groups is 50 mol % or more (preferably 80 mol % or more, and more preferably 90 mol % or more), based on the total amount (100 mol %) of groups directly bonded to a silicon atom in polyorganosilsesquioxane in the ladder-type polyorganosilsesquioxane (b).

[123] The curable resin composition according to any one of items [118] or [122], wherein the total amount of substituted or unsubstituted $C_{1-10}$ alkyl groups (in particular, $C_{1-4}$ alkyl groups such as a methyl group and an ethyl group), substituted or unsubstituted $C_{6-10}$ aryl groups, (in particular, a phenyl group), and substituted or unsubstituted $C_{7-10}$ aralkyl groups (in particular, a benzyl group) is 50 mol % or more (preferably 80 mol % or more, and more preferably 90 mol % or more), based on the total amount (100 mol %) of groups directly bonded to a silicon atom in polyorganosilsesquioxane in the ladder-type polyorganosilsesquioxane (b).

[124] The curable resin composition according to any one of items [118] or [123], wherein the amount of the silicon atom bonded to three oxygen atoms represented in the formula (V-3-1) in the polyorganosilsesquioxane residue (a) is 20 to 80 mol % (preferably 25 to 60 mol %) based on the total amount (100 mol %) of the silicon atom constituting the polyorganosilsesquioxane residue (a).

[125] The curable resin composition according to any one of items [118] or [124], wherein the amount of the silicon atom bonded to one oxygen atom represented in the formula (V-3-2) in the polyorganosilsesquioxane residue (a) is 20 to 85 mol % (preferably 30 to 75 mol %) based on the total amount (100 mol %) of the silicon atom constituting the polyorganosilsesquioxane residue (a).

[126] The curable resin composition according to any one of items [118] or [125], wherein the ladder-type polyorganosilsesquioxane (b) comprises a compound represented by the following formula (V-3'):

[Chem. 18]

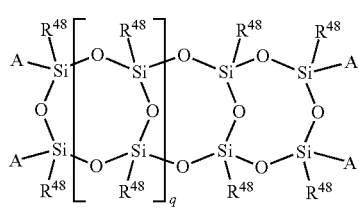

(V-3')

wherein q is an integer of 1 or more (for example, 1 to 5000, preferably an integer of 1 to 2000, and more preferably an integer of 1 to 1000); each $R^{48}$ is the same or different and represents a hydrogen atom or a substituted or unsubstituted monovalent hydrocarbon group; A represents a polyorganosilsesquioxane residue (a), a hydroxy group, a halogen atom, an alkoxy group, or an acyloxy group, and some or all of A are each the polyorganosilsesquioxane residue (a); and the four A may be the same or different.

[127] The curable resin composition according to any one of items [118] or [126], wherein the number of the alkenyl group in a molecule in the ladder-type polyorganosilsesquioxane (b) is 2 to 50 (preferably 2 to 30).

[128] The curable resin composition according to any one of items [118] or [127], wherein the content of the alkenyl group in the ladder-type polyorganosilsesquioxane (b) is 0.7 to 5.5 mmol/g (preferably 1.1 to 4.4 mmol/g).

[129] The curable resin composition according to any one of items [118] or [128], wherein the number of the aryl group in a molecule in the ladder-type polyorganosilsesquioxane (b) is 2 to 50 (preferably 2 to 30).

[130] The curable resin composition according to any one of items [118] or [129], wherein the content of the aryl group in the ladder-type polyorganosilsesquioxane (b) is 0.7 to 5.5 mmol/g (preferably 1.1 to 4.4 mmol/g).

[131] The curable resin composition according to any one of items [106] to [130], wherein the ladder-type polyorganosilsesquioxane (a) and the ladder-type polyorganosilsesquioxane (b) have a weight-average molecular weight (Mw) of 100 to 800000 (preferably 200 to 100000, more preferably 300 to 10000, particularly preferably 500 to 8000, and most preferably 1700 to 7000), respectively.

[132] The curable resin composition according to any one of items [106] to [131], wherein the ladder-type polyorganosilsesquioxane (a) and the ladder-type polyorganosilsesquioxane (b) have a number average molecular weight (Mw) of 80 to 800000 (preferably 150 to 100000, more preferably 250 to 10000, particularly preferably 400 to 8000, and most preferably 1500 to 7000), respectively.

[133] The curable resin composition according to any one of items [106] to [132], wherein the ladder-type polyorganosilsesquioxane (a) and the ladder-type polyorganosilsesquioxane (b) have a degree of dispersion of molecular weight in terms of standard polystyrene determined by gel permeation chromatography (Mw/Mn) of 1.00 to 1.40 (preferably 1.35 or less (for example, 1.05 to 1.35), and more preferably 1.30 or less (for example, 1.10 to 1.30)), respectively.

[134] The curable resin composition according to any one of items [106] to [133], wherein the viscosity at 23° C. of the ladder-type polyorganosilsesquioxane (b) is 100 to 100000 mPa19 s (preferably 500 to 10000 mPa·s, and more preferably 1000 to 8000 mPa·s).

[135] The curable resin composition according to any one of items [102] or [134], wherein the content (amount blended) of the component (G) is 0.05 to 50 parts by weight (preferably 0.1 to 45 parts by weight, and more preferably 0.2 to 40 parts by weight), based on a total amount of the component (A) and the component (B) of 100 parts by weight.

[136] The curable resin composition according to any one of items [102] or [135], wherein the content (amount blended) of the component (G) is 0.01 to 20 wt % (preferably 0.05 to 15 wt %, and more preferably 0.1 to 10 wt %), based on the curable resin composition (100 wt %).

[137] The curable resin composition according to any one of items [1] or [136], further comprising an isocyanurate compound (H) represented by the following formula (2):

[Chem. 19]

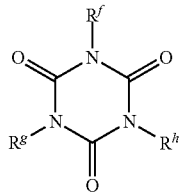

(2)

wherein $R^f$, $R^g$, and $R^h$ are the same or different and each represent a group represented by formula (2a) or a group represented by formula (2b), provided that at least one of $R^f$, $R^g$, and $R^h$ is a group represented by formula (2b):

[Chem. 20]

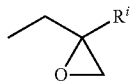

(2a)

wherein $R^i$ is a hydrogen atom, or a straight-chain or branched-chain $C_{1-8}$ alkyl group (preferably a hydrogen atom); and

[Chem. 21]

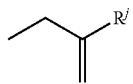

(2b)

wherein $R^j$ is a hydrogen atom or a straight-chain or branched-chain $C_{1-8}$ alkyl group (preferably a hydrogen atom).

[138] The curable resin composition according to item [137], wherein the isocyranurate compound (H) comprises at least one compound selected from the group consisting of compounds represented by the formula (2) where one of $R^f$, $R^g$, and $R^h$ is a group represented by the formula (2b) (e.g., monoallyl diglycidyl isocyanurate, 1-allyl-3,5-bis(2-methylepoxypropyl)isocyanurate, 1-(2-methylpropenyl)-3,5-diglycidyl isocyanurate, 1-(2-methylpropenyl)-3,5-bis(2-methylepoxypropyl)isocyanurate), compounds represented by the formula (2) where two of $R^f$, $R^g$, and $R^h$ are groups represented by the formula (2b) (e.g., diallyl monoglycidyl isocyanurate, 1,3-diallyl-5-(2-methylepoxypropyl)isocyanurate, 1,3-bis(2-methylpropenyl)-5-glycidyl isocyanurate, 1,3-bis(2-methylpropenyl)-5-(2-methylepoxypropyl)isocyanurate), and compounds represented by the formula (2) where all of $R^f$, $R^g$, and $R^h$ are groups represented by the formula (2b) (e.g., triallyl isocyanurate, tris(2-methylpropenyl)isocyanurate).

[139] The curable resin composition according to item [137] or [138], wherein a content (amount blended) of the isocyanurate compound (H) is 0.01 to 6 wt % (preferably 0.05 to 4 wt % and more preferably 0.08 to 3 wt %), based on the total amount (100 wt %) of the curable resin composition.

[140] The curable resin composition according to any one of items [1] or [139], further comprising a silane coupling agent (I) (preferably an epoxy-containing silane coupling agent and particularly preferably 3-glycidoxypropy trimethoxysilane).

[141] The curable resin composition according to item [140], wherein a content (amount blended) of the silane coupling agent (I) is 0.01 to 15 wt % (preferably 0.1 to 10 wt % and more preferably 0.5 to 5 wt %), based on the total amount (100 wt %) of the curable resin composition.

[142] The curable resin composition according to any one of items [1] or [141], wherein the composition (blending composition) is provided such that an amount of the hydrosilyl group (SiH group) contained in the component (B) and the component (C) per mol of the alkenyl group (including a group containing an aliphatic carbon-carbon double bond) present in the curable resin composition is not less than 0.1 mol and not more than 100 mol (preferably 0.3 to 50 mol, and more preferably 0.5 to 30 mol).

[143] The curable resin composition according to any one of items [1] or [142], wherein the curable resin composition has a viscosity at 23° C. of 300 to 20000 mPa·s (preferably 500 to 10000 mPa·s and more preferably 1000 to 8000 mPa·s).

[144] The cured product of the curable resin composition according to any one of items [1] or [143].

[145] The cured product according to item [144], wherein a refractive index at 589 nm thereof is not less than 1.46 and not more than 1.54 (preferably 1.465 to 1.535 and more preferably 1.47 to 1.53).

[146] The curable resin composition according to any one of items [1] or [143], wherein the curable resin composition is an encapsulating agent.

[147] The curable resin composition according to any one of items [1] or [143], wherein the curable resin composition is a lens-forming resin composition.

[148] A semiconductor device comprising a semiconductor element and an encapsulant that encapsulates the semiconductor element, wherein the encapsulant is a cured product of the curable resin composition according to item [146].

[149] A semiconductor device comprising a semiconductor element and a lens, wherein the lens is a cured product of the curable resin composition according to item [147].

[150] A semiconductor device comprising a semiconductor element, an encapsulant that encapsulates the semiconductor element, and a lens, wherein the encapsulant is a cured product of the curable resin composition according to item [146] and the lens is a cured product of the curable resin composition according to item [147].

[151] The semiconductor device according to any one of items [148] or [150], wherein a refractive index at 589 nm of the cured product is not less than 1.46 and not more than 1.54 (preferably 1.465 to 1.535 and more preferably 1.47 to 1.53).

[152] The semiconductor device composition according to any one of items [148] or [151], wherein the semiconductor device is an optical semiconductor device.

Advantageous Effects of Invention

Because of the above configurations, the curable resin compositions of the present invention can each be cured to form a less tacky cured product having both increased gas barrier properties against, in particular, corrosive gas (e.g., $H_2S$ gas, $SO_x$), and excellent heat resistance and light resistance. Because of this, when, the above cured products are used, for example, as encapsulants for semiconductor elements and/or lenses in optical semiconductor devices of high brightness and high current lighting applications, high transparency can be maintain even after long-term exposure with high-temperature and high-brightness light. In addition, because the cured products are less tacky, a decrease in luminous intensity due to dust attachment, etc., can also be suppressed. This makes it possible to maintain a high luminous intensity for a long period and to markedly suppress electrode corrosion of the above optical semiconductor devices, thereby remarkably increasing durability of the above optical semiconductor devices. Also, the cured product of the curable resin composition of the present invention is excellent in flexibility and heat shock resistance, so that when the product used as an encapsulant for larger packages of optical semiconductor devices (LED packages) is subjected to a thermal shock such as a hot/cold cycle, a problem such as lighting failure due to fracture of a bonding wire caused by the occurrence of cracks hardly occurs. Accordingly, the curable resin composition of the present invention can be favorably used, in particular, as materials for forming an encapsulant for optical semiconductor elements (LED elements) having a high output and a high brightness in a larger optical semiconductor device, or optical lenses (an encapsulating agent and a lens-forming resin composition). The optical semiconductor devices obtained by using the curable resin compositions of the present invention as encapsulating agents and/or lens-forming resin compositions have excellent qualities and durability.

BRIEF DESCRIPTION OF DRAWINGS

FIGS. 1(a) and (b) are schematic diagrams illustrating an embodiment of an optical semiconductor device in which an optical semiconductor element is encapsulated by a cured product of a curable resin composition of the present invention. FIG. 1(a) on the left side is a perspective view and; FIG. 1(b) on the right side is a cross-sectional view.

DESCRIPTION OF EMBODIMENTS

<Curable Resin Composition>

A curable resin composition of the present invention comprises the following components (A), (B), (C) and (D) as essential components, wherein a content (amount blended) of the component (C) is not less than 0.3 wt % and not more than 20 wt %, based on the total amount (100 wt %) of the curable resin composition:

(A): a polyorganosiloxane represented by the following average unit formula (I):

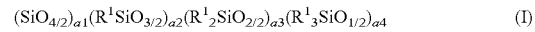

$(SiO_{4/2})_{a1}(R^1SiO_{3/2})_{a2}(R^1{}_2SiO_{2/2})_{a3}(R^1{}_3SiO_{1/2})_{a4}$     (I)

wherein each $R^1$ is the same or different and is an alkyl group having 1 to 10 carbon atoms, an aryl group having 6 to 14 carbon atoms, an alkenyl group having 2 to 8 carbon atoms, an alkoxy group having 1 to 10 carbon atoms, or a hydroxyl group, when a percentage of the alkyl group is X mol %, a percentage of the aryl group is Y mol %, and a percentage of the alkenyl group is Z mol % based on the total amount (100 mol %) of $R^1$, X is 50 to 98 mol %, Y is 1 to 50 mol %, and Z is 1 to 35 mol %, and a1, a2, a3, and a4 are numbers satisfying a1>0, a2>0, a3≥0, a4>0, 0.5≤a1/a2≤10, and a1+a2+a3+a4=1;

(B): a polyorganosiloxane represented by the following average composition formula (II):

$R^2{}_mH_nSiO_{[(4-m-n)/2]}$     (II)

wherein each $R^2$ is the same or different and is an alkyl group having 1 to 10 carbon atoms or an aryl group having 6 to 14 carbon atoms and at least one of $R^2$ is an aryl group, at least 2 hydrogen atoms are bonded to the silicon atom, and m and n are numbers satisfying 0.7≤m≤2.1, 0.001≤n≤1, and 0.8≤m+n≤3;

(C): a straight-chain polyorganosiloxane that is a liquid having a viscosity at 25° C. of 10000 mPa·s or less, represented by the following general formula (III-1):

[Chem. 22]

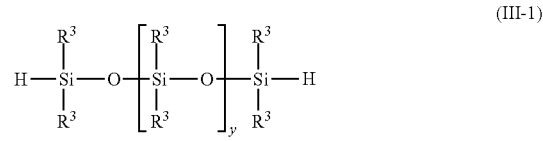

(III-1)

wherein each $R^3$ is the same or different and represents an alkyl group having 1 to 10 carbon atoms, and y represents an integer of not less than 1 and not more than 100; and (D): a hydrosilylation catalyst.

This curable resin composition may further comprise, in addition to the above essential components, other components such as a component (E), a component (F), a component (G), and isocyanurate compound (H), and a silane coupling agent (I) described below.

[Component (A)]

As described above, the component (A), which is an essential component of the curable resin composition of the present invention, is a polyorganosiloxane represented by the following unit formula (I):

$(SiO_{4/2})_{a1}(R^1SiO_{3/2})_{a2}(R^1_2SiO_{2/2})_{a3}(R^1_3SiO_{1/2})_{a4}$ (I)

wherein each $R^1$ is the same or different and is an alkyl group having 1 to 10 carbon atoms, an aryl group having 6 to 14 carbon atoms, an alkenyl group having 2 to 8 carbon atoms, an alkoxy group having 1 to 10 carbon atoms, or a hydroxyl group, when a percentage of the alkyl group is X mol %, a percentage of the aryl group is Y mol %, and a percentage of the alkenyl group is Z mol % based on the total amount (100 mol %) of $R^1$, X is 50 to 98 mol %, Y is 1 to 50 mol %, and Z is 1 to 35 mol %, and a1, a2, a3, and a4 are numbers satisfying a1>0, a2>0, a3≥0, a4>0, 0.5≤a1/a2≤10, and a1+a2+a3+a4=1;

That is, the component (A) is a polysiloxane having an alkenyl group, and a component capable of making a hydrosilylation reaction with a component having a hydrosilyl group (e.g., the component (B) and the component (C) described below).

Examples of the alkyl group having 1 to 10 carbon atoms represented by $R^1$ in the above average unit formula (I) include straight-chain or branched-chain alkyl groups such as a methyl group, an ethyl group, a propyl group, an isopropyl group, a butyl group, a hexyl group, an octyl group, an isooctyl group, and a decyl group. Among them, preferred is a methyl group. In addition, the component (A) may have only one kind of the alkyl group or two or more kinds of the alkyl group.

Examples of the aryl group having 6 to 14 carbon atoms represented by $R^1$ in the above average unit formula (I) include a phenyl group and a naphthyl group. Among them, preferred is a phenyl group. In addition, the component (A) may have only one kind of the aryl group or two or more kinds of the aryl group.

Examples of the alkenyl group having 2 to 8 carbon atoms represented by $R^1$ in the above average unit formula (I) includes substituted or unsubstituted, straight-chain or branched-chain alkenyl groups such as a vinyl group, an allyl group, a butenyl group, a pentenyl group, and a hexenyl group. Examples of the substituent include a halogen atom, a hydroxy group, and a carboxy group. Among them, preferred is a vinyl group. In addition, the component (A) may have only one kind of the alkenyl group or two or more kinds of the alkenyl group.

Examples of the alkoxy group having 1 to 10 carbon atoms of $R^1$ represented in the above average unit formula (I) include straight-chain or branched-chain alkoxy groups such as a methoxy group, an ethoxy group, a propoxy group, an isopropoy group, a butoxy group, a hexyloxy group, an octyloxy group, an isooctyloxy group, and a decyloxy group. Among them, preferred are a methoxy group and an ethoxy group. In addition, the component (A) may have only one kind of the alkoxy group or two or more kinds of the alkoxy group.

In the component (A), when the percentage of the alkyl group based on the total amount (100 mol %) of $R^1$ is X mol %, X is 50 to 98 mol %, preferably 55 to 95 mol %, and more preferably 60 to 90 mol %. When X is 50 mol % or more, the curable resin composition of the present invention tends to be cured to give a cured product having excellent heat resistance and light resistance. On the other hand, when X is 98 mol % or less, the resulting cured product tends to have increased barrier properties against corrosive gas and be less tacky.

In the component (A), when the percentage of the aryl group based on the total amount (100 mol %) of $R^1$ is Y mol %, Y is 1 to 50 mol %, preferably 3 to 40 mol %, and more preferably 5 to 30 mol %. When Y is 1 mol % or more, the curable resin composition of the present invention tends to be cured to give a cured product having excellent barrier properties against corrosive gas. On the other hand, when Y is 50 mol % or less, the resulting cured product tends to have increased heat resistance and light resistance.

In the component (A), when the percentage of the alkenyl group based on the total amount (100 mol %) of $R^1$ is Z mol %, Z is 1 to 35 mol %, preferably 2 to 25 mol %, and more preferably 3 to 15 mol %. When Z is controlled to within the above ranges, a cured product of the curable resin composition tends to have increased toughness.

The ratio of the alkyl group (X) to the aryl group (Y) (X/Y) in the component (A) is not particularly limited, and preferably 0.5 to 25, more preferably 1 to 20, and still more preferably 2 to 15. When X/Y is controlled to within the above ranges, the curable resin composition of the present invention tends to be cured to give a less tacky cured product having both increased gas barrier properties against corrosive gas (e.g., $H_2S$ gas, $SO_x$ gas) and excellent heat resistance and light resistance. That is, when X/Y is 0.5 or more, the curable resin composition of the present invention tends to be cured to give a cured product in which heat resistance and light resistance are maintained. Also, setting X/Y to 25 or less tends to give a tack-less cured product while maintaining increased gas barrier properties against corrosive gas (e.g., $H_2S$ gas, $SO_x$ gas).

Note that the percentage (mol %) of the alkyl group, the percentage (mol %) of the aryl group, and the percentage (mol %) of the alkenyl group based on the total amount (100 mol %) of $R^1$ may each be calculated by, for instance $^1$H-NMR spectroscopy.

a1, a2, a3, and a4 in the above average unit formula (I) are numbers satisfying a1>0, a2>0, a3≥0, a4>0, 0.5≤a1/a2≤10, and a1+a2+a3+a4=1.

Specifically, the component (A) is a polyorganosiloxane (MTQ resin) comprising, as essential structural units, a Q-unit represented by $(SiO_{4/2})$, a T-unit represented by $(R^1SiO_{3/2})$, and an M-unit represented by $(R^1_3SiO_{1/2})$. Because the component (A) is such a polyorganosiloxane having an MTQ resin structure, the curable resin composition of the present invention tends to be cured to give a less tacky cured product having an increased gas barrier properties against corrosive gas (e.g., $H_2S$ gas, $SO_x$ gas) both excellent heat resistance and light resistance.

a1 is a positive number (a1>0), corresponding to an existence ratio (in terms of molar ratio) of the Q-unit in the component (A), and is preferably 0.05 to 0.8, more preferably 0.07 to 0.6, and still more preferably 0.1 to 0.4.

a2 is a positive number (a2>0), corresponding to an existence ratio (in terms of molar ratio) of the T-unit in the component (A), and is preferably 0.01 to 0.8, more preferably 0.03 to 0.5, and still more preferably 0.05 to 0.3.

a3 is 0 or a positive number (a3≥0), corresponding to an existence ratio (in terms of molar ratio) of the D-unit in the component (A), and is preferably 0 to 0.9, more preferably 0 to 0.6, and still more preferably 0 to 0.3.

a4 is a positive number (a4>0), corresponds to an existence ratio (in terms of molar ratio) of the M-unit in the component (A), and is preferably 0.1 to 0.9, more preferably 0.3 to 0.8, and still more preferably 0.5 to 0.7.

When a1 to a4 are within the above ranges, the curable resin composition of the present invention tends to be cured to give a much less tacky cured product having both increased gas barrier properties against corrosive gas (e.g., $H_2S$ gas, $SO_x$ gas) and excellent heat resistance and light resistance.

In the above average unit formula (I), a1/a2 corresponds to a ratio of the Q-unit to the T-unit (Q/T; in terms of molar ratio) in the component (A), and is 0.5 to 10, preferably 0.6 to 8, more preferably 0.7 to 6, still more preferably 1 to 5, still more preferably 1.2 to 5, still more preferably 1.5 to 5, and particularly preferably 2 to 5. When a1/a2 is 0.5 or more, a curable resin composition of the present invention tends to be cured to give a cured product having excellent heat resistance and light resistance. Also, setting a1/a2 to 10 or less tends to provide a cured product having excellent flexibility.

X, Y, Z, X/Y, a1 to a4, a1/a2, etc., in the component (A) of the present invention may be suitably adjusted by selecting the kind and composition of each substituent on a silicon atom of an ingredient (the hydrolysable silane compound described below) for forming such structural units during the process described below for producing the component (A).

Examples of the component (A) include materials with partially branched straight-chain, branched-chain, or reticular molecular structures. Note that the component (A) may be used singly or in combinations of two or more. Specifically, two or more components (A) with different molecular structures may be used in combination. For example, a partially branched straight-chain component (A) and a branched-chain component (A) may be used in combination.

Examples of a preferably embodiment of the component (A) include a polyorganosiloxane represented by the following average unit formula:

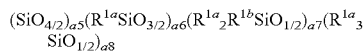

provided that in the above average unit formula (I), a3 is 0.

In the above average unit formula, each $R^{1a}$ is the same or different and is an alkyl group having 1 to 10 carbon atoms, an aryl group having 6 to 14 carbon atoms, an alkoxy group having 1 to 10 carbon atoms, or a hydroxyl group; and each $R^{1b}$ is the same or different and represents an alkenyl group having 2 to 8 carbon atoms.

Examples of the alkyl group having 1 to 10 carbon atoms represented by $R^{1a}$ include the same ones as described for $R^1$ in the above average unit formula (I). Preferred is a methyl group.

Examples of the aryl group having 6 to 14 carbon atoms represented by $R^{1a}$ include the same ones as described for $R^1$ in the above average unit formula (I). Preferred is a phenyl group.

Examples of the alkoxy group having 1 to 10 carbon atoms represented by $R^{1a}$ include the same ones as described for $R^1$ in the above average unit formula (I). Preferred are a methoxy group and an ethoxy group.

Examples of the alkenyl group having 2 to 8 carbon atoms represented by $R^{1b}$ include the same ones as described for $R^1$ in the above average unit formula (I). Preferred is a vinyl group.

a5, a6, a7, and a8 are numbers satisfying a5>0, a6>0, a7>0, a8≥0, a5+a6+a7+a8=1, and 0.5≤a5/a6≤10.

The preferable range of a5 is the same as that of a1 in the average unit formula (I).

The preferable range of a6 is the same as that of a2 in the average unit formula (I).

a7 is a positive number (a7>0), corresponds to an existence ratio (in terms of molar ratio) of the M-unit having an alkenyl group in the component (A), and is preferably 0.01 to 0.4 and more preferably 0.02 to 0.2.

a8 is 0 or a positive number (a8≥0), corresponds to an existence ratio (in terms of molar ratio) of the M-unit without an alkenyl group in the component (A), and is preferably 0.05 to 0.7 and more preferably 0.2 to 0.5.

The preferable range of a7+a8 is the same as that of a4 in the average unit formula (I).

The preferably range of a5/a6 is the same as that of a1/a2 in the average unit formula (I).

Further, it is preferable that the component (A) satisfies a7/(a7+a8)=0.005 to 0.95 and a5/(a5+a6+a7+a8)=0.05 to 0.95.

From the viewpoint of curing performance of the curable resin composition, the a7/(a7+a8) is preferably 0.01 to 0.92. In addition, from the viewpoint of the hardness and mechanical strength of the resulting cured product, the a5(a5+a6+a7+a8) is preferably 0.10 to 0.92.

Examples of such a polyorganosiloxane include: a polyorganosiloxane comprising a $SiO_{4/2}$ unit, a $(CH_3)_2(CH_2=CH)SiO_{1/2}$ unit, and a $PhSiO_{3/2}$ unit; and a polyorganosiloxane comprising a $SiO_{4/2}$ unit, a $(CH_3)_2(CH_2=CH)SiO_{1/2}$ unit, a $(CH_3)_3SiO_{1/2}$ unit, and a $PhSiO_{3/2}$ unit.

The weight-average molecular weight (Mw) of the component (A) is not particularly limited, and preferably not less than 500 and not more than 50000, more preferably not less than 600 and not more than 40000, still more preferably not less than 700 and not more than 20000, and particularly preferably not less than 1000 and not more than 10000. When the weight-average molecular weight is 500 or more, the resulting cured product tends to have increased toughness and be less tacky. Also, when the weight-average molecular weight is 50000 or less, the compatibility with the other components tends to increase. Note that the weight-average molecular weight is calculated by using molecular weights determined by gel permeation chromatography (GPC) in terms of standard polystyrene.

The molecular weight distribution (Mw/Mn) of the component (A) is not particularly limited, and preferably not less than 1 and not more than 4, more preferably 1 to 3.5, still more preferably 1 to 3, and particularly preferably 1 to 2.5. When the molecular weight distribution is 4 or less, the compatibility of the resulting cured product tends to increase. Note that the molecular weight distribution is calculated by using a weight-average molecular weight (Mw) and a number average molecular weight (Mn) as calculated by using molecular weights determined by gel permeation chromatography (GPC) in terms of standard polystyrene.

The components (A) may be a liquid or solid at 25° C. Preferred is a liquid. More specifically, the viscosity at 25° C. of the component (A) is not particularly limited, and preferably 10 mPa·s or higher, more preferably 100 mPa·s or higher, and still more preferably 500 mPa·s or higher. When the viscosity is 10 mPa·s or higher, the curable resin composition tends to be easily prepared and handled. Meanwhile, the upper limit of the viscosity is not particularly limited, and preferably 1000000 mPa·s and more preferably 100000 mPa·s. When the viscosity is 1000000 mPa·s or less, the curable resin composition also tends to be easily prepared and handled. Note that the viscosity at 25° C. may be measured under conditions at a temperature of 25° C. and a rotation number of 20 rpm by using a rheometer (trade name "Physica MCR-302") manufactured by Anton Paar, Inc., and a parallel plate (with a cone diameter of 25 mm and a taper angle of 0 degrees).

The weight-average molecular weight (Mw), the molecular weight distribution (Mw/Mn), and the viscosity at 25° C. of the component (A) of the present invention may be suitably adjusted by selecting production conditions (e.g., a reaction temperature, a reaction time), the kind and ratio of each group bonded to a silicon atom of an ingredient, (the hydrolysable silane compound described below) for forming such structural units during the process described below for producing the component (A).

The component (A) may be produced by a known and conventional process for producing a polysiloxane. Examples of the production process include, but are not particularly limited to, for example, a process comprising subjecting one or two or more hydrolysable silane compounds to hydrolysis and condensation. Provided that for the above hydrolysable silane compounds, a hydrolysable tetrafunctional silane compound (a compound represented by the following formula (a)), a hydrolysable trifunctional silane compound (a compound represented by the following formula (b)), and a hydrolysable monofunctional silane compound (a compound represented by the following formula (d)), which are used to form structural units of the above average unit formula (I), should be used as essential hydrolysable silane compounds. A hydrolysable bifunctional silane compound (a compound represented by the following formula (c)) is optionally used.

More specifically, the component (A) may be produced by, for instance, a process comprising subjecting, to hydrolysis and condensation, a compound of the following formula (a), which is a hydrolysable silane compound for forming a Q-unit, a compound of the following formula (b), which is a hydrolysable silane compound for forming a T-unit, and a compound of the following formula (d), which is a hydrolysable silane compound for forming an M-unit, and optionally a compound of the following formula (c), which is a hydrolysable silane compound for forming a D-unit.

[Chem. 23]

$$\text{Si}(X^1)_4 \quad (a)$$

$$R^{12}\text{Si}(X^2)_3 \quad (b)$$

$$R^{13}{}_2\text{Si}(X^3)_2 \quad (c)$$

$$R^{14}{}_3\text{Si}(X^4) \quad (d)$$

The compound of the above formula (a) is a compound used to form a Q-unit in the component (A) of the present invention. In the above formula (a), $X^1$ represents an alkoxy group or a halogen atom. Examples of the alkoxy group of $X^1$ include alkoxy groups having 1 to 10 carbon atoms such as a methoxy group, an ethoxy group, a propoxy group, an iospropoxy group, a butoxy group, and an isobutoxy group. Examples of the halogen atom of $X^1$ include a fluorine atom, a chlorine atom, a bromine atom, and an iodine atom. Among them, $X^1$ is preferably an alkoxy group and more preferably a methoxy group and an ethoxy group. Note that each of four $X^1$ may be the same or different.

The compound of the above formula (b) is a compound used to form a T-unit in the component (A) of the present invention. In the above formula (b), $R^{12}$ is an alkyl group having 1 to 10 carbon atoms, an aryl group having 6 to 14 carbon atoms, or an alkenyl group having 2 to 8 carbon atoms. Respective examples and preferably aspects of the alkyl group having 1 to 10 carbon atoms, aryl group having 6 to 14 carbon atoms, and alkenyl group having 2 to 8 carbon atoms represented by $R^{12}$ are the same as those of $R^1$ in the above average unit formula (I).

In the above formula (b), $X^2$ represents an alkoxy group or a halogen atom. Examples of the alkoxy group of $X^2$ include alkoxy groups having 1 to 10 carbon atoms such as a methoxy group, an ethoxy group, a propoxy group, an isopropoxy group, a butoxy group, and an isobutoxy group. In addition, examples of the halogen atom of $X^2$ include a fluorine atom, a chlorine atom, a bromine atom, and an iodine atom. Among them, $X^2$ is preferably an alkoxy group and more preferably a methoxy group and an ethoxy group. Note that each of three $X^2$ may be the same or different.

The compound of the above formula (c) is a compound used to form a D-unit in the component (A) of the present invention. In the formula (c), $R^{13}$ is an alkyl group having 1 to 10 carbon atoms, an aryl group having 6 to 14 carbon atoms, or an alkenyl group having 2 to 8 carbon atoms. Respective examples and preferable aspects of the alkyl group having 1 to 10 carbon atoms, aryl group having 6 to 14 carbon atoms, and alkenyl group having 2 to 8 carbon atoms represented, by $R^{13}$ are the same as those of $R^1$ in the above average unit formula (I). Note that each of two $R^{13}$ may be the same or different.

In the above formula (c), $X^3$ represents an alkoxy group or a halogen atom. Examples of the alkoxy group of $X^3$ include alkoxy groups having 1 to 10 carbon atoms such as a methoxy group, an ethoxy group, a propoxy group, an isopropoxy group, a butoxy group, and an isobutoxy group. In addition, examples of the halogen atom of $X^3$ include a fluorine atom, a chlorine atom, a bromine atom, and an iodine atom. Among them, $X^3$ is preferably an alkoxy group and more preferably a methoxy group and an ethoxy group. Note that each of two $X^3$ may be the same or different.

The compound of the above formula (d) is a compound used to form an M-unit in the component (A) of the present invention.

In the formula (d), $R^{14}$ is an alkyl group having 1 to 10 carbon atoms, an aryl group having 6 to 14 carbon atoms, or an alkenyl group having 2 to 8 carbon atoms. Respective examples and preferable aspects of the alkyl group having 1 to 10 carbon atoms, aryl group having 6 to 14 carbon atoms, and alkenyl group having 2 to 8 carbon atoms represented by $R^{14}$ are the same as those of $R^1$ in the above average unit formula (I). Note that each of three $R^{14}$ may be the same or different.

In the above formula (d), $X^4$ represents an alkoxy group, a halogen atom, or a group represented by $-\text{OSiR}^{14}{}_3$. Examples of the alkoxy group of $X^4$ include alkoxy groups having 1 to 10 carbon atoms such as a methoxy group, an ethoxy group, a propoxy group, an isopropoxy group, a butoxy group, and an isobutoxy group. In addition, examples of the halogen atom of $X^4$ include a fluorine atom, a chlorine atom, a bromine atom, and an iodine atom. Among them, $X^4$ is preferably an alkoxy group of a group represented by $-\text{OSiR}^{14}{}_3$ and more preferably a methoxy group, an ethoxy group, and a group represented by $-\text{OSiR}^{14}{}_3$. When $X^4$ is a group represented by $-\text{OSiR}^{14}{}_3$, each of three $R^{14}$ may be the same or different.

The usage and composition of each hydrolysable silane compound may be suitably adjusted depending on the structure of the desired component (A) of the present invention. For instance, the usage of the compound of the above formula (a) is not particularly limited, and preferably 5 to 80 mol %, more preferably 7 to 60 mol %, and still more preferably 10 to 40 mol %, based on the total amount (100 mol %) of the hydrolysable silane compounds to be used.

In addition, the usage of the compound of the above formula (b) is not particularly limited, and preferably 1 to 80 mol %, more preferably 3 to 50 mol %, and still more preferably 5 to 30 mol %, based on the total amount (100 mol %) of the hydrolysable silane compounds to be used.

In addition, the usage of the compound of the above formula (d) is not particularly limited, and preferably 10 to 90 mol %, more preferably 30 to 80 mol %, and still more preferably 50 to 70 mol %, based on the total amount (100 mol %) of the hydrolysable silane compounds to be used.

In addition, when the compound of the above formula (c) is used, the usage is not particularly limited, and preferably 0 to 90 mol %, more preferably 0 to 60 mol %, and still more preferably 0 to 30 mol %, based on the total amount (100 mol %) of the hydrolysable silane compounds to be used.

Meanwhile, when two or more different hydrolysable silane compounds above are used in combination, these hydrolysable silane compounds may be subjected to hydrolysis and condensation reactions simultaneously or sequentially. If the above reactions are carried out sequentially, the order of the reactions is not particularly limited.

For instance, an aspect can be mentioned in which the compounds of the above formulas (a), (b), and (d) may be subjected to hydrolysis and condensation reactions and the compound of the formula (d) may then be added thereto.

The hydrolysis and condensation reactions of the above hydrolysable silane compounds may be carried out in the presence or absence of a solvent. Of two, it is preferable to carry out the reactions in the presence of a solvent. Examples of the solvent include: aromatic hydrocarbons such as benzene, toluene, xylene, ethylbenzene; ethers such as diethyl ether, dimethoxy ethane, tetrahydrofuran, dioxane; ketones such as acetone, methylethyl ketone, methylisobutyl ketone; esters such as methyl acetate, ethyl acetate, isopropyl acetate, butyl acetate; amides such as N,N-dimethylformamide, N,N-dimethylacetamide; nitriles such as acetonitrile, propionitrile, benzonitrile; and alcohols such as methanol, ethanol, isopropyl alcohol, and butanol. As the above solvent among them, preferred are ketones and ethers. Note that the solvents may be used singly or in combinations of two or more.

The usage of the solvent is not particularly limited and may be suitably adjusted, depending on a desired reaction time, etc., within the range of 0 to 2000 parts by weight per 100 parts by weight of all the hydrolysable silane compounds.

The hydrolysis and condensation reactions of the above hydrolysable silane compounds may be preferably made, to proceed in the presence of a catalyst and water. The catalyst may be an acid catalyst or an alkali catalyst. Examples of the acid catalyst include: mineral acids such as hydrochloric acid, sulfuric acid, nitric acid, phosphoric acid, boric acid; phosphates; carboxylic acids such as acetic acid, formic acid, trifluoroacetic acid; sulfonic acids such as methanesulfonic acid, trifluoromethane sulfonic acid, p-toluene sulfonic acid; solid acids such as activated clay; and Lewis acids such as iron chloride. Examples of the alkali acid include: alkali metal hydroxides such as lithium hydroxide, sodium hydroxide, potassium hydroxide, cesium hydroxide; alkali earth metal hydroxides such as magnesium hydroxide, calcium hydroxide, barium hydroxide; alkali metal carbonates such as lithium carbonate, sodium carbonate, potassium carbonate, cesium carbonate; alkali earth metal carbonates such as magnesium carbonate; alkali metal bicarbonates such as lithium bicarbonate, sodium bicarbonate, sodium bicarbonate, potassium bicarbonate, cesium bicarbonate; alkali metal organic acid salts (e.g., acetates) lithium acetate, sodium acetate, potassium acetate, cesium acetate; alkali earth metal organic acid salts (e.g., acetates) such as magnesium acetate; alkali metal alkoxides such as lithium methoxide, sodium methoxide, sodium ethoxide, sodium isopropoxide, potassium ethoxide, potassium t-butoxide; alkali metal phenoxides such as sodium phenoxide; amines (e.g., tertiary amines) such as triethylamine, N-methylpiperidine, 1,8-diazabicyclo[5.4.0]undecane-7-ene, 1,5-diazabicyclo[4.3.0]nonane-5-ene; and nitrogen-containing aromatic heterocyclic compounds such as pyridine, 2,2-bipyridyl, and 1,10-phenanthroline. Note that the catalysts may be used singly or in combinations of two or more. In addition, each catalyst may be used while dissolved or dispersed in water and/or a solvent.

The usage of the catalyst is not particularly limited and may be suitable adjusted within the range of 0.002 to 0.200 mol based on the total amount (1 mol) of all the hydrolysable silane compounds.

The usage of water during the hydrolysis and condensation reactions is not particularly limited and may be suitably adjusted within the range of 0.5 to 20 mol based on the total amount (1 mol) of all the hydrolysable silane compounds.

The water addition procedure is not particularly limited and all amount of water used (the total usage) may be added as one portion or sequentially. When sequentially added, the water may be added continuously or intermittently.

When, the hydrolysis and condensation reactions of the above hydrolysable silane compounds are carried out, the reaction conditions are preferably selected such that the weight-average molecular weight the molecular weight distribution (Mw/Mn), and the viscosity at 25° C., etc., of the component (A) of the present invention are within the predetermined ranges. The reaction temperature during the hydrolysis and condensation reactions is not particularly limited, and preferably −10 to 100° C. and more preferably 0 to 80° C. When the reaction temperature is controlled to within the above ranges, the weight-average molecular weight (Mw), the molecular weight distribution (Mw/Mn), and the viscosity at 25° C., etc., of the component (A) tend to be controlled within the predetermined ranges. The reaction time of the hydrolysis and condensation reactions is not particularly limited, and preferably 0.1 to 24 h and more preferably 1.5 to 18 h. The above hydrolysis and condensation reactions may be carried out under ordinary pressure or carried out under increased or reduced pressure. Note that examples of the atmosphere during the hydrolysis and condensation reactions include, but are not particularly limited to, inert gas atmospheres such as a nitrogen atmosphere and an argon atmosphere. The reactions may also be performed in the presence of oxygen such as air, etc., but the reactions are preferably performed under an inert gas atmosphere.

The hydrolysis and condensation reactions of the above hydrolysable silane compounds are carried out to give a component (A) of the present invention. The component (A) of the present invention may be separated and purified by separation means such as water washing, acid washing, alkali water washing, filtration, concentration, distillation, extraction, crystallization, recrystallization, and chromatography, and combinations thereof.

Because the component (A) of the present invention has the above configurations, the curable resin compositions containing the component (A) as an essential component can be cured to form a less tacky cured product having both increased gas barrier properties against corrosive gas (e.g., $H_2S$ gas, $SO_x$ gas) and excellent heat resistance and light resistance.

Note that in the present curable resin composition, the components (A) may be used singly or in combinations of two or more.

When two or more components (A) are used in combination, X, Y, Z, X/Y, a1 to a4, a1/a2, etc., may each be an average as calculated in accordance with the blending ratio between the respective components (A).

The content (amount blended) of the component (A) in the curable resin composition of the present invention is not particularly limited and preferably 20 to 99 wt %, more preferably 40 to 97 wt %, and still more preferably 50 to 95 wt %, based on the total amount (100 wt %) of the curable resin composition. When the content is adjusted to 20 wt % or more, the resulting cured product tends to have further increased gas barrier properties against corrosive gas (e.g., $H_2S$ gas, $SO_x$ gas) and excellent heat resistance and light resistance.

[Component (B)]

The component (B), which is an essential component of the curable resin composition of the present invention, is a polyorganosiloxane represented by the following average composition formula (II):

$$R^2{}_m H_n SiO_{[(4-m-n)/2]} \quad (II)$$

wherein each $R^2$ is the same or different and is an alkyl group having 1 to 10 carbon atoms or an aryl group having 6 to 14 carbon atoms and at least one of $R^2$ is an aryl group, at least 2 hydrogen atoms are bonded to the silicon atom, and m and n are numbers satisfying $0.7 \leq m \leq 2.1$, $0.001 \leq n \leq 1$, and $0.8 \leq m+n \leq 3$.

That, is, the component (B) is a component that is a polyorganosiloxane with a hydrosilyl group, and a component capable of making a hydrosilylation reaction with a component with an alkenyl group (e.g., the component (A), the component (E) and the component (G) described below).

Examples of the alkyl group having 1 to 10 carbon atoms represented by $R^2$ in the above average composition formula (II) include straight-chain or branched-chain alkyl groups such as a methyl group, an ethyl group, a propyl group, an isopropyl group, a butyl group, a hexyl group, an octyl group, an isooctyl group, and a decyl group. Among them, preferred is a methyl group. In addition, the component (B) may have only one kind of the alkyl group or two or more kinds of the alkyl group.

Examples of the aryl group having 6 to 14 carbon atoms represented by $R^2$ in the above average composition formula (II) include a phenyl group and a naphthyl group. Among them, preferred is a phenyl group. In addition, the component (B) may have only one kind of the aryl group or two or more kinds of the aryl group.

In the component (B), when the percentage of the alkyl group based on the total amount (100 mol %) of $R^2$ is X' mol %, X' is not particularly limited, and preferably 20 to 95 mol %, more preferably 30 to 93 mol %, and still more preferably 40 to 90 mol %. When X' is 20 mol % or more, a curable resin composition of the present invention tends to be cured to give a cured product having excellent heat resistance and light resistance. Also, when X' is 95 mol % or less, the resulting cured product tends to have increased barrier properties against corrosive gas and be less tacky.

In the component (B), when the percentage of the aryl group based on the total amount (100 mol %) of $R^2$ is Y' mol %, Y' is not particularly limited and preferably 1 to 80 mol %, more preferably 3 to 60 mol %, and still more preferably 5 to 40 mol %. When Y' is 1 mol % or more, the resulting cured product tends to have increased barrier properties against corrosive gas and be less tacky. Also, when Y' is 80 mol % or less, the resulting cured product tends to have increased heat resistance and light resistance.

In the component (B), when the percentage of the SiH group (hydrosilyl group) based on the total amount (100 mol %) of $R^2$ is Z' mol %, Z' is not particularly limited, and preferably 2 to 70 mol %, more preferably 5 to 60 mol %, and still more preferably 10 to 55 mol %. When Z' is adjusted to within the above ranges, the curable resin composition tends to have increased curing performance.

The ratio of the alkyl group content (X') to the aryl group content (Y') (X'/Y') in the component (B) is not particularly limited, and preferably 1/100 to 100/1, more preferably 10/100 to 100/10, and still more preferably 20/100 to 100/20. When X'/Y' is adjusted to within the above ranges, the curable resin composition of the present invention tends to be cured to give a less tacky cured product having both increased gas barrier properties against corrosive gas (e.g., $H_2S$ gas, $SO_x$ gas) and excellent heat resistance and light resistance. That is, when X'/Y' is 1/100 or more, a curable resin composition of the present invention tends to be cured to give a cured product in which heat resistance and light resistance are maintained. Also, setting X'/Y' to 100/1 or less tends to give a tack-less cured product while maintaining increased gas barrier properties against corrosive gas (e.g., $H_2S$ gas, $SO_x$ gas).

Note that the percentage (mol %) of the alkyl group, the percentage (mol %) of the aryl group content, and the percentage (mol %) of the SiH group based on the total amount (100 mol %) of $R^2$ may each be calculated by, for instance, $^1$H-NMR spectroscopy.

In the above average composition formula (II), m and n are numbers satisfying $0.7 \leq m \leq 2.1$, $0.001 \leq n \leq 1$, and $0.8 \leq m+n \leq 3$.

m represents an average number of $R^2$ per silicon atom in the component (B), is selected from the range of 0.7 to 2.1, and is preferably 0.8 to 2.1 and more preferably 1 to 2.

n represents the number of silicon-bonded hydrogen atoms per silicon atom in the component (B), is selected from the range of 0.001 to 1, and is preferably 0.01 to 1 and more preferably 0.2 to 1.

m+n represents an average number of the sum of $R^2$ and silicon-bonded hydrogen atoms per silicon atom in the component (B), is selected from the range of 0.8 to 3, and is preferably 1 to 2.9 and more preferably 1.5 to 2.8.

When m and n satisfy the above conditions, the curable resin composition of the present invention tends to be cured to give a less tacky cured product having both increased gas barrier properties against corrosive gas (e.g., $H_2S$ gas, $SO_x$ gas) and excellent heat resistance and light resistance.

X', Y', Z', X'/Y', m, n, m+n, etc., in the component (B) of the present invention may be suitably adjusted by selecting the kind and composition of each group bonded to a silicon atom of an ingredient (a hydrolysable silane compound) for forming such structural units during the process described below for producing the component (B).

Preferably, the component (B) has at least two structural units (M-units) represented by $(R^{2'}{}_2 HSiO_{1/2})$ in a molecule. Specifically, it is preferable that the component (B) has a structure in which at least two ends are ended by the M-units represented by $(R^{2'}{}_2 HSiO_{1/2})$. Each $R^{2'}$ in the M-unit is the same or different and is an alkyl group having 1 to 10 carbon atoms or an aryl group having 6 to 14 carbon atoms. The alkyl group having 1 to 10 carbon atoms and the aryl group having 6 to 14 carbon atoms of $R^{2'}$ are the same as those of $R^2$ in the above average composition formula (II). Preferred is an alkyl group having 1 to 10 carbon atoms. More preferred is a methyl group.

When the component (B) has such a structure with at least two ends having SiH groups (hydrosilyl groups), the curable resin composition tends to be cured to give a cured product having excellent flexibility, heat resistance, and light resistance.

When the component (B) has M-units represented by $(R^2{}_2HSiO_{1/2})$, the number of the M-units is not particularly limited as long as the number is 2 or more and is preferably 2 to 4 and more preferably 2. The two or more M-units represented by $(R^2{}_2HSiO_{1/2})$ may be the same or different.

In addition, the component (B) may have, in addition to the M-units represented by $(R^2{}_2HSiO_{1/2})$, an SiH group(s) on its side chain(s).

Examples of the component (B) include materials with straight-chain, partially branched straight-chain, branched-chain, or reticular molecular structures. Note that the component (B) may be used singly or in combinations of two or more. Specifically, two or more components (B) with different molecular structures may be used in combination. For example, a straight-chain component (B) and a branched-chain component (B) may be used in combination.

The form of component (B) may be a liquid or solid. Of two, preferred is a liquid of which the viscosity at 25° C. is preferably 0.1 to 1 billion mPa·s and more preferably 0.1 to 100000 mPa·s. The viscosity at 25° C. of the component (B) may be measured by the same method as for the above component (A).

An example of the component (B) includes a polyorganosiloxane that is represented by the following average unit formula:

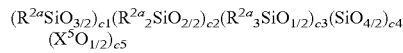

and preferably has at least two structural units (M-units) represented by $(R^{2a}{}_2HSiO_{1/2})$. Each $R^{2a}$ in the average unit formula and the M-units is the same or different and is a hydrogen atom, an alkyl group having 1 to 10 carbon atoms, or an aryl group having 6 to 14 carbon atoms. Respective examples and preferable aspects of the alkyl group having 1 to 10 carbon atoms and aryl group having 6 to 14 carbon atoms represented $R^{2a}$ are the same as those of $R^2$ in the above average composition formula (II).

Some of $R^{2a}$ may be a hydrogen atom (a hydrogen atom constituting a hydrosilyl group). The percentage of the hydrogen atom based on the total amount (100 mol %) of $R^{2a}$ is not particularly limited, and preferably 2 to 70 mol %. When the percentage of the hydrogen atom is controlled to within the above range, the curable resin composition tends to have increased curing performance.

In the above average unit formula, $X^5$ is a hydrogen atom or an alkyl group. Examples of the alkyl group include a methyl group, an ethyl group, a propyl group, a butyl group, a pentyl group, and a hexyl group. Particularly preferred is a methyl group.

In the above average unit formula, c1 is 0 or a positive number, c2 is 0 or a positive number, c3 is 0 or a positive number, c4 is 0 or a positive number, c5 is 0 or a positive number, and (c1+c2+c3) is a positive number.

Preferable examples of the component (B) include a straight-chain polyorganosiloxane having two or more hydrosilyl groups at both ends of the molecule.

The percentage of the hydrogen atom (silicon-bonded hydrogen atom) based on the total amount (100 mol %) of groups bonded to the silicon atoms in the straight-chain polyorganosiloxane is preferably 2 to 70 mol %. The percentage of the alkyl group (in particular, the methyl group) based on the total amount (100 mol %) of groups bonded to the silicon atoms is preferably 20 to 95 mol %. The percentage of the aryl group (in particular, the phenyl group) based on the total amount (100 mol %) of groups bonded to the silicon atoms is preferably 1 to 80 mol %. When the above straight-chain polyorganosiloxane, where the percentage of the alkyl group (in particular, the methyl group) based on the total amount (100 mol %) of groups bonded to the silicon atoms is 20 mol % or more (e.g., 40 to 95 mol %), is used, the resulting cured product tends to have increased heat resistance.

Note that the percentage (mol %) of each of the alkyl group, the aryl group, and the hydrogen atom based on the total amount (100 mol %) of groups bonded to the silicon atoms may be calculated by, for instance, $^1$H-NMR spectroscopy.

Preferable examples of the straight-chain polyorganosiloxane include a polyorganosiloxane represented by the following formula (II-1) (hereinafter sometimes referred to as a component (B1)).

[Chem. 24]

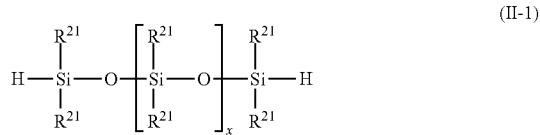

(II-1)

wherein each $R^{21}$ is the same or different and represents an alkyl group having 1 to 10 carbon atoms or an aryl group having 6 to 14 carbon atoms, at least one of $R^{21}$ is an aryl group, and x represents an integer of 0 to 1000.

Respective examples and preferable aspects of the alkyl group having 1 to 10 carbon atoms and aryl group having 6 to 14 carbon atoms of $R^{21}$ are the same as those of $R^2$ in the above average composition formula (II).

x represents an integer of 0 to 1000. Preferred is an integer of 1 to 100.

As the component (B) contains the component (B1) at a content of preferably not less than 1 wt % and not more than 99 wt %, more preferably, not less than 10 wt % and not more than 50 wt %.

The component (B1) may be a liquid or solid at 25° C. Preferred is a liquid. The viscosity at 25° C. of the component (B1) is not particularly limited, and preferably 10000 mPa·s or less and more preferably 5000 mPa·s or less. When the viscosity is 10000 mPa·s or less, the compatibility of the resulting cured product tends to increase more. Meanwhile, the lower limit of the viscosity is not particularly limited, and preferably 1 mPa·s and more preferably 5 mPa·s. When the viscosity is 1 mPa·s or higher, the curable resin, composition tends to be prepared and handled easily. Note that the viscosity at 25° C. may be measured by using substantially the same conditions as for the component (A).

Another example of the component (B) includes a branched-chain polyorganosiloxane having two or more M-units represented by $(R^2HSiO_{1/2})$ and a siloxane unit (T-unit) represented by $RSiO_{3/2}$ in a molecule. Like $R^2$ in the above general formula (II), each R is an alkyl group having 1 to 10 carbon atoms or an aryl group having 6 to 14 carbon atoms and at least one of R is an aryl group.

The percentage of the alkyl group (in particular, the methyl group) based on the total amount (100 mol %) of groups bonded to the silicon atoms in the branched-chain polyorganosiloxane is preferably 20 to 95 mol %. The percentage of the aryl group (in particular, the phenyl group) based on the total amount (100 mol %) of groups bonded to the silicon atoms is preferably 1 to 80 mol %. In addition, when the above branched-chain polyorganosiloxane, where the percentage of the alkyl group (in particular, the methyl group) based on the total amount (100 mol %) of groups bonded to the silicon atoms is 20 mol % or more (e.g., 50 to 90 mol %), is used, the resulting cured product tends to have increased heat resistance.

The branched-chain polyorganosiloxane may be represented by, for example, the above average unit formula where c1 is a positive number. In this case, it is preferable that c2/c1 is a number of 0 to 10, c3/c1 is a number of 0 to 0.5, c4/(c1+c2+c3+c4) is a number of 0 to 0.3, and c5/(c1+c2+c3+c4) is a number of 0 to 0.4. In addition, the molecular weight, namely the weight-average molecular weight of the branched-chain polyorganosiloxane as measured by GPC in terms of standard polystyrene is preferably 100 to 50000, preferably 150 to 40000, more preferably 150 to 10000, and more preferably 200 to 3000.

The weight-average molecular weight (Mw) of the component (B) is not particularly limited, and preferably not less than 100 and not more than 50000, more preferably not less than 150 and not more than 40000, further preferably not less than 175 and not more than 20000, particularly preferably not less than 200 and not more than 10000. When the weight-average molecular weight is 100 or more, the resulting cured product tends to have increased toughness and be less tacky. On the other hand, when the weight-average molecular weight is 50000 or less, the compatibility with the other components tends to increase. Note that the weight-average molecular weight is calculated by using molecular weights determined by gel permeation chromatography (GPC) in terms of standard polystyrene.

The molecular weight distribution (Mw/Mn) of the component (B) is not particularly limited, and preferably not less than 1 and not more than 4, more preferably 1 to 3.5, still more preferably 1 to 3, and particularly preferably 1 to 2.5. When the molecular weight distribution is 4 or less, the compatibility of the resulting cured product tends to increase. Note that the molecular weight distribution may be calculated by using a weight-average molecular weight (Mw) and a number average molecular weight (Mn) as calculated by using molecular weights determined by gel permeation chromatography (GPC) in terms of standard polystyrene.

The component (B) may be a liquid or solid at 25° C. Preferred is a liquid. The viscosity at 25° C. of the component (B) is not particularly limited, and preferably 1 mPa·s or higher and more preferably 5 mPa·s or higher. When the viscosity is 1 mPa·s or higher, the curable resin composition tends to be prepared and handled easily. Meanwhile, the upper limit of the viscosity is not particularly limited, and preferably 10000 mPa·s and more preferably 5000 mPa·s. When the viscosity is 10000 mPa·s or less, the compatibility tends to become better. Note that the viscosity at 25° C. may be measured by using substantially the same conditions as for the component (A).

The component (B) may be produced by a known and conventional process for producing a polysiloxane and is not particularly limited. Specifically, the component (B) can be produced by a process comprising subjecting one or two or more hydrolysable silane compounds to hydrolysis and condensation in the same manner as the above process for producing the component (A) except for using, as starting materials, hydrolysable silane compounds where the alkenyl groups having 2 to 8 carbon atoms of $R^{12}$, $R^{13}$, and $R^{14}$ are replaced by hydrogen atoms in the hydrolysable silane compounds represented by the formulas (b), (c), and (d) that are used in the above process for producing the component (A).

In addition, when the component (B) has an M-unit with a terminal SiH, the component (B) can be produced by a process comprising subjecting one or two or more hydrolysable silane compounds to hydrolysis and condensation in the same scanner as the above process for producing the component (A) except for further using, as additional starting materials, a hydrolysable silane compound represented by the following formula (e) for forming the M-unit.

[Chem. 25]

$$R^{22}{}_2HSi(X^6) \tag{e}$$

The compound of the above formula (e) is a compound used to form an M-unit with a terminal SiH group in the component (B) of the present invention. In the formula (e), $R^{22}$ is an alkyl group having 1 to 10 carbon atoms or an aryl group having 6 to 14 carbon atoms. Respective examples and preferable aspects of the alkyl group having 1 to 10 carbon atoms and aryl group having 6 to 14 carbon atoms represented by $R^{22}$ are the same as those of $R^2$ in the above average composition formula (II). Note the each of two $R^{22}$ may be the same or different.

In the above formula (e), $X^6$ represents an alkoxy group, a halogen atom, or a group represented by $-OSiR^{22}{}_2$. Examples of the alkoxy group of $X^6$ include alkoxy groups having 1 to 10 carbon atoms such as a methoxy group, an ethoxy group, a propoxy group, an isopropoxy group, a butoxy group, and an isobutoxy group. In addition, examples of the halogen atom of $X^6$ include a fluorine atom, a chlorine atom, a bromine atom, and an iodine atom. Among them, $X^6$ is preferably an alkoxy group or a group represented by $-OSiR^{22}{}_2$ and more preferably a methoxy group, an ethoxy group, and a group represented by $-OSiR^{22}{}_2$. When $X^6$ is a group represented by $-OSiR^{22}{}_2$, each of two $R^{22}$ may be the same or different.

Preferable specific examples of the component (B) of the present invention include 1,1,5,5-tetramethyl-3,3-diphenyl-trisiloxane and 3-phenyl-1,1,3,5,5-pentamethyltrisiloxane. Manufactured articles containing the component (B) such as trade names "HMS-031", "HPM-502", "HMS-991", 3-phenyl-1,1,3,5,5-pentamethyltrisiloxane (each manufactured by Gelest, Inc.); and 1,1,5,5-tetramethyl-3,3-diphenyltrisiloxane (NANJING SiSiB Silicones, Inc.) are available.

Because the component (B) of the present invention has the above configurations, curable resin compositions containing the component (B) as an essential component can each be cured to form a less tacky cured product having both increased gas barrier properties against corrosive gas (e.g., $H_2S$ gas, $SO_x$ gas) and excellent heat resistance and light resistance.

Note that in the present curable resin composition, the components (B) may be used singly or in combinations of two or more.

When two or more components (B) are used in combination, X', Y', Z', X'/Y', m, n, m+n, c1 to c5, x, etc., may each be an average as calculated in accordance with the blending ratio between the respective components (B).

The content (amount blended) of the component (B) in the curable resin composition of the present invention is not particularly limited and preferably 5 to 50 wt %, more preferably 7 to 30 wt %, and still more preferably 10 to 25 wt %, based on the total amount (100 wt %) of the curable resin composition. When the content is adjusted to 5 wt % or more, the resulting cured product tends to have further increased gas barrier properties against corrosive gas (e.g., H₂S gas, SO$_x$ gas) and excellent heat resistance and light resistance.

The content (amount blended) of the component (B) based on the component (A) in the curable resin composition of the present invention is not particularly limited and, per 100 parts by weight of the component (A), preferably to 200 parts by weight, more preferably 5 to 100 parts by weight, and still more preferably 10 to 50 parts by weight. When the content is adjusted to 1 part by weight or more, the resulting cured product tends to have further increased gas barrier properties against corrosive gas (e.g., H₂S gas, SO$_x$ gas) and excellent heat resistance and light resistance.

[Component (C)]

As described above, the component (C) as an essential component of the curable resin composition of the present invention is a straight-chain polyorganosiloxane that is a liquid having a viscosity at 25° C. of 10000 mPa·s or less, represented by the following general formula (III-1):

[Chem. 26]

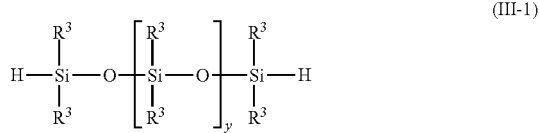

(III-1)

wherein each R³ is the same or different and represents an alkyl group having 1 to 10 carbon atoms, and y represents an integer of not less than 1 and not more than 100.

Specifically, the component (C) is a polyorganosiloxane having a hydrosilyl group, and a component capable of making a hydrosilylation reaction with a component having an alkenyl group (for example, the component (A), a component (E) described below, and a component (G) described below).

When the curable resin composition of the present invention contains a specific amount of the component (C) that is a straight-chain dialkyl silicone resin having a specific degree of polymerization, with a hydrosilyl group (SiH group) at both ends, the resulting cured resin has increased flexibility. As a result, for example, a cured product having a high tensile strength and a low Young's modulus can be easily obtained. Accordingly, when a cured product of the curable resin composition of the present invention used as an encapsulant for larger packages of optical semiconductor devices (LED packages) is subjected to a thermal shock such as a hot/cold cycle, a problem such as lighting failure due to fracture of a bonding wire caused by the occurrence of cracks hardly occurs.

Examples of the alkyl group having 1 to 10 carbon atoms represented by R³ in the general formula (III) include a straight-chain or branched-chain alkyl group such as a methyl group, an ethyl group, a propyl group, an isopropyl group, a butyl group, a hexyl group, an octyl group, an isooctyl group and a decyl group. Among them, preferred is a methyl group. The component (C) may have only one kind of the alkyl group or two or more kinds of the alkyl group.

In the formula, y indicates the degree of polymerization of the straight-chain polysiloxane of the component (C) (y+2; degree of polymerization), which is an integer of 1 to 100 (i.e., degree of polymerization: 3 to 102), preferably an integer of 2 to 90, and more preferably an integer of 3 to 80. When y is 0 (i.e., degree of polymerization: 2), the resulting cured product has insufficient flexibility and heat shock resistance. When the cured product used as an encapsulant for larger packages of optical semiconductor devices (LED packages) is subjected to a thermal shock such as a hot/cold cycle, lighting failure due to fracture of a bonding wire caused by the occurrence of cracks may occur. Meanwhile, when y is 101 or more (i.e., the degree of polymerization is 103 or more), the cured product tends to become clouded to reduce transmittance and tends to be tacky.

Although the component (C) may be a liquid or a solid at 25° C., and a liquid is preferred. The viscosity of the component (C) at 25° C. is not particularly limited, and is preferably 10000 mPa·s or less, and more preferably 5000 mPa·s or less. When the viscosity is 10000 mPa·s or less, the compatibility of the cured product tends to be further increased. Meanwhile, the lower limit of the viscosity is not particularly limited, and is preferably 1 mPa·s and more preferably 5 mPa·s. When the viscosity is 1 mPa·s or more, preparation and handling of the curable resin composition tend to be easy. Note that the viscosity at 25° C. can be measured in the same conditions as for the component (A).

The weight-average molecular weight (Mw) of the component (C) is not particularly limited, and is preferably not less than 100 and not more than 50000, more preferably not less than 150 and not more than 40000, still more preferably not less than 175 and not more 20000, and particularly preferably not less than 200 and not more than 10000. When the weight-average molecular weight is 500 or more, the resulting cured product tends to have increased toughness and be less tacky. Meanwhile, when the weight-average molecular weight is 50000 or less, the compatibility with the other components tends to increase. Note that the weight-average molecular weight is calculated by using molecular weights determined by gel permeation chromatography (GPC) in terms of standard polystyrene.

The molecular weight (Mw/Mn) of the component (C) is not particularly limited, and is preferably not less than 1 and not more than 4, more preferably 1 to 3.5, still more preferably 1 to 3, and particularly preferably 1 to 2.5. When the molecular weight distribution is 4 or less, the compatibility of the resulting cured product tends to be increased. Note that the molecular weight distribution can be calculated by using a weight-average molecular weight (Mw) and a number average molecular weight (Mn) calculated by using molecular weights determined by gel permeation chromatography (GPC) in terms of standard polystyrene.

Preferable specific examples of the component (C) of the present invention include a straight-chain polydimethylsiloxane having 3 to 102 (preferably 4 to 92) (Si—O) units with a SiH group at both ends such as 1,1,3,3,5,5-hexamethyltrisiloxane, 1,1,3,3,5,5,7,7-octamethyltetrasiloxane, and 1,1,3,3,5,5,7,7,9,9-decamethylpentasiloxane, and a mixture thereof. Manufactured articles containing the component (C) such as trade names "DMS-H03", "DMS-H11" and "DMS-H21", (each manufactured by Gelest, Inc.) are available.

Because the component (C) of the present invention has the above configuration, a curable resin composition containing the component (C) as an essential component can be cured to form a cured product having high flexibility (for example, high tensile strength and a low Young's modulus) and excellent heat shock resistance.

Note that in the curable resin composition of the present invention, the components (C) may be used singly or in combinations of two or more.

When two or more components (C) are used in combination, y described above may be an average as calculated in accordance with the blending ratio between each component (C).

The content (amount blended) of the component (C) in the curable resin composition of the present invention is not less than 0.3 wt % and not more than 20 wt %, preferably 0.4 to 17.5 wt % and more preferably 0.5 to 15 wt %, based on the total (100 wt %) of the curable resin composition, as described above. When the content of the component (C) is adjusted to 0.3 wt % or more, the resulting cured product tends to have sufficient flexibility and heat shock resistance as an encapsulant for large optical semiconductor devices having a high output and a high brightness. Meanwhile, when the content of the component (C) is more than 20 wt %, the resulting cured product tends to be undesirably tacky.

The content (amount blended) of the component (C) based on the component (A) in the curable resin composition of the present invention is not particularly limited, and is preferably 0.5 to 50 parts by weight, more preferably 0.6 to 40 parts by weight, and still more preferably 0.6 to 30 parts by weight, per 100 parts by weight of the component (A). When the content of the component (C) is adjusted to 0.5 parts by weight or more, the resulting cured product tends to have sufficient flexibility and heat shock resistance as an encapsulant for large optical semiconductor devices having a high output and a high brightness. Meanwhile, when the content of the component (C) is more than 50 parts by weight, the resulting cured product tends to be undesirably tacky.

The content (amount blended) of the component (C) based on the component (B) in the curable resin composition of the present invention is not particularly limited, and is preferably 1 to 100 parts by weight, more preferably 2 to 75 parts by weight, and still more preferably 3 to 50 parts by weight, per 100 parts by weight of the component (B). When the content of the component (C) is adjusted to 1 part by weight or more, the resulting cured product tends to have sufficient flexibility and heat shock resistance as an encapsulant for large optical semiconductor devices having a high output and a high brightness. Meanwhile, when the content of the component (C) is more than 100 parts by weight, the resulting cured product tends to be undesirably tacky.

The content (amount blended) of the component (C) based on the total amount of the component (A) and the component (B) in the curable resin composition of the present invention is not particularly limited, and is preferably 0.3 to 40 parts by weight, more preferably 0.4 to 35 parts by weight, and still more preferably 0.5 to 30 parts by weight, based on a total amount of the component (A) and the component (B) of 100 parts by weight. When the content of the component (C) is adjusted to 0.3 parts by weight or more, the resulting cured product tends to have sufficient flexibility and heat shock resistance as an encapsulant for large optical semiconductor devices having a high output and a high brightness. Meanwhile, when the content of the component (C) is more than 40 parts by weight, the resulting cured product tends to be undesirably tacky.

[Component (B)]

The component (D) as an essential component of the curable resin composition of the present invention is a hydrosilylation catalyst as described above. When the curable resin composition of the present invention containing a hydrosilylation catalyst is heated, a hydrosilylation reaction between an aliphatic carbon-carbon double bond (in particular, an alkenyl group) and a hydrosilyl group in the curable resin composition tends to proceed more efficiently.

Examples of the hydrosilylation catalyst include well-known hydrosilylation catalysts such as platinum-based catalysts, rhodium-based catalysts, and palladium-based catalysts. Specific examples include: platinum-based catalysts such as platinum fine powder, platinum black, platinum-supporting silica fine powder, platinum-supporting activated carbon, chloroplatinic acid, complexes of chloroplatinic acid and an alcohol, aldehyde, or ketone, olefin complexes of platinum, carbonyl complexes of platinum such as a platinum-carbonyl, vinylmethyl complex, platinum-vinylmethyl siloxane complexes such as a platinum-divinyltetramethyldisiloxane complex and a platinum-cyclovinylmethylsiloxane complex, platinum-phosphine complexes, and platinum-phosphite complexes; and palladium-based catalysts or rhodium-based catalysts in which a palladium atom or a rhodium atom instead of the platinum atom is included in each of the above platinum-based catalysts. Among them, the hydrosilylation catalyst is preferably a platinum-vinylmethylsiloxane complex, a platinum-carbonyl vinylmethyl complex, and complexes of chloroplatinic acid and an alcohol or aldehyde because the reaction rate is good.

Note that in the present curable resin composition, the hydrosilylation catalysts may be used singly or in combinations of two or more.

The content (amount blended) of the hydrosilylation catalyst based on the total amount (1 mol) of aliphatic carbon-carbon double bonds (in particular, alkenyl groups) contained in the curable resin composition of the present invention is preferably $1 \times 10^{-8}$ to $1 \times 10^{-2}$ mol and more preferably $1 \times 10^{-6}$ to $1 \times 10^{-3}$ mol. When the content is $1 \times 10^{-8}$ mol or more, the resulting cured product tends to be formed more efficiently. Also, when the content is $1 \times 10^{-2}$ mol is less, the resulting cured product excellent in hues (i.e., a less colored product) tends to be obtained.

The content (amount blended) of the hydrosilylation catalyst in the curable resin composition of the present invention, an amount by weight of the platinum, palladium, or rhodium in the hydrosilylation catalyst is preferably an amount within a range of 0.01 to 1000 ppm and more preferably an amount within a range of 0.1 to 500 ppm. If the hydrosilylation catalyst content is within such ranges, the resulting cured product with more excellent hue tends to be obtained more efficiently.

[Component (E)]

A curable resin composition of the present invention may comprise a polyorganosiloxysilalkylene having a group containing one or more aliphatic carbon-carbon unsaturated bonds in a molecule (sometimes simply referred to as a "component (E)"). That is, the component (E) is a polysiloxane with a group containing an aliphatic carbon-carbon unsaturated bond such as an alkenyl group, and is a component capable of making a hydrosilylation reaction with a component with a hydrosilyl group (e.g., the above-described component (B) and component (C)).

The component (E) is a polyorganosiloxane having a group containing one or more aliphatic carbon-carbon unsaturated bonds in a molecule and containing, as a main chain, a siloxane bond (—Si—O—Si—) and a bond represented by —Si—$R^4$—Si— (where $R^4$ represents a divalent hydrocarbon group; hereinafter referred to as a "silalkylene bond"). That is, polyorganosiloxane having no any silalkylene bond such as the above component (A) is not included in the component (E). When the curable resin composition of the present invention contains such a component (E), the resulting cured product has a decreased surface tack and is unlikely to be yellowed.

Examples of the divalent hydrocarbon group ($R^4$) in the silalkylene bond contained in a molecule of component (E) include: straight-chain or branched-chain alkylene groups (e.g., a group represented by $-[CH_2]_t-$, where t represents an integer of 1 or more); and divalent alicyclic hydrocarbon groups. Examples of the straight-chain or branched-chain, alkylene groups include straight-chain or branched-chain alkylene groups having 1 to 18 carbon atoms such as a methylene group, a methylmethylene group, a dimethylmethylene group, an ethylene group, a propylene group, and a trimethylene group. Examples of the divalent alicyclic hydrocarbon groups include divalent cycloalkylene groups (including cycloalkylidene groups) such as a 1,2-cyclopentylene group, a 1,3-cyclopentylene group, a cyclopentylidene group, a 1,2-cyclohexylene group, a 1,3-cyclohexylene group, a 1,4-cyclohexylene group, and a cyclohexylidene group. Among them, $R^4$ is preferably straight-chain or branched-chain alkylene groups and particularly preferably an ethylene group.

When compared with the component (A), the component (E) hardly produces a low-molecular-weight ring during the production steps and also hardly produces a silanol group (—SiOH) when decomposed by heating, etc. Thus, when the component (E) is used, a cured product of the curable resin composition tends to have decreased surface tack and is unlikely to be yellowed.

Examples of the component (E) include materials with straight-chain, partially branched straight-chain, branched-chain, or reticular molecular structures. Note that the component (E) may be used singly or in combinations of two or more. Specifically, two or more components (E) with different molecular structures may be used in combination. For example, a straight-chain component (E) and a branched-chain component (E) may be used in combination.

Examples of the group containing an aliphatic carbon-carbon unsaturated bond, which is contained in the molecule of component (E), include: $C_{2-20}$ alkenyl groups (preferably $C_{2-10}$ alkenyl groups, more preferably $C_{2-8}$ alkenyl groups) such as a vinyl group, an allyl group, a methallyl group, a 1-pentenyl group, an isopropenyl group, a 1-butenyl group, a 2-butenyl group, a 3-butenyl group, a 1-pentenyl group, a 2-pentenyl group, a 3-pentenyl group, a 4-pentenyl group, a 5-hexenyl group; $C_{3-12}$ cycloalkenyl groups such as a cyclohexenyl group; $C_{4-16}$ crosslinked cyclic unsaturated hydrocarbon groups such as a bicycloheptenyl group; $C_{2-4}$ alkenyl-substituted aryl groups such as a styryl group; and cinnamyl groups. Among them, preferred are alkenyl groups, more preferred are $C_{2-8}$ groups, and still more preferred is a vinyl group. In addition, the component (E) may have only one kind of a group containing an aliphatic carbon-carbon unsaturated bond or two or more kinds of a group containing an aliphatic carbon-carbon unsaturated bond. The group containing an aliphatic carbon-carbon unsaturated bond of the component (E) is preferably a group that is bonded to a silicon atom.

Examples of a group bonded to the silicon atom other than the groups containing an aliphatic carbon-carbon unsaturated bond of the component (E) include a hydrogen atom, a monovalent hydrocarbon group, and a monovalent hetrocyclic group.

Examples of the monovalent hydrocarbon group include: monovalent aliphatic hydrocarbon groups; monovalent alicyclic hydrocarbon groups; monovalent aromatic hydrocarbon groups; and monovalent groups in which at least two of an aliphatic hydrocarbon group, an alicyclic hydrocarbon group, and an aromatic hydrocarbon group are bonded. Examples of the monovalent hetrocyclic group include a pyridyl group, a furyl group, and a thienyl group.

Examples of the monovalent aliphatic hydrocarbon group include an alkyl group, an alkenyl group, and an alkynyl group. Examples of the alkyl group include straight-chain or branched-chain $C_{1-20}$ alkyl groups (preferably $C_{1-10}$ alkyl groups, more preferably $C_{1-4}$ alkyl groups) such as a methyl group, an ethyl group, a propyl group, an isopropyl group, a butyl group, a hexyl group, an octyl group, an isooctyl group, a decyl group, and a dodecyl group. Examples of the alkenyl group include $C_{2-20}$ alkenyl groups (preferably $C_{2-10}$ alkenyl groups, more preferably $C_{2-4}$ alkenyl groups) such as a vinyl group, an allyl group, a methallyl group, a 1-propenyl group, an isopropenyl group, a 1-butenyl group, a 2-butenyl group, a 3-butenyl group, a 1-pentenyl group, a 2-pentenyl group, a 3-pentenyl group, a 4-pentenyl group, a 5-hexenyl group. Examples of the alkynyl group include $C_{2-20}$ alkynyl groups (preferably $C_{2-10}$ alkynyl groups, more preferably $C_{2-4}$ alkynyl groups) such as an ethynyl group and a propynyl group.

Examples of the monovalent alicyclic hydrocarbon group include: $C_{3-12}$ cycloalkyl groups such as a cyclopropyl group, a cyclobutyl group, a cyclopentyl group, a cyclohexyl group, a cyclododecyl group; $C_{3-12}$ cycloalkenyl groups such as a cyclohexenyl group; and $C_{4-16}$ crosslinked cyclic hydrocarbon groups such as a bicycloheptanyl group and a bicycloheptenyl group.

Examples of the monovalent aromatic hydrocarbon group include: $C_{6-14}$ aryl groups (in particular, $C_{6-10}$ aryl groups) such as a phenyl group, a naphthyl group, and an anthryl group.

In addition, examples of the group in which an aliphatic hydrocarbon group and an alicyclic hydrocarbon group are bonded include a cyclohexylmethyl group and a methylcyclohexyl group. Examples of the group in which an aliphatic hydrocarbon group and an aromatic hydrocarbon group are bonded include: $C_{7-18}$ aralkyl groups (in particular, $C_{7-10}$ aralkyl groups) such as a benzyl group, a phenethyl group; $C_{6-10}$ aryl-$C_{2-6}$ alkenyl groups such as a cinnamyl group; $C_{1-4}$ alkyl-substituted aryl groups such as a tolyl group; and $C_{2-4}$ alkenyl-substituted aryl groups such as a styryl group.

The above monovalent hydrocarbon groups may each have a substituent. Specifically, each monovalent hydrocarbon group exemplified above may be a monovalent hydrocarbon group, at least one hydrogen atom of which is replaced by a substituent. The number of carbon atoms of the substituent is preferably 0 to 20 and more preferably 0 to 10. Specific examples of the substituent include: a halogen atom; a hydroxyl group; an alkoxy group; an alkenyloxy group; an aryloxy group; an aralkyloxy group; an acyloxy group; a mercapto group; an alkylthio group; an alkenylthio group; an arylthio group; an aralkylthio group; a carboxy group; an alkoxycarbonyl group; an aryloxycarbonyl group; an aralkyloxycarbonyl group; an amino group; a mono- or dialkylamino group; a mono- or diphenylamino group; an acylamino group; an epoxy-containing group; an oxetanyl-containing group; an acyl group; an oxo group; an isocyanate group; and a group in which two or more of the above are bonded via a $C_{1-6}$ alkylene group.

Examples of the alkoxy group include $C_{1-6}$ alkoxy groups (preferably $C_{1-4}$ alkoxy groups) such as a methoxy group, an ethoxy group, a propoxy group, an isopropyloxy group, a butoxy group, and an isobutyloxy group. Examples of the alkenyloxy group include $C_{2-6}$ alkenyloxy groups (preferably $C_{2-4}$ alkenyloxy groups) such as an allyloxy group.

Examples of the aryloxy group include $C_{6-14}$ aryloxy groups optionally having a substituent such as a $C_{1-4}$ alkyl group, a $C_{2-4}$ alkenyl group, a halogen atom, or a $C_{1-4}$ alkoxy group in an aromatic ring, such as a phenoxy group, a tolyloxy group, a naphthyloxy group. Examples of the aralkyloxy group include $C_{7-18}$ aralkyloxy groups such as a benzyloxy group and a phenethyloxy group. Examples of the acyloxy group include $C_{1-12}$ acyloxy groups such as an acetyloxy group, a propionyloxy group, a (meth)acryloyloxy group, and a benzoyloxy group.

Examples of the alkylthio group include $C_{1-6}$ alkylthio groups (preferably $C_{1-4}$ alkylthio groups) such as a methylthio group and an ethylthio group. Examples of the alkenylthio group include $C_{2-6}$ alkenylthio groups (preferably $C_{2-4}$ alkenylthio groups) such as an allylthio group. Examples of the aryl thio group include $C_{6-14}$ arylthio groups optionally having a substituent such as a $C_{1-4}$ alkyl group, a $C_{2-4}$ alkenyl group, a halogen atom, or a $C_{1-4}$ alkoxy groups in an aromatic ring, such as a phenylthio group, a tolylthio group, a naphthylthio group. Examples of the aralkylthio group include $C_{7-18}$ aralkylthio groups such as a benzylthio group and a phenethylthio group. Examples of the alkoxycarbonyl group include $C_{1-6}$ alkoxy-carbonyl groups such as a methoxycarbonyl group, an ethoxycarbonyl group, a propoxycarbonyl group, and a butoxycarbonyl group. Examples of the aryloxycarbonyl group include $C_{6-14}$ aryloxy-carbonyl groups such as a phenoxycarbonyl group, a tolyloxycarbonyl group, and a naphthyloxycarbonyl group. Examples of the aralkyloxycarbonyl group include $C_{7-18}$ aralkyloxy-carbonyl groups such as a benzyloxycarbonyl group. Examples of the mono- or dialkylamino group include mono- or di-$C_{1-6}$ alkylamino groups such as a methylamino group, an ethylamino group, a dimethylamino group, and a diethylamino group. Examples of the acylamino group include $C_{1-11}$ acylamino groups, such as an acetylamino group, a propionylamino group, and a benzoylamino group. Examples of the epoxy-containing group include a glycidyl group, a glycidyloxy group, and 3,4-epoxycyclohexyl group. Examples of the oxetanyl-containing group include an ethyloxetanyloxy group. Examples of the acyl group include an acetyl group, a propionyl group, and a benzoyl group. Examples of the halogen atom include a chlorine atom, a bromine atom, and an iodine atom.

The above monovalent heterocyclic groups may each have a substituent. Examples of the substituent include the same as the substituent optionally attached to the above monovalent hydrocarbon group.

Specific examples of the monovalent hydrocarbon group and the monovalent hetrocyclic group include a methyl group, an ethyl group, a propyl group, an isopropyl group, a butyl group, a hexyl group, an octyl group, a decyl group, a phenyl group, a naphthyl group, an anthryl group, a benzyl group, a phenethyl group, a pyridyl group, a furyl group, a thienyl group, a vinyl group, an allyl group, a styryl group (e.g., p-styryl group), and substituted hydrocarbon groups (e.g., a 2-(3,4-epoxycyclohexyl)ethyl group, a 3-glycidylpropyl group, a 3-methacryloxypropyl group, a 3-acryloxypropyl group, an N-2-(aminoethyl)-3-aminopropyl group, a 3-aminopropyl group, an N-phenyl-3-aminopropyl group, a 3-mercaptopropyl group, and a 3-isocyanatepropyl group).

In addition, the component (E) may have, as a group bonded to the silicon atom, a hydroxy group and/or an alkoxy groups.

The form of component (E) may be a liquid or solid at 25° C. Preferred is a liquid.

The component (E) is preferably a polyorganosiloxysilalkylene represented by the following average unit formula:

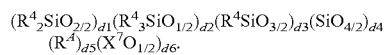

Each $R^4$ in the average unit formula is the same or different and is a hydrogen atom, a monovalent hydrocarbon group, or a monovalent hetrocyclic group. Specific examples include the above-mentioned monovalent hydrocarbon groups and monovalent hetrocyclic groups. Provided that a portion of $R^4$ is a group containing an aliphatic carbon-carbon unsaturated bond (preferably an alkenyl group having 2 to 8 carbon atoms, in particular, a vinyl group) and a ratio of the group is controlled to be a range of one or more in a molecule. For example, the percentage of the groups containing an aliphatic carbon-carbon unsaturated bond based on the total amount (100 mol %) of $R^4$ is preferably 0.1 to 40 mol %. When the percentage of the groups containing an aliphatic carbon-carbon unsaturated bond is adjusted to within the above range, the curable resin composition tends to have increased curing performance. In addition, preferable examples of $R^4$ other than the groups containing an aliphatic carbon-carbon unsaturated bond include alkyl groups having 1 to 10 carbon atoms (in particular, a methyl group) and aryl groups having 4 to 14 carbon atoms (in particular, a phenyl group).

In the above average unit formula, $R^A$ is a divalent hydrocarbon group as described above. Particularly preferred is an ethylene group.

In the above average unit formula, $X^7$ is a hydrogen atom or an alkyl group. Examples of the alkyl group include a methyl group, an ethyl group, a propyl group, a butyl group, a pentyl group, and a hexyl group. Particularly preferred is a methyl group.

In the above average unit formula, d1 is a positive number, d2 is a positive number, d3 is 0 or a positive number, d4 is 0 or a positive number, d5 is a positive number, and d6 is 0 or a positive number. Among them, d1 is preferably 1 to 200, d2 is preferably 1 to 200, d3 is preferably 1 to 10, d4 is preferably 0 to 5, and d5 is preferably 1 to 100. When (d3+d4) is a positive number, in particular, the component (E) has a branched-chain chain (a branched-chain main chain), so that the resulting cured product is tends have increased mechanical strength.

Specific examples of the component (E) include a polyorganosiloxysilalkylene having a structure represented by the following formula (IV-1):

[Chem. 27]

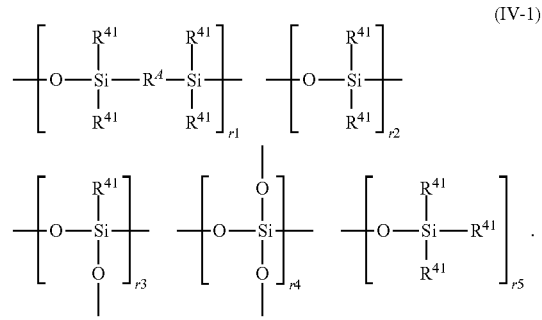

Each $R^{41}$ in the above formula (IV-1) is the same or different and is a hydrogen atom, a monovalent hydrocarbon group, or a monovalent hetrocyclic group. Specific examples of $R^{41}$ include the above-mentioned monovalent hydrocarbon groups and monovalent heterocyclic groups. Provided that at least one of $R^{41}$ is a group containing an aliphatic carbon-carbon unsaturated bond (preferably an alkenyl group having 2 to 8 carbon atoms, in particular, a vinyl group). In addition, preferable examples of $R^{41}$ other than the groups containing an aliphatic carbon-carbon unsaturated bond include alkyl groups having 1 to 10 carbon atoms (in particular, a methyl group) and aryl groups having 6 to 14 carbon atoms (in particular, a phenyl group).

$R^4$ in the above formula (IV-1) represents a divalent hydrocarbon group, as described above. In the group, a $C_{2-4}$ alkylene group (in particular, an ethylene group) is preferable. Note that when there are a plurality of $R^4$, they may be the same or different.

In the above formula (IV-1), r1 represents an integer of 1 or more (e.g., 1 to 100). Note that when the r1 is an integer of 2 or more, each structure in parenthese to which r1 is attached may be the same or different.

In the above formula (IV-1), r2 represents an integer of 0 or 1 or more (e.g., 0 to 400). Note that when the r2 is an integer of 2 or more, each structure in parenthese to which r2 is attached may be the same or different.

In the above formula (IV-1), r3 represents an integer of 0 or 1 or more (e.g., 0 to 50). Note that when the r3 is an integer of 2 or more, each structure in parenthese to which r3 is attached may be the same or different.

In the above formula (IV-1), r4 represents an integer of 0 or 1 or more (e.g., 0 to 50). Note that when the r4 is an integer of 2 or more, each structure in parenthese to which r4 is attached may be the same or different.

In the above formula (IV-1), r5 represents an integer of 0 or 1 or more (e.g., 0 to 50). Note that when the r5 is an integer of 2 or more, each structure in parenthese to which r5 is attached may be the same or different.

How to add each structure unit in the above formula (IV-1) may include a random-type addition or a block-type addition. Also, the arrangement order of each structure unit is not particularly limited.

Preferably, the component (E) is a branched-chain polyorganosiloxysilalkylene represented by the above formula (IV-1) wherein r1 represents an integer of 1 or more (e.g., 1 to 100), r2 represents an integer of 1 or more (e.g., 1 to 400), r3 represents an integer of 1 or more (e.g., 1 to 50), r4 is 0, and r5 represents an integer of 1 or more (e.g., 1 to 50).

In addition, as another preferable aspect, the component (E) is a straight-chain polyorganosiloxysilalkylene where r1 represents an integer of 1 or more (e.g., 1 to 100), r2 represents an integer of 1 or more (e.g., 1 to 400), r3 and r4 are 0, and r5 represents an integer of 1 or more (e.g., 1 to 50).

Examples of the terminal structure of the polyorganosiloxysilalkylene having a structure represented by formula (IV-1) include a silanol group, an alkoxysilyl group, and a trialkylsilyl group (e.g., a structure in parenthese to which r5 is attached, such as a trimethylsilyl group). Various groups such as an alkenyl group and a hydrosilyl group may be introduced to the ends of the above polyorganosiloxysilalkylene.

The weight-average molecular weight (Mw) of the component (E) is not particularly limited, and preferably not less than 500 and not more than 50000, more preferably not less than 700 and not more than 20000, and still more preferably not less than 1000 and not more than 10000. When the weight-average molecular weight is 500 or more, the resulting cured product tends to have further increased toughness. Also, when the weight-average molecular weight is 50000 or less, the compatibility with the other components tends to increase. Note that the weight-average molecular weight is calculated by using molecular weights determined by gel permeation chromatography (GPC) in terms of standard polystyrene.

The molecular weight distribution (Mw/Mn) of the component (E) is not particularly limited, and preferably not less than 1 and not more than 4 and more preferably 1 to 3.5. When the molecular weight distribution is 4 or less, the compatibility of the resulting cured product tends to increase more. Note that the molecular weight distribution may be calculated by using a weight-average molecular weight (Mw) and a number average molecular weight (Mn) as calculated by using molecular weights determined by gel permeation chromatography (GPC) in terms of standard polystyrene.

The viscosity at 25° C. of the component (E) is not particularly limited, and preferably 100 mPa·s or higher and more preferably 500 mPa·s or higher. When the viscosity is 100 mPa·s or higher, the curable resin composition tends to be prepared and handled easily. Meanwhile, the upper limit of the viscosity is not particularly limited, and preferably 50000 mPa·s and more preferably 10000 mPa·s. When the viscosity is 50000 mPa·s or less, the compatibility tends to increase. Note that the viscosity at 25° C. may be measured by using substantially the same conditions as for the component (A).

The component (E) may be produced by a known and conventional process. Examples of the production process include the process described in JP2012-140617A, including making a hydrosilylation reaction of a polyorganosiloxane containing a group containing an aliphatic carbon-carbon unsaturated bond with a polyorganosiloxane containing a SiH group. The polyorganosiloxane containing a group containing an aliphatic carbon-carbon unsaturated bond and a polyorganosiloxane containing a SiH group as ingredients can be produced by known and conventional polyorganosiloxane production processes. They can be produced, without any particular limitation, by a process comprising: subjecting one or two or more different hydrolysable silane compounds to hydrolysis and condensation in the same manner as the production process of the above-described component (A). Alternatively, they may be commercially available products.

In addition, products containing the component (E) such as trade name "ETERLED GS5145", "ETERLED GS5135", and "ETERLED GS5120" (all manufactured by Eternal Materials Co., Ltd.) are available.

Note that in the present curable resin composition, the components (E) may be used singly or in combinations of two or more.

When two or more components (E) are used in combination, the d1 to d6, r1 to r5, etc., may each be an average as calculated in accordance with the blending ratio between the respective components (E).

Note that the component (E) has only to have a group containing one or more aliphatic carbon-carbon unsaturated bonds in a molecule and optionally further includes a hydrosilyl group.

When the curable resin composition of the present invention contains the component (E), the content (amount blended) thereof is not particularly limited and preferably 1 to 50 wt %, more preferably 1 to 40 wt %, and still more preferably 5 to 30 wt %, based on the total amount (100 wt %) of the curable resin composition. When the content is 1 wt % or more, the resulting cured product tends to have further increased toughness and transparency.

The content (amount blended) of the component (E) to the component (A) in the curable resin composition of the present invention is not particularly limited and, based on 100 parts by weight of the component (A), preferably 1 to 200 parts by weight, more preferably 5 to 100 parts by weight, and still more preferably 10 to 50 parts by weight. When the content is 1 part by weight or more, the resulting cured product tends to have further increased toughness and transparency.

[Component (F)]

The curable resin composition of the present invention may comprise at least one zinc compound (sometimes simply referred to as a "component (F)") selected from the group consisting of zinc carboxylates and zinc-β-diketone complexes. When the curable resin composition of the present invention contains the component (F), in particular, the barrier properties against corrosive gas such as $H_2S$ gas tends to increase. Note that the components (F) may be used singly or in combinations of two or more.

Examples of the zinc carboxylates of the component (F) include zinc naphthenate, zinc octylate, zinc (meth)acrylate, and zinc neodecanate. Preferred are zinc naphthenate and zinc octylate. More preferred is zinc octylate.

The zinc-β-diketone complexes of the component (F) are preferably zinc-β-diketone complexes represented by the following formula (1):

[Zn(L1)(L2)]                                                    (1)

wherein L1 and L2 are the same or different and are each an anion or enolate anion of a β-diketone or β-ketoester represented by the following formula (1a):

$R^{31}COCHR^{32}COR^{33}$                                      (1a).

In the formula (1a), $R^{31}$ represents a substituted or unsubstituted $C_{1-30}$ alkyl group. The $C_{1-30}$ alkyl group is preferably a $C_{1-20}$ alkyl group, more preferably a $C_{2-15}$ alkyl group, still more preferably a $C_{3-10}$ alkyl group, and particularly preferably a branched-chain $C_{3-10}$ alkyl group. Examples of the branched-chain $C_{3-10}$ alkyl group include an isopropyl group, an isobutyl group, a t-butyl group, a s-butyl group, an isopentyl group, a t-pentyl group, an isohexyl group, a t-hexyl group, an isoheptyl group, a t-heptyl group, an isooctyl group, a t-octyl group, a 2-ethylhexyl group, an isononyl group, and an isodecyl group. Among them, most preferred are isopropyl, isobutyl, t-butyl, s-butyl, isopentyl, and t-pentyl groups. Examples of the substituent include a halogen atom, a hydroxy group, and a carboxy group.

In the formula (1a), $R^{32}$ represents a hydrogen atom or a substituted or unsubstituted $C_{1-30}$ alkyl group. As the $C_{1-30}$ alkyl group, preferred are the groups listed for $R^{31}$. Here, the most preferred $R^{32}$ is a hydrogen atom. The above substituent is the same as listed for $R^{31}$.

In the formula (1a), $R^{33}$ represents a substituted or unsubstituted $C_{1-30}$ alkyl group, a substituted or unsubstituted aromatic heterocyclic group, or a —$OR^{34}$ group. $R^{34}$ represents a substituted or unsubstituted $C_{1-30}$ alkyl group. As the $C_{1-30}$ alkyl group, preferred are the same groups as listed for $R^{31}$. Examples of the aromatic heterocyclic group include a pyridyl group, a pyrimidinyl group, a pyrazolyl group, a pyridazinyl group, a pyrazinyl group, a triazinyl group, a furanyl group, a thienyl group, an indolyl group, an oxazolyl group, a thiazolyl group, or an imidazolyl group. The above substituent is the same as listed for $R^{31}$. $R^{31}$ and $R^{32}$ may be bonded together to form a ring and $R^{32}$ and $R^{33}$ may be bonded together to form a ring.

Note that the anion and the enolate anion of the β-diketone or β-ketoester represented by the following formula (1a) has structures represented by formula (1a') and formula (1a"), respectively. In the formulas (1a') and (1a"), $R^{31}$, $R^{32}$, and $R^{33}$ are the same as above.

[Chem. 28]

(1a')

and

[Chem. 29]

(1a")

Among them, the zinc-β-diketone complex is preferably a compound represented by the following formula (1'):

[Chem. 30]

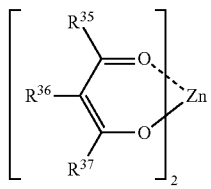

(1')

wherein $R^{35}$ represents a substituted or unsubstituted $C_{1-30}$ alkyl group; $R^{36}$ represents a hydrogen atom or a substituted or unsubstituted $C_{1-30}$ alkyl group; $R^{37}$ represents a substituted or unsubstituted $C_{1-30}$ alkyl group, a substituted or unsubstituted aromatic heterocyclic group, or a —$OR^{38}$ group, $R^{38}$ represents a substituted or unsubstituted $C_{1-30}$ alkyl group; and $R^{35}$ and $R^{36}$ may be bonded together to form a ring and $R^{36}$ and $R^{37}$ may be bonded together to form a ring.

The $C_{1-30}$ alkyl groups of the substituted or unsubstituted $C_{1-30}$ alkyl groups of $R^{35}$, $R^{36}$, $R^{37}$, and $R^{38}$ are preferably each group listed for $R^{31}$. The above aromatic heterocyclic group is each group as listed for $R^{33}$. The above substituent is each group listed for $R^{31}$.

Particularly preferable examples of the zinc-β-diketone complexes include zinc bisacetylacetonate, bis(octane-2,4-dionate)zinc, zinc bis(2,2,7-trimethyl-3,5-octanedionate, and zinc bisdipivaloylmethane.

In the curable resin composition of the present invention, the zinc carboxylates may be used singly or in combinations of two or more. In addition, the zinc-β-diketone complexes may be used singly or in combinations of two or more. Further, at least one of the zinc carboxylates and at least one of the zinc-β-diketone complexes way be used in combination.

Note that the zinc carboxylates or the zinc-β-diketone complexes may be commercially available products.

The component (F), from the viewpoint of barrier properties against corrosive gas, the content of zinc based on the total amount (100 wt %) of the component (F) is not particularly limited and, for example, is preferably 2 to 30 wt %, more preferably 4 to 25 wt %, and still more preferably 6 to 20 wt %.

When the curable resin composition of the present invention contains the component (F), the content thereof is not particularly limited and not less than 0.0.1 parts by weight and less than 1 part by weight, preferably not less than 0.03 parts by weight and less than 0.8 parts by weight, and more preferably not less than 0.05 parts by weight and less than 0.6 parts by weight, based on the total, amount (100 parts by weight) of the components (A) and (B). When the content of the component (F) is less than 0.01 parts by weight, the barrier properties against $H_2S$ gas tend to deteriorate. When the content of the component (F) is 0.1 parts by weight or more, the barrier properties against $SO_x$ gas tend to deteriorate. If the content of the component (F) is within the above ranges, the $H_2S$ corrosion resistance and the $SO_x$ corrosion resistance are excellent. When zinc octylate (in particular, zinc octylate, the zinc content of which is 2 to 30 wt %), as the component (F), is used in the above range, a cured product excellent in $SO_x$ corrosion resistance and markedly superior in $H_2S$ corrosion resistance can be obtained.

When the curable resin composition of the present invention contains the component (F), the content thereof is not particularly limited and preferably 0.01 to 1 wt % and more preferably 0.05 to 0.5 wt %, based on the total amount (100 wt %) of the curable resin composition.

[Component (G)]

The curable resin composition of the present invention may comprise a ladder-type polyorganosilsesquioxane having one or more alkenyl groups and one or more aryl groups in a molecule (sometimes referred to as "component (G)"). When the curable resin composition of the present invention contains the component (G), barrier properties against sulfur (in particular, barrier properties against $SO_x$), flexibility and heat shock resistance tend to increase. As the component (G), a polyorganosilsesquioxane having one or more (preferably 2 or more) alkenyl groups and one or more (preferably 2 to 50) aryl groups in a molecule, with a ladder-structured —Si—O—Si— skeleton, may be used without any particular limitation.

Examples of the alkenyl group and the aryl group, which is contained in the molecule of component (G), include the same examples of the alkenyl group and the aryl group, which are contained in the molecule of component (A), as described above. The alkenyl group and the aryl group contained in the component (G) are not particularly limited, and a group bonded to a silicon atom is preferred.

Examples of the group bonded to a silicon atom other than the alkenyl group and the aryl group, which are contained in the molecule of component (G) are not particularly limited, and include a hydrogen atom and an organic group. Examples of the organic group include the substituted or unsubstituted monovalent hydrocarbon groups described above. Note that "a group bonded to a silicon atom" in the present specification usually means a group containing no silicon atom. Among them, preferred is an alkyl group (in particular, a methyl group).

Further, the component (G) may have a hydroxy group or an alkoxy group, as the group bonded to a silicon atom.

The percentage of the alkenyl group in the entire component (G) (100 wt %) is not particularly limited as long as the percentage is controlled to be a range of one or more in a molecule, and for example, 2.0 to 10.0 wt %, and preferably 3.0 to 5.0 wt %. The percentage of the aryl group is not particularly limited as long as the percentage is controlled to be a range of one or more in a molecule, and for example, 10.0 to 30.0 wt %, and preferably 10.0 to 20.0 wt %. The percentage of the alkyl group is not particularly limited, and is for example, 20.0 to 35.0 wt % and preferably 20.0 to 30.0 wt %. Note that the percentage (mol %) of the alkenyl group, the aryl group or the alkyl group can be calculated, for example, based on the measurement of an NMR spectroscopy (for example, $^1$H-NMR spectroscopy).

Examples of a particularly preferable aspect of the component (G) include a ladder-type polyorganosilsesquioxane (a) and a ladder-type polyorganosilsesquioxane (b) described below. The component (G), however, is not limited to the following ladder-type polyorganosilsesquioxanes.

Ladder-type polyorganosilsesquioxane (a): a ladder-type polyorganosilsesquioxane having two or more alkenyl groups and one or more aryl groups.

Ladder-type polyorganosilsesquioxane (b): a ladder-type polyorganosilsesquioxane having a polyorganosilsesquioxane residue (sometimes referred to as "polyorganosilsesquioxane residue (a)") containing a structural unit (T-unit) represented by a formula (V-3-1) and a structural unit (M-unit) represented by a formula (V-3-2) in some or all of the molecular chain ends of a polyorganosilsesquioxane having a ladder structure.

[Chem. 31]

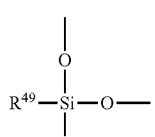

(V-3-1)

[Chem. 32]

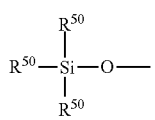

(V-3-2)

Ladder-type polyorganosilsesquioxane (a)

The ladder-type polyorganosilsesquioxane (a) has a ladder structure, which is confirmed by an FT-IR spectrum having intrinsic absorption peaks in the vicinity of 1050 $cm^{-1}$ (for example, 1000 to 1100 $cm^{-1}$) and in the vicinity of 1150 $cm^{-1}$ (for example, more than 1100 $cm^{-1}$) and not more than 1200 $cm^{-1}$), respectively (in other words, having at least two absorption peaks in 1000 to 1200 $cm^{-1}$) (Reference literature: R. H. Raney, M. Itoh, A. Sakakibara and T. Suzuki, Chem. Rev. 95, 1409(1995)). Note that the FT-IR spectrum can be measured by the following device under the following conditions.

Measurement device: trade name "FT-720" (manufactured by Horiba, Ltd.)

Measurement method: transmission method

Resolution: 4 $cm^{-1}$

Measurement wavenumber range: 480 to 4000 $cm^{-1}$

Cumulative number: 16

The ladder-type polyorganosilsesquioxane (a), however, may have another silsesquioxane structure such as a cage structure and a random structure in addition to the ladder structure.

The 5% weight-reduction temperature ($T_{d5}$) under nitrogen atmosphere of the ladder-type polyorganosilsesquioxane (a) is not particularly limited, and is preferably 150° C. or more, more preferably 240° C. or more, still more preferably 260° C. to 500° C., particularly preferably 262° C. or more, and most preferably 265° C. of more. When the 5% weight-reduction temperature is less than 150° C. (in particular, less than 240° C.), the heat resistance required may not be achieved depending on the use. Note that the 5% weight-reduction temperature is a temperature at which the weight before heating is reduced by 5% during heating at a constant temperature rising rate, providing an indication of heat resistance. The 5% weight-reduction temperature can be measured by thermogravimetric analysis (TGA) under conditions of nitrogen atmosphere and a temperature rising rate of 20° C./min.

The ladder-type polyorganosilsesquioxane (a) is not particularly limited, and is preferably liquid at room temperature (25° C.). Specifically, the viscosity thereof at 25° C. is not particularly limited, and is preferably 30000 mPa·s or less (for example, 1 to 30000 mPa·s), more preferably 25000 mPa·s or less, and still more preferably 10000 mPa·s. The viscosity can be measured by a viscometer (trade name "MCR-301" manufactured by Anton Paar, Inc.) under conditions with an oscillation angle of 5% and a frequency of 0.1 to 100 (1/s) at a temperature of 25° C.

Examples of the ladder-type polyorganosilsesquioxane (a) include a ladder-type polyorganosilsesquioxane represented by the following formula (V-2):

[Chem. 33]

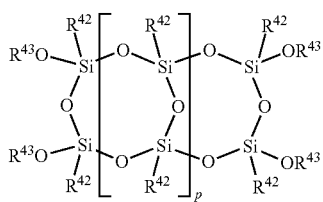

(V-2)

In the formula (V-2), each $R^{42}$ is the same or different and represents a hydrogen atom or a substituted or unsubstituted monovalent hydrocarbon group. Specific examples of $R^{42}$ include the substituted or unsubstituted monovalent hydrocarbon group (including an alkenyl group and an aryl group).

Preferably, the ladder-type polyorganosilsesquioxane (a) has an aryl group as $R^{42}$ other than the alkenyl group in the formula (V-2), and may further has an alkyl group (preferably a methyl group).

The percentage (total content) of the aryl group, the alkenyl group and the alkyl group is not particularly limited, and is preferably 50 to 100 wt %, more preferably 70 to 100 wt % and still more preferably 80 to 100 wt %, based on the total amount (100 wt %) of $R^{42}$ in the formula (V-2) of the ladder-type polyorganosilsesquioxane (a).

The percentage (content) of the aryl group (preferably a phenyl group) is not particularly limited, and is preferably 30 to 90 mol %, more preferably 40 to 80 mol % and still more preferably 50 to 70 mol %, based on the total amount (100 mol %) of $R^{42}$ in the formula (V-2) of the ladder-type polyorganosilsesquioxane (a). The percentage (content) of the alkenyl group is not particularly limited, and is preferably 5 to 30 mol %, more preferably 10 to 25 mol % and still more preferably 15 to 20 mol %, based on the total amount (100 wt %) of $R^{42}$ in the formula (V-2) of the ladder-type polyorganosilsesquioxane (a). The percentage (content) of the alkyl group is not particularly limited, and is preferably 0 to 90 mol %, more preferably 1 to 80 mol % and still more preferably 5 to 70 mol %, based on the total amount (100 mol %) of $R^{42}$ in the formula (V-2) of the ladder-type polyorganosilsesquioxane (a).

The composition of $R^{42}$ in the formula (V-2) of the ladder-type polyorganosilsesquioxane (a) (for example, the percentages of the aryl group, the alkenyl group and the alkyl group) can be calculated, for example, by measurement of the NMR spectroscopy (for example, $^1$H-NMR spectroscopy).

In the formula (V-2), each $R^{43}$ is a group bonded to a molecular chain end of the ladder structure (hereinafter, also referred to as "terminal group"), which is the same or different and represents a hydrogen atom, an alkyl group, a monovalent group represented by the following formula (V-2-1), a monovalent group represented by the following formula (V-2-2), or a monovalent group represented by the following formula (V-2-3):

[Chem. 34]

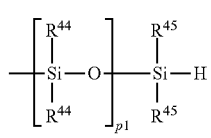

(V-2-1)

[Chem. 35]

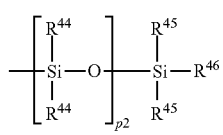

(V-2-2)

[Chem. 36]

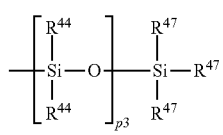

(V-2-3)

In the formula (V-2-1), each $R^{44}$ is the same or different and represents a hydrogen atom or a substituted or unsubstituted monovalent hydrocarbon group. Specific examples of $R^{44}$ include the substituted or unsubstituted monovalent hydrocarbon group (including an alkenyl group). Among them, preferred is an alkyl group. In the formula (V-2-1), each $R^{45}$ is the same or different and represents a substituted or unsubstituted monovalent hydrocarbon group. Specific examples of $R^{45}$ include the substituted or unsubstituted monovalent hydrocarbon group (including an alkenyl group). Among them, preferred is an alkyl group. In the formula (V-2-1), p1 represents an integer of 0 or more. As p1, an integer of 0 to 5 is preferred, an integer of 0 to 3 is more preferred, and an integer of 0 is still more preferred.

In the formula (V-2-2), each $R^{44}$ is the same or different and represents a hydrogen atom or a substituted or unsubstituted monovalent hydrocarbon group as in the formula (V-2-1). Among them, $R^{44}$ is preferably an alkyl group. In the formula (V-2-2), each $R^{45}$ is the same or different and represents a substituted or unsubstituted monovalent hydrocarbon group as in the formula (V-2-1). Among them, $R^{46}$ is preferably an alkyl group. In the formula (V-2-2), $R^{46}$ is an alkenyl group. Among them, preferred is a vinyl group. In the formula (V-2-2), p2 represents an integer of 0 or more. As p2, an integer of 0 to 5 is preferred, an integer of 0 to 3 is more preferred, and 0 is still more preferred.

In the formula (V-2-3), each $R^{44}$ is the same or different and represents a hydrogen atom or a substituted or unsubstituted monovalent hydrocarbon group as in the formula (V-2-1). Among them, $R^{44}$ is preferably an alkyl group. In the formula (V-2-3), each $R^{47}$ is the same or different and represents a monovalent saturated aliphatic hydrocarbon group such as an alkyl group and a cycloalkyl group. Among them, preferred is an alkyl group (in particular, methyl group). In the formula (V-2-3), p3 represents an integer of 0 or more. As p3, an integer of 0 to 5 is preferred, an integer of 0 to 3 is more preferred, and 0 is still more preferred.

In the formula (V-2), p represents an integer of 0 or more. p is usually an even number of 0 or more (for example, an even number of 2 or more). In particular, it is preferred that the ladder-type polyorganosilsesquioxane (a) contains a compound having p of 1 or more (in particular, 2 or more) as an essential component.

The ladder-type polyorganosilsesquioxane (a) contains two or more alkenyl groups in a molecule. As the alkenyl group which the ladder-type polyorganosilsesquioxane (a) has, a vinyl group is particularly preferred. Examples of the ladder-type polyorganosilsesquioxane (a) represented by the formula (V-2) include ones having any one of $R^{42}$ in the formula (V-2) representing an alkenyl group, ones having a monovalent group represented by the formula (V-2-1) with any one of $R^{44}$ and $R^{45}$ representing an alkenyl group, ones having a monovalent group represented by the formula (V-2-2), and ones having a monovalent group represented by the formula (V-2-3) with any one of $R^{44}$ representing an alkenyl group.

The ladder-type polyorganosilsesquioxane (a) may be produced by a well-known conventional process. Examples of the production process include, but are not particularly limited to the methods disclosed in the literature such as Japanese Patent Laid-Open No. 4-28722, Japanese Patent Laid-Open No. 2010-518182, Japanese Patent Laid-Open No. 5-39357, Japanese Patent Laid-open No. 2004-99872, International Publication No. WO1997/007156, Japanese Patent Laid-Open No. 11-246662, Japanese Patent Laid-Open No. 9-20826, International Publication No. WO2006/033147, Japanese Patent Laid-Open No. 2005-239829, and International Publication No. WO2013/176238.

Ladder-Type Polyorganosilsesquioxane (b)

A polyorganosilsesquioxane having a ladder structure in the ladder-type polyorganosilsesquioxane (b) is represented, for example, by the following formula (V-3).

[Chem. 37]

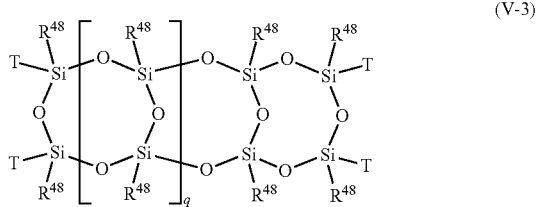

(V-3)

In the formula (V-3), q represents an integer of 1 or more (for example, 1 to 5000), preferably an integer of 1 to 2000, and more preferably an integer of 1 to 1000. In the formula (V-3), each $R^{48}$ is the same or different and represents a hydrogen atom or a substituted or unsubstituted monovalent hydrocarbon group. T represents a terminal group.

The group directly bonded to the silicon atom in the polyorganosilsesquioxane in the ladder-type polyorganosilsesquioxane (b) (for example, $R^{48}$ in the formula (V-3)) is not particularly limited. The percentage of the substituted or unsubstituted monovalent hydrocarbon group is preferably 50 mol % or more, more preferably 80 mol % or more, and still more preferably 90 mol % or more, based on the total amount (100 mol %) of the group. In particular, the total amount of a substituted or unsubstituted $C_{1-10}$ alkyl group (in particular, a $C_{1-4}$ alkyl group such as a methyl group and an ethyl group), a substituted or unsubstituted $C_{6-10}$ aryl group (in particular, a phenyl group) and a substituted or unsubstituted $C_{7-10}$ aralkyl group (in particular, a benzyl group) is preferably 50 mol % or more, more preferably 80 mol % or more, and still more preferably 90 mol % or more, based on the total amount (100 mol %) of the group.

The ladder-type polyorganosilsesquioxane (b) has a polyorganosilsesquioxane residue (a) in some or all of the molecular chain ends of a polyorganosilsesquioxane having the ladder structure. When the polyorganosilsesquioxane is represented by the formula (V-3), the ladder-type polyorganosilsesquioxane (b) has some or all of T in the formula (V-3) substituted with the polyorganosilsesquioxane residue (a).

The polyorganosilsesquioxane residue (a) contains at least a structural unit represented by the formula (V-3-1) and a structural unit represented by the formula (V-3-2), as described above.

In the formula (V-3-1), $R^{49}$ represents an alkenyl group. Specific examples of the alkenyl group include the ones described above. Among them, preferred is a $C_{2-10}$ alkenyl group, more preferred is a $C_{2-4}$ alkenyl group, and still more preferred is a vinyl group.

In the formula (V-3-2), each $R^{50}$ is the same or different and represents a substituted or unsubstituted monovalent hydrocarbon group. Examples of the substituted or unsubstituted hydrocarbon group include the substituted or unsubstituted monovalent hydrocarbon group (including an alkenyl group) described above. Among them, $R^{50}$ is preferably an alkyl group, more preferably a $C_{1-20}$ alkyl group, still more preferably a $C_{1-10}$ alkyl group, particularly preferably a $C_{1-4}$ alkyl group, and most preferably a methyl group. In particular, it is preferred that all of $R^{50}$ in the formula (V-3-2) be a methyl group.

The polyorganosilsesquioxane residue (a) may have a structural unit represented, for example, by the following formula (V-3-1'), other than the structural unit represented by the formula (V-3-1) and a structural unit represented by the formula (V-3-2).

[Chem. 38]

(V-3-1')

In the formula (V-3-1'), each $R^{49'}$ represents a monovalent group other than an alkenyl group. Specific examples thereof include a hydrogen atom, a halogen atom, a monovalent organic group other than an alkenyl group, a monovalent oxygen atom-containing group, a monovalent nitrogen atom-containing group, and a monovalent sulfur atom-containing group.

The amount of the silicon atom to which three oxygen atoms are bonded represented in the formula (V-3-1) In the polyorganosilsesquioxane residue (a) is not particularly limited, and is preferably 20 to 80 mol %, and more preferably 25 to 60 mol %, based on the total amount (100 mol %) of the silicon atoms constituting the polyorganosilsesquioxane residue (a). When the content is less than 20 mol %, the amount of the alkenyl group in the ladder-type polyorganosilsesquioxane (b) is insufficient, so that the cured product may have insufficient hardness. Meanwhile, when the content is more than 80 mol %, many silanol groups and hydrolyzable silyl groups remain in the ladder-type polyorganosilsesquioxane (b), so that the ladder-type polyorganosilsesquioxane (b) may not be obtained in a liquid state. Further, a condensation reaction proceeds in a product to cause a change of the molecular weight, so that storage stability may be worsened.

The amount of the silicon atom to which three oxygen atoms are bonded represented in the formula (V-3-2) in the polyorganosilsesquioxane residue (a) is not particularly limited, and is preferably 20 to 85 mol %, and more preferably 30 to 75 mol %, based on the total amount (100 mol %) of the silicon atoms constituting the polyorganosilsesquioxane residue (a). When the content is less than 20 mol %, a silanol group and a hydrolizable silyl group tend to remain in the ladder-type polyorganosilsesquioxane (b), so that the ladder-type polyorganosilsesquioxane (b) may not be obtained in a liquid state. Further, a condensation reaction proceeds in a product to cause a change of the molecular weight, so that storage stability may be worsened. Meanwhile, when the content is more than 85 mol %, the amount of the alkenyl group in the ladder-type polyorganosilsesquioxane (b) is insufficient, so that the cured product may have insufficient hardness.

Examples of the Si—O—Si structure (skeleton) contained in the ladder-type polyorganosilsesquioxane residue (a) are not particularly limited, and include a ladder structure, a cage structure and a random structure.

The ladder-type polyorganosilsesquioxane (b) can be represented by the following formula (V-3'). Examples of q and $R^{48}$ in the formula (V-3') include the same ones as in the formula (V-3). In the formula (V-3'), A represents a polyorganosilsesquioxane residue (a), a hydroxy group, a halogen group, an alkoxy group, or an acyloxy group, and some or all of A are each the polyorganosilsesquioxane residue (a). The four A may be the same or different from each other. When a plurality (2 to 4) of A in the formula (V-3') are each the polyorganosilsesquioxane residue (a), the each A may be bonded to each other or to A contained in a molecule represented by another formula (V-3') through one or more Si—O—Si bonds.

[Chem. 39]

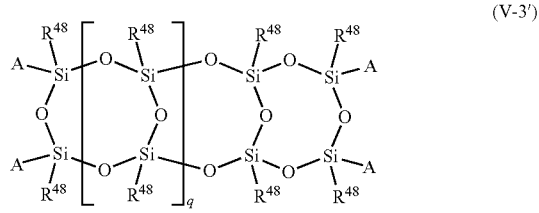

(V-3')

In the ladder-type polyorganosilsesquioxane (b), the number of the alkenyl group in a molecule is not particularly limited, and may be two or more, preferably 2 to 50, and more preferably 2 to 30. Having the alkenyl groups in the above range, a cured product excellent in various physical properties such as heat resistance, the crack resistance and the barrier properties against sulfur compounds tends to be easily obtained. Note that the number of the alkenyl group can be calculated, for example, by $^1$H-NMR spectroscopy.

The content of the alkenyl group in the ladder-type polyorganosilsesquioxane (b) is not particularly limited, and is preferably 0.7 and 5.5 mmol/g, and more preferably 1.1 to 4.4 mmol/g. Further, the percentage (weight basis) of the alkenyl group contained in the ladder-type polyorganosilsesquioxane (b) is not particularly limited, and is preferably 2.0 to 15.0 wt %, and more preferably 3.0 to 12.0 wt % in terms of a vinyl group.

In the ladder-type polyorganosilsesquioxane (b), the number of the aryl group in a molecule is not particularly limited, and may be one or more, preferably 2 to 50, and more preferably 2 to 30. Having the aryl groups in the above range, a cured product excellent in various physical properties such as heat resistance, the crack resistance and the barrier properties against sulfur compounds tends to be easily obtained. Note that the number of the aryl group can be calculated, for example, by $^1$H-NMR spectroscopy.

The content of the aryl group in the ladder-type polyorganosilsesquioxane (b) is not particularly limited, and is preferably 0.7 to 5.5 mmol/g, and more preferably 1.1 to 4.4 mmol/g. Further, the percentage (weight basis) of the aryl group contained in the ladder-type polyorganosilsesquioxane (b) is not particularly limited, and is preferably 2.0 to 15.0 wt %, and more preferably 3.0 to 12.0 wt % in terms of a vinyl group.

The weight-average molecular weight (Mw) of the ladder-type polyorganosilsesquioxane (a) and the ladder-type polyorganosilsesquioxane (b) is not particularly limited, and is preferably 100 to 800000, more preferably 200 to 100000, still more preferably 300 to 10000, particularly preferably 500 to 8000, and most preferably 1700 to 7000. When the Mw is less than 100, the cured product may have reduced heat resistance. Meanwhile, when the Mw is more than 800000, the compatibility with other components may be reduced. Note that the Mw can be calculated from the molecular weights determined by gel permeation chromatography in terms of standard polystyrene.

The number-average molecular weight (Mn) of the ladder-type polyorganosilsesquioxane (a) and the ladder-type polyorganosilsesquioxane (b) is not particularly limited, and is preferably 80 to 800000, more preferably 150 to 100000, still more preferably 250 to 10000, particularly preferably 400 to 8000, and most preferably 1500 to 7000. When the Mn is less than 80, the cured product may have reduced heat resistance. Meanwhile, when the Mn is more than 800000, the compatibility with other components may be reduced. Note that the Mn can be calculated from the molecular weights determined by gel permeation chromatography in terms of standard polystyrene.

The degree of dispersion of molecular weight (Mw/Mn) in terms of standard polystyrene determined by gel permeation chromatography of the ladder-type polyorganosilsesquioxane (a) and the ladder-type polyorganosilsesquioxane (b) is not particularly limited, and is preferably 1.00 to 1.40, more preferably 1.35 or less (for example, 1.05 to 1.35), still more preferably 1.30 or less (for example, 1.10 to 1.30). When the degree of dispersion of molecular weight is more than 1.40, for example, a low molecular weight siloxane increases, so that the cured product tends to have reduced attachment and reduced barrier properties against sulfur.

Meanwhile, when the degree of dispersion of molecular weight is 1.05 or more, the curable resin composition easily becomes liquid, (in a liquid form) at room temperature, so that increased handling may be achieved.

Note that the number average molecular weight and the degree of dispersion of molecular weight of the ladder-type polyorganosilsesquioxane (a) and the ladder-type polyorganosilsesquioxane (b) can be measured by the following devices under the following conditions:

Alliance HPLC System 2695 (manufactured by Waters);
Refractive Index Detector 2414 (manufactured by Waters);
Column: Tskgel $GMH_{HR}$-M×2 (manufactured by Tosoh Corporation);
Guard column: Tskgel guard, column $H_{HR}L$ (manufactured by Tosoh Corporation);
Column oven: COLUMN HEATER U-620 (manufactured by Sugai);
Solvent: THF;
Measurement Temperature: 40° C.;
Molecular weight: in terms of standard polystyrene.

Preferably, the ladder-type polyorganosilsesquioxane (b) is a liquid at normal temperature (about 25° C.). More specifically, the viscosity at 23° C. is preferably 100 to 100000 mPa·s, more preferably 500 to 10000 mPa·s, and still more preferably 1000 to 8000 mPa·s. When the viscosity is less than 100 mPa·s, the heat resistance of the cured product may be reduced. Meanwhile, when the viscosity is more than 100000 mPa·s, preparation and handling of the curable resin composition may be difficult. Note that the viscosity at 23° C. can be measured under conditions at a temperature of 23° C. and a rotation number of 8 rpm by using a rheometer (trade name "Physica DDS-200" manufactured by Anton Paar, Inc.) and a cone plate (with a cone diameter of 16 mm and a taper angle of 0° C.).

Examples of the process for producing the ladder-type polyorganosilsesquioxane (b) is not particularly limited, and include a method for forming the ladder-type polyorganosilsesquioxane residue (a) at the molecular chain ends of a polyorganosilsesquioxane having a ladder structure with a silanol group and/or a hydrolyzable silyl group (any one or both of a silanol group and a hydrolysable silyl group) at the molecular chain ends. Specifically, the ladder-type polyorganosilsesquioxane (b) can be produced by the method disclosed in literature such as International Publication No. WO2013/176238.

The component (G) in the curable resin composition of the present invention may be used singly or may be used in combination of two or more.

From the viewpoints of the barrier properties against sulfur, the strength, (resin strength), the flexibility and the heat shock resistance, the curable resin composition of the present invention preferably contains the component (G), more preferably contains the ladder-type polyorganosilsesquioxane (a) and the ladder-type polyorganosilsesquioxane (b).

When the curable resin composition of the present invention contains the component (G), the content (amount blended) of the component (G) in the curable resin composition is not particularly limited, and is preferably 0.05 to 50 parts by weight, more preferably 0.1 to 45 parts by weight, and still more preferably 0.2 to 40 parts by weight, based on a total amount of the component (A) and the component (B) of 100 parts by weight. Further, the content (amount blended) of the component (G) is not particularly limited, and is preferably 0.01 to 20 wt %, more preferably 0.05 to 15 wt %, and still more preferably 0.1 to 10 wt %, based on the curable resin composition (100 wt %). When the content of the component (G) is controlled to within the above ranges, the resulting cured product tends to have markedly increased barrier properties against sulfur, flexibility and heat shock resistance.

[Isocyanurate Compound (H)]

The curable resin composition of the present invention may further comprise an isocyanurate compound represented by the following formula (2) (sometimes simply referred to as "isocyanurate compound (H)"). When the curable resin composition of the present invention comprises the isocyanurate compound (H), the cured product tends to have more improved adhesion to an adherend and have further increased barrier properties against corrosion gas.

[Chem. 40]

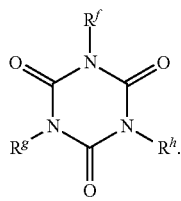

(2)

In the formula (2), $R^f$, $R^g$, and $R^h$ are the same or different and each represent a group represented by formula (2a) or a group represented by formula (2b), provided that at least one of $R^f$, $R^g$, and $R^h$ is a group represented by formula (2b):

[Chem. 41]

(2a)

[Chem. 42]

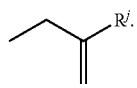

(2b)

In the formula (2a), $R^i$ represents a hydrogen atom, or a straight-chain, or branched-chain $C_{1-8}$ alkyl group. Examples of the straight-chain or branched-chain $C_{1-8}$ alkyl group include a methyl group, an ethyl group, a propyl group, an isopropyl group, a butyl group, an isobutyl group, an s-butyl group, a pentyl group, a hexyl group, a heptyl group, an octyl group, and an ethylhexyl group. Among the alkyl groups, preferred are liner or branched-chain $C_{1-3}$ alkyl groups such as a methyl group, an ethyl group, a propyl group, and an isopropyl group. Among them, $R^i$ is particularly preferably a hydrogen atom.

Note that when two of $R^f$, $R^g$, and $R^h$ in the formula (2) are groups represented by the formula (2a), the groups represented by the formula (2a) may be the same or different. In addition, the isocyanurate compound (H) may not have a group represented by the formula (2a).

In the formula (2b), $R^j$ represents a hydrogen atom, or a straight-chain or branched-chain $C_{1-8}$ alkyl group. Examples of the straight-chain or branched-chain $C_{1-8}$ alkyl group include a methyl group, an ethyl group, a propyl group, an isopropyl group, a butyl group, an isobutyl group, an s-butyl group, a pentyl group, a hexyl group, a heptyl group, an octyl group, and an ethylhexyl group. Among the alkyl groups, preferred are liner or branched-chain $C_{1-3}$ alkyl groups such as a methyl group, an ethyl group, a propyl group, and an isopropyl group. Among them, $R^j$ is particularly preferably a hydrogen atom.

Note that when two or three of $R^f$, $R^g$, and $R^h$ in the formula (2) are groups represented by the formula (2b), the groups represented by the formula (2b) may be the same or different.

Examples of the isocyanurate compound (H) include: compounds represented by the formula (2) where one of $R^f$, $R^g$, and $R^h$ is an groups represented by the formula (2b) (sometimes referred to as "monoallyl diglycidyl isocyanurate compounds"); compounds represented by the formula (2) where two of $R^f$, $R^g$, and $R^h$ of the formula (2) are groups represented by the formula (2b) (sometimes referred to as "diallyl monoglycidyl isocyanurate compounds"); and compounds represented by the formula (2) where all of $R^f$, $R^g$, and $R^h$ of the formula (2) are groups represented by the formula (2b) (sometimes referred to as "triallyl isocyanurate compounds).

Specific examples of the monoallyl diglycidyl isocyanurate compounds include monoallyl diglycidyl isocyanurate, 1-allyl-3,5-bis(2-methylepoxypropyl)isocyanurate, 1-(2-methylpropenyl)-3,5-diglycidyl isocyanurate, and 1-(2-methylpropenyl)-3,5-bis(2-methylepoxypropyl)isocyanurate.

Specific examples of the diallyl monoglycidyl isocyanurate compounds include diallyl monoglycidyl isocyanurate, 1,3-diallyl-5-(2-methylepoxypropyl)isocyanurate, 1,3-bis(2-methylpropenyl)-5-glycidyl isocyanurate, and 1,3-(bis(2-methylpropenyl)-5-(2-methylepoxypropyl)isocyanurate.

Specific examples of the triallyl isocyanurate compounds include triallyl isocyanurate, and tris(2-methylpropenyl)isocyanurate.

In the present curable resin composition, the isocyanurate compounds (H) may be used singly or in combinations of two or more. Note that the isocyanurate compounds (H) may be commercially available products.

The isocyanurate compound (H) having a group represented by the formula (2a) may be reacted with an epoxy reactive compound such as an alcohol or an acid anhydride so as to be modified for usage.

Because having a group represented by the formula (2b), the isocyanurate compound (H) may be previously reacted with, for instance, a hydrosilyl-containing compound (i.e., a hydrosilylation reaction), and then used. For Example, a reaction product between the monoallyl diglycidyl isocyanurate compound and the ladder-type silsesquioxane (G) produced under a hydrosilylation catalyst may be used as a component constituting the curable resin composition of the present invention.

From the viewpoint of increasing the compatibility with the other components, the isocyanurate compound (H) may be previously mixed with the silane coupling agent (I) described below and then blended into the other components.

When the curable resin composition of the present invention contains the isocyanurate compound (H), the content (amount blended) of the isocyanurate compound (H) in the curable resin composition of the present invention is preferably 0.01 to 6 wt %, more preferably 0.05 to 4 wt %, and still more preferably 0.08 to 3 wt %, based on the total amount (100 wt %) of the curable resin composition. When the content of the isocyanurate compound (H) is 0.01 wt % or more, the resulting cured product tends to have further increased barrier properties against corrosive gas and more improved adhesion to an adherend. Meanwhile, if the content of the isocyanurate compound (H) is 6 wt % or less, solid precipitation caused by the isocyanurate compound (H) in the curable resin composition tends to be suppressed.

[Silane Coupling Agent (I)]

The curable resin composition of the present invention may further comprise a silane coupling agent (I). When the silane coupling agent (I) is contained, the resulting cured product tends to, in particular, have more improved adhesion to an adherend. Further, because the silane coupling agent (I) is well miscible with the isocyanurate compound (H) (in particular, a monoallyl diglycidyl isocyanurate compound) and the ladder-type silsesquioxane (G), the compatibility with the other components, such as, in particular, the isocyanurate compound (H) can be increased. Specifically, when the isocyanurate compound (H) is used, for instance, a composition comprising the isocyanurate compound (H) and the silane coupling agent (I) may be previously prepared and then blended with the other components to readily give a uniform curable resin composition of interest.

As the silane coupling agent (I), known and conventional silane coupling agents can be used. Examples include: epoxy-containing silane coupling agents such as 3-glycidoxypropyl trimethoxysilane, 2-(3,4-epoxycyclohexyl)ethyl trimethoxysilane, 3-glycidoxypropylmethyl diethoxysilane, 3-glycidoxypropyl triethoxysilane; amino-containing silane coupling agents such as N-2-(aminoethyl)-3-aminopropyl trimethoxysilane, N-2-(aminoethyl)-3-aminopropyl triethoxysilane, 3-aminopropyl trimethoxysilane, 3-aminopropyl triethoxysilane, 3-triethoxysilyl-N-(1,3-dimethyl-butylidene)propylamine, N-phenyl-3-aminopropyl trimethoxysilane, N-(vinylbenzyl)-2-aminoethyl-3-aminopropyl trimethoxysilane hydrochloride, N-(β-aminoethyl)-γ-aminopropylmethyl dimethoxysilane; tetramethoxysilane, tetraethoxysilane, methyl triethoxysilane, dimethyl diethoxy silane, methyl triethoxysilane, vinyl triethoxysilane, vinyl trimethoxysilane, vinyl tris(methoxyethoxysilane), phenyltrimethoxysilane, diphenyl dimethoxysilane, vinyl triacetoxysilane, γ-(meth)acryloyloxypropyl triethoxysilane, γ-(meth)acryloylxypropyl trimethoxysilane, γ-(meth)acryloyloxypropylmethyl dimethoxysilane, γ-(meth)acryloyloxypropylmethyl diethoxysilane, mercaptopropylene trimethoxysilane, mercaptopropylene triethoxysilane, and alkoxy oligomers (e.g., trade names "X-41-1053", "X-41-1059A", "KR-516", "X-41-1085", "X-41-1818", "X-41-1810", "X-40-2651", "X-40-2665A", "KR-513", "KC-89S", "KR-500", "X-40-9225", "X-40-9246", "X-40-9250"; each manufactured by Shin-Etsu Chemical Co., Ltd.). Among them, the epoxy-containing silane coupling agents (in particular, 3-glycidoxypropyl trimethoxysilane) are preferably used.

In the present curable resin composition, the silane coupling agents (I) may be used singly or in combinations of two or more. Alternatively, the silane coupling agents (I) may be commercially available products.

When the curable resin composition of the present invention contains the silane coupling agent (I), the content (amount blended) of the silane coupling agent (I) in the present curable resin composition is preferably 0.01 to 15 wt %, more preferably 0.1 to 10 wt %, and still more preferably 0.5 to 5 wt %, based on the total amount (100 wt %) of the curable resin composition. When the content of the silane coupling agent (I) is 0.01 wt % or more, the resulting cured product tends to have more improved adhesion to an adherend. In addition, the solubility of the isocyanurate compound (H) in the curable resin composition can be increased, so that the resulting cured product may have much increased barrier properties against corrosive gas. Meanwhile, when the content of the silane coupling agent (I) is 15 wt % or less, the curing reaction fully proceeds, and the resulting cured product tends to have much better toughness, heat resistance, and barrier properties against corrosive gas.

From the viewpoint of markedly increasing gas barrier properties against corrosive gas of the resulting cured product, the curable resin composition of the present invention preferably contains at least one compound selected from the group consisting of the zinc compounds (F) and the isocyanurate compounds (H).

Further, the present curable resin composition may contain a component other than the above-described components (sometimes simply referred to as an "additional component"). Examples of the additional component include: siloxane compounds other than the components (A), (B), (C), (E), and (G) (e.g., cyclic siloxane compounds, low-molecular-weight, straight-chain or branched-chain siloxane compounds); hydrosilylation inhibitors; solvents; and various additives. Examples of the additives include: inorganic fillers such as precipitated silica, wet silica, fumed silica, calcined silica, titanium oxide, alumina, glass, quartz, aluminosilicate, iron oxide, calcium carbonate, carbon black, silicon carbide, silicon nitride, and boron nitride; inorganic fillers as obtained by processing each filler with an organic silicon compound such as an organohalosilane, organoalkoxysilane, or organosilazane; other organic resin (e.g., a silicone resin, an epoxy resin, a fluorine resin) fine powders; fillers such as conductive metal powders (e.g., silver, copper); solvents; stabilizers (e.g., antioxidants, UV absorbers, photostabilizers, thermal stabilizers); fire retardants (e.g., phosphorus-based fire retardants, halogen-based fire retardants, inorganic fire retardants); fire retardant aids; reinforcement materials (e.g., other fillers); nucleating agents; coupling agents; lubricants; waxes; plasticizers; mold release agents; impact resistance enhancers; color enhancers; fluidity enhancers; coloring agents (e.g., dyes, pigments); dispersers; antifoam agents; defoaming agents; antimicrobials; preservatives; viscosity modifiers; thickeners; and phosphors. The above additional components may be used singly or in combinations of two or more. Note that the content (amount blended) of the additional component may be suitable selected as long as the effects of the present invention are not impaired.

In the present curable resin composition, the composition (blending composition) is provided such that the amount of the hydrosilyl group (SiH group) in the component (B) and the component (C) per mol of the alkenyl group (including an aliphatic carbon-carbon double bond-containing group) present in the curable resin composition is preferably not less than 0.1 mol and not more than 100 mol, more preferably 0.3 to 50 mol, and still more preferably 0.5 to 30 mol. When the percentage of the alkenyl group and the hydrosilyl group is controlled to within the above ranges, the resulting cured product tends to have further increased heat resistance, transparency, heat shock resistance, and reflow resistance as well as barrier properties against corrosive gas.

The present curable resin composition may be prepared by stirring and mixing each of the above components at room temperature. Note that the present curable resin composition may be used as a one-liquid composition, in which a pre-mixture of each of the components may be used as it is, or, for example, as a composition made of multiple liquids (e.g., two liquids) to be used after mixing two or more components, which have been separately stored, at a prescribed ratio before use. During the preparation, the liquids may be heated to about a temperature at which they are not cured, (e.g., 30 to 100° C.).

The present curable resin composition may be in either a solid or liquid state and is usually a liquid at room temperature (about 25° C.).

The curable resin composition of the present invention has a viscosity at 23° C. of preferably 300 to 20000 mPa·s, more preferably 500 to 10000 mPa·s, and still more preferably 1000 to 8000 mPa·s. When the viscosity is 300 mPa·s or more, the resulting cured product tends to have increased heat resistance. Also, when the viscosity is 20000 mPa·s or less, the curable resin composition tends to be easily prepared, so that the yield and handling easiness increase. In addition, because foams are unlikely to remain in the resulting cured product, the yield and qualities of the cured product (in particular, an encapsulant) tend to further increase. Note that the viscosity of the curable resin composition can be measured by the same method as for the viscosity of the above-described component (A).

<Cured Product>

The curable resin composition of the present invention may be cured (in particular, cured by hydrosilylation) to yield a cured product (sometimes simply referred to as the "present cured product"). Curing (in particular, hydrosilylation-mediated curing) conditions may be suitably selected from conventional and known conditions. For instance, in view of the reaction rate, the temperature (curing temperature) is preferably 25 to 180° C. and more preferably 60 to 150° C., and the time (curing time) is preferably 5 to 720 min. Note that the curing may be conducted in one step or multistep. The present cured product has not only high heat resistance and transparency, which are specific to polysiloxane-based materials, but also, in particular, excellent barrier, flexibility and heat shock resistance properties against corrosive gas and is also less tacky.

The present cured product has a solid refractive index at light beam of 589 m and at 25° C. of preferably 1.46 to 1.54, more preferably 1.465 to 1.535, and still more preferably 1.47 to 1.53. When having a solid refractive index of 1.46 or more, the present cured product tends to have further increased gas barrier properties against corrosive gas (e.g. $H_2S$, $SO_x$ gas). Also, when having a solid refractive index of 1.54 or less, the cured product tends to have increased heat resistance and light resistance. Note that the above solid refractive index can be measured by using a Prism Coupler Model 2010/M (manufactured by Metricon Corporation).

<Encapsulating Agent>

The curable resin compositions of the present invention may each be suitably used as a composition (encapsulating agent) for encapsulating a semiconductor element in a semiconductor device (sometimes simply referred to as the "present encapsulating agent"). Specifically, the present encapsulating agents may be particularly preferably used as applications for encapsulating optical semiconductor elements in an optical semiconductor device (i.e., as encapsulating agents for optical semiconductors). Each encapsulant (cured product) as obtained by curing the present encapsulating agent has not only high heat resistance and transparency, which are specific to polysiloxane-based materials, but also, in particular, excellent barrier, flexibility and heat shock resistance properties against corrosive gas, and is also less tacky. Consequently, the encapsulating agent of the present invention can be favorably used particularly as an encapsulating agent for high-brightness and short-wavelength optical semiconductor elements having a large size.

<Lens-Forming Resin Composition>

In addition, the curable resin compositions of the present invention may be suitably used as lens-forming resin compositions (sometimes referred to as the "present lens-forming resin composition"). Each lens as obtained by curing the present lens-forming resin composition has not only high heat resistance and transparency, which are specific to polysiloxane-based materials, but also, in particular, excellent barrier, flexibility and heat shock resistance properties against corrosive gas and is also less tacky. Because of this, each lens as obtained by curing the present lens-forming resin composition can be preferably used as a lens, etc., for high-brightness and short-wavelength optical semiconductor elements.

<Semiconductor Device>

The present encapsulating agent may be used to encapsulate a semiconductor element so as to obtain a semiconductor device (sometimes simply referred to as the "present semiconductor device"). That is, the present semiconductor device is a semiconductor device having at least a semiconductor element and an encapsulant that encapsulates the semiconductor element, wherein the encapsulant is a cured product of the present encapsulating agent. In addition, the present lens-forming resin composition may be used to produce a semiconductor device (also sometimes referred to as the "present semiconductor device"). Furthermore, another aspect of the present semiconductor device provides a semiconductor device having at least a semiconductor element and a lens, wherein the lens is a cured product of the present lens-forming resin composition.

The present semiconductor device may be a semiconductor device including a semiconductor element, an encapsulant that encapsulates the semiconductor element, and a lens, wherein the encapsulant is a cured product of one of the curable resin compositions of the present invention (the present encapsulating agent) and the lens is a cured product of one of the curable resin compositions of the present invention (the present lens-forming resin composition).

The present semiconductor devices can be manufactured by using known and conventional procedures. For instance, the present encapsulating agent and/or lens-forming resin composition may be injected into a predetermined mold and then heated and cured under predetermined conditions to produce the present semiconductor devices. The curing temperature and curing time may be set to within substantially the same ranges as when the cured product is prepared.

When the above semiconductor device is an optical semiconductor device, namely when the present encapsulating agent and/or lens-forming resin composition are used as an encapsulating agent for an optical semiconductor element (encapsulating agent for an optical semiconductor) and/or a lens-forming resin composition (lens-forming resin composition for an optical semiconductor) in an optical semiconductor device, they can effectively exert, in particular, the above-mentioned advantageous effects. The present encapsulating agent and/or lens-forming resin composition may be used as an encapsulating agent for an optical semiconductor to obtain an optical semiconductor device (sometimes simply referred to as the "present optical semiconductor device").

FIG. 1 shows an optical semiconductor device according to an embodiment of the present invention. In FIG. 1, "100" denotes a reflector (light-reflecting resin composition); "101" denotes metal wiring (electrode); "102" denotes an optical semiconductor element; "103" denotes a bonding wire; and "104" denotes a cured product (encapsulant).

Specifically, the curable resin compositions of the present invention may be suitably used for applications such as: encapsulating agents that encapsulate each optical semiconductor element and/or lens-forming resin compositions which are used in high-brightness, short-wavelength and large optical semiconductor devices; and encapsulating agents for forming encapsulants that encapsulate each semiconductor element in high heat-resistant and voltage-resistant semiconductor devices (e.g., power semiconductors), all of which have hardly been realized by using conventional resin materials.

The curable resin compositions of the present invention are not limited to the above-mentioned encapsulating agent applications (in particular, encapsulating agent applications for optical semiconductor elements) and lens formation applications (in particular, lens formation applications for optical semiconductor devices). Examples of preferable usage include optics-related and/or semiconductor-related, applications such as functional coating agents, transparent devices, adhesives (e.g., heat-resistant, transparent adhesives), electrical insulators (e.g., insulating films), laminated plates, coatings, inks, paints, sealants, resists, composite materials, transparent substrates, transparent sheets, transparent films, optical elements, optical members, photo fabrication, electrical papers, touch panels, solar cell boards, optical waveguides, light-guiding plates, and holographic memories.

EXAMPLES

Hereinafter, the present invention will be described in detail based on Examples. The present invention, however, is not limited thereto.

The resulting products and manufactured articles were analyzed by $^1$H-NMR analysis using JEOL ECA500 (at 500 MHz).

The number average molecular weight and weight-average molecular weight of each of the resulting products and manufactured articles were measured in terms of standard polystyrene by using an Alliance HPLC System 2695 (manufactured by Waters), a Refractive Index Detector 2414 (manufactured by Waters), a column: Tskgel GMH$_{HR}$-M×2 (manufactured by Tosoh Corporation), a guard column: Tskgel guard column H$_{HR}$L (manufactured by Tosoh Corporation), a column oven: COLUMN HEATER U-620 (manufactured by Sugai), and a solvent: THF under measurement conditions at 40° C.

The viscosity of each of the resulting products and manufactured, articles was measured under conditions at a temperature of 25° C. and a rotation number of 20 rpm by using a rheometer (trade name "Physica MCR-302"); manufactured by Anton Paar, Inc., and a parallel plate (with a cone diameter of 25 mm and a cone angle of 0 degrees).

The solid refractive index of each of the resulting products and manufactured articles was measured by using a Prism Coupler Model 2010/M (manufactured by Metricon Corporation) and the refractive index at 589.0 nm was calculated from the readings at 407.3 nm, 632.8 nm, 827.8 nm, and 1310.2 nm under an environment at 25° C.

Production Example 1

To a 500-mL four-neck flask were added 60.02 g (238.10 mmol) of tetraethoxysilane, 14.79 g (74.74 mmol) of trimethoxyphenylsilane, 11.96 g (73.65 mmol) of hexamethyldisiloxane, 2.87 g (15.40 mmol) of 1,1,3,3-tetramethyl-1,3-divinyldisiloxane, and 65.27 g of methyl isobutyl ketone. The mixture was cooled to 15° C., and 18.38 g of 5 N hydrochloric acid placed in a dropping funnel was then added dropwise. Further, 24.78 g of water was added dropwise. After that, the resulting mixture was heated to 80° C. and then stirred. Subsequently, 60.96 g (375.42 mmol) of hexamethyldisiloxane and 14.40 g (77.25 mmol) of 1,1,3,3-tetramethyl-1,3-divinyldisiloxane were further added and the mixture was then stirred.

Next, the resulting reaction solution was transferred to a separating funnel; only a lower layer containing a silicone resin was removed; and this liquid was transferred to the separating funnel again and was then washed with water.

After the water washing, a solvent portion was removed under reduced pressure by using a rotary evaporator to yield 38.95 g of silicone resin A.

The number average molecular weight (Mn): 2038, the weight-average molecular weight (Mw): 2427, the molecular weight distribution (Mw/Mn): 1.19.

$^1$H-NMR (JEOL ECA500 (500 MHz, CDCl3)) δ: −0.3-0.3 ppm (br), 3.0-4.0 ppm (br), 5.7-6.2 ppm (br), 7.1-7.9 ppm (br).

The average unit formula:

$(SiO_{4/2})_{0.44}(PhSiO_{3/2})_{0.12}(Me_3SiO_{1/2})_{0.37}(ViMe_2SiO_{1/2})_{0.07}$

[Ph: a phenyl group, Me: a methyl group, Vi: a vinyl group; the same applies to the following].

The methyl group content; 87 mol %, the phenyl group content: 8 mol %, the vinyl group content: 5 mol %.

Production Example 2

To a 500-mL four-neck flask were added 45.57 g (218.75 mmol) of tetraethoxysilane, 26.03 g (131.25 mmol) of trimethoxyphenylsilane, 8.32 g (51.27 mmol) of hexamethyldisiloxane, 5.73 g (30.76 mmol) of 1,1,3,3-tetramethyl-1,3-divinyldisiloxane, and 67.98 g of methyl isobutyl ketone. The mixture, was cooled to 15° C., and 16.35 g of 5 N hydrochloric acid placed in a dropping funnel was then added dropwise. Further, 22.05 g of water was added dropwise. After that, the resulting mixture was heated to 80° C. and then stirred. Subsequently, 41.62 g (256.33 mmol) of hexamethyldisiloxane and 28.67 g (153.80 mmol) of 1,1,3,3-tetramethyl-1,3-divinyldisiloxane were further added and the mixture was then stirred.

Next, the reaction solution was transferred to a separating funnel; only a lower layer containing a silicone resin was removed; and this liquid was transferred to the separating funnel again and was then washed with water.

After the water washing, a solvent portion was removed under reduced pressure by using a rotary evaporator to yield 37.85 g of silicone resin B.

The number average molecular weight (Mn): 2670, the weight-average molecular weight (Mw): 3250, the molecular weight distribution (Mw/Mn): 1.22.

$^1$H-NMR (JEOL ECA500 (500 MHz, CDCl$_3$)) δ: −0.3-0.3 ppm (br), 3.0-4.0 ppm (br), 5.7-6.2 ppm (br), 7.1-7.9 ppm (br).

The average unit formula:

$(SiO_{4/2})_{0.35}(PhSiO_{3/2})_{0.21}(Me_3SiO_{1/2})_{0.30}(ViMe_2SiO_{1/2})_{0.14}.$

The methyl group content: 77 mol %, the phenyl group content: 14 mol %, the vinyl group content: 9 mol %.

Production Example 3

To a 500-mL four-neck flask were added 36.46 g (175.00 mmol) of tetraethoxysilane, 34.70 g (175.00 mmol) of trimethoxyphenylsilane, 8.12 g (50.00 mmol) of hexamethyldisiloxane, 5.59 g (30.00 mmol) of 1,1,3,3-tetramethyl-1,3-divinyldisiloxane, and 67.98 g of methyl isobutyl ketone. The mixture was cooled to 15° C., and 16.35 g of 5 N hydrochloric acid placed in a dropping funnel was then added dropwise. Further, 22.05 g of water was added dropwise. After that, the resulting mixture was heated to 80° C. and then stirred. Subsequently, 40.60 g (250.00 mmol) of hexamethyldisiloxane and 27.96 g (150.00 mmol) of 1,1,3,3-tetramethyl-1,3-divinyldisiloxane were further added and the mixture was then stirred.

Next, the reaction solution was transferred to a separating funnel; only a lower layer containing a silicone resin was removed; and this liquid was transferred to the separating funnel again and was then washed with water.

After the water washing, a solvent portion was removed under reduced pressure by using a rotary evaporator to yield 39.25 g of silicone resin C.

The number average molecular weight (Mn): 2743, the weight-average molecular weight (Mw): 3243, the molecular weight distribution. (Mw/Mn): 1.18.

$^1$H-NMR (JEOL ECA500 (500 MHz, CDCl$_3$)) δ: −0.3-0.3 ppm (br), 3.0-4.0 ppm (br), 5.7-6.2 ppm (br), 7.1-7.9 ppm (br).

The average unit formula:

$(SiO_{4/2})_{0.30}(PhSiO_{3/2})_{0.29}(Me_3SiO_{1/2})_{0.26}(ViMe_2SiO_{1/2})_{0.15}.$

The methyl group content: 71 mol %, the phenyl group content: 19 mol %, the vinyl group content: 10 mol %.

Production Example 4

(Step 1)

First, 13.10 g (66.1 mmol) of phenyltrimethoxysilane, 4.500 g (33.0 mmol) of methyltrimethoxysilane, 12.31 g (66.1 mmol) of 1,1,3,3-tetramethyl-1,3-divinyldisiloxane, and 6.16 g of methyl isobutyl ketone (MIBK) were added under a nitrogen air stream to a 100-ml flask (reaction vessel) equipped with a thermometer, a mixer, a reflux condenser, and a nitrogen inlet. Next, the mixture was heated to 70° C. To this mixture were simultaneously added dropwise 5.74 g (319 mmol) of water and 0.32 g of 5 N hydrochloric acid (4.8 mmol of hydrogen chloride) and the mixture was subjected to a polycondensation reaction at 70° C.

The resulting mixture was then cooled and washed with water until a lower layer liquid became neutral. After an upper layer liquid was separated, a solvent was evaporated from the upper layer liquid under conditions at 1 mmHg and at 40° C. to give a colorless, transparent, solid product (20.52 g). This product (a product after the silylation reaction) had a number average molecular weight of 720 and a weight-average molecular weight of 840.

(Step 2)

To a 100-mL flask with a reflux tube were added 20.00 g of the product obtained in Step 1, 17.95 g (47 mmol) of 3,3-diphenyl-1,1,5,5-tetramethyl trisiloxane, 7.520 g of toluene, and 0.0018 g [1.9×10$^{-4}$ mmol (in terms of Pt)] of a xylene solution containing a platinum (2%)-divinyltetramethyldisiloxane complex. Next, the mixture was stirred and preserved at 60° C.

After cooling, a solvent was removed from the reaction solution by using an evaporator to concentrate the solution toluene as measured by gas chromatograph (trade name "GC-2010"; manufactured by Shimadzu Corporation) was undetected so as to produce 34.85 g of vinylsilyl-containing polyorganosiloxysilalkylene A.

The viscosity [at 25° C. when the shear rate was 20 (l/s)] was 1100 mPa·s, the number average molecular weight (Mn) was 1072, the weight-average molecular weight (Mw) was 2676, and the molecular weight distribution (Mw/Mn) was 2.50.

$^1$H-NMR (JEOL ECA500 (500 MHz, CDCl$_3$)) δ: −0.3-3.0 ppm (br), 0.4 ppm (br), 3.0-4.0 ppm (br), 5.7-6.2 ppm (br), 7.1-7.9 ppm (br).

Production Example 5

(Step 1)

To a 100-mL flask with a reflux tube were added, under a nitrogen atmosphere, 6.653 g (20 mmol; a hydrosilyl group: 40 mmol) of 3,3-diphenyl-1,1,5,5-tetramethyl trisiloxane, 7.520 g of toluene, and 0.0018 g [1.9×10$^{-4}$ mmol (in terms of Pt)] of a xylene solution containing a platinum (2%)-divinyltetramethyldisiloxane complex. Next, the mixture was stirred and preserved at 60° C.

Then, 6.155 g (16 mmol; a vinylsilyl group: 32 mmol) of 1,5-divinyl-3,3-diphenyl-1,1,5,5-tetramethyltrisiloxane was added dropwise thereto by using a dropping funnel.

After completion of the dropwise addition, the mixture was preserved at 60° C. to produce a reaction solution containing a straight-chain polyorganosiloxysilalkylene having hydrosilyl groups at both ends. Thereafter, the reaction solution was cooled to room temperature.

(Step 2)

To a 100-mL flask with a reflux tube were added, under a nitrogen atmosphere, 2.000 g (4.8 mmol) of tris(vinyldimethylsiloxy)phenylsilane (manufactured by Eternal Chemical Co., Ltd.) and 0.0744 g [8×10$^{-5}$ mmol (in terms of Pt)] of a xylene solution containing a platinum (0.02%)-divinyltetramethyldisiloxane complex. Next, the mixture was preserved at 100° C.

All the amount of the reaction solution obtained in Step 1 was added dropwise thereto by using a dropping funnel. Then, the mixture was cooled to room temperature.

After the cooling, a solvent was removed from this reaction solution by using an evaporator to concentrate the solution until toluene as measured by gas chromatograph (trade name "GC-2010"; manufactured by Shimadzu Corporation) was undetected so as to produce 14.2 g of vinylsilyl-containing polyorganosiloxysilalkylene B.

The viscosity [at 25° C. when the shear rate was 20 (l/s)] was 3200 mPa·s, the number average molecular weight (Mn) was 3329, the weight-average molecular weight (Mw) was 7327, and the molecular weight distribution (Mw/Mn) was 2.20.

$^1$H-NMR (JEOL ECA500 (500 MHz, CDCl$_3$)) δ: −0.3-0.3 ppm (br), 0.4 ppm (br), 3.0-4.0 ppm (br), 5.7-6.2 ppm (br), 7.1-7.9 ppm (br).

Production Example 6

A 200-mL four-neck flask was charged with 42.61 g (238.98 mmol) of triethoxymethylsilane, 6.76 g (28.12 mmol) of phenyltriethoxysilane, and 17.69 g of methylisobutyl ketone. The mixture was cooled to 10° C. To the mixture, 4.33 g of water and 0.48 g of 5 N hydrochloric acid (i.e., 2.4 mmol of hydrogen chloride) were added dropwise at the same time. After the dropping, the mixture was held at 10° C. Subsequently, 80.0 g of methylisobutyl ketone was added thereto to dilute the reaction solution.

Subsequently, the temperature of the reaction vessel was raised to 70° C., and then 10.91 g of water was added into the vessel when the temperature reached 70° C., so that a polycondensation reaction was performed at the same temperature. Further, 2.08 g (10.93 mmol) of vinyltriethoxysilane was added thereto, so that a reaction (maturing) was performed at the same temperature.

Subsequently, 15.0 g (92.38 mmol) of hexamethyldisiloxane was added to the resulting reaction solution, so that a silylation reaction was performed at 70° C. The reaction solution was then cooled and washed with water until a lower layer liquid became neutral. An upper layer liquid was then separated. Subsequently, the solvent was evaporated from the upper layer liquid under conditions at 1 mmHg and at 60° C. to give 19.0 g of a ladder-type polyorganosilsesquioxane having a vinyl group and a TMS group at the ends as a colorless and transparent liquid product.

Weight-average molecular weight (Mw): 2700
Content of phenyl group: 4 mol %
Content of vinyl group: 2 mol %

$^1$H-NMR (JEOL ECA500 (500 MHz, CDCl$_3$)) δ: −0.3-0.3 ppm (br), 5.7-6.2 ppm (br), 7.1-7.7 ppm (br).

As the component (A), the following products were each used:

silicone resin A: the product obtained in Production Example 1;
silicone resin B: the product obtained in Production Example 2;
silicone resin C: the product obtained in Production Example 3.

As the component (B), the following manufactured articles were each used:

Si—H monomer A: 1,1,5,5-tetramethyl-3,3-diphenyltrisiloxane (NANJING SiSiB Silicones, Inc.) having
the average composition formula: $Ph_{2/3}Me_{4/3}H_{2/3}SiO_{2/3}$,
The average unit formula: $(Ph_2SiO_{2/2})_1(HMe_2SiO_{1/2})_2$,
and
a methyl group content of 50 mol %, a phenyl group content of 25 mol %, and a hydrosilyl group content of 25 mol %; and Si—H monomer B: 3-phenyl-1,1,3,5,5-pentamethyltrisiloxnae (manufactured by Gelest Inc.) having
the average composition formula: $Ph_{1/3}Me_{5/3}H_{2/3}SiO_{2/3}$,
the average unit formula: $(MePhSiO_{2/2})_1(HMe_2SiO_{1/2})_2$,
and
a methyl group content of 62.5 mol %, a phenyl group content of 12.5 mol %, and a hydrosilyl group content of 25 mol %.

As the component (C), the following manufactured product was used:

Si—H monomer C: trade name "DMS-H03" (manufactured by Gelest, Inc.)
the average unit formula: $(Me_2SiO_{2/2})_4(HMe_2SiO_{1/2})_2$
viscosity: 2 mPa·s (25° C.)
molecular weight: 436

Si—H monomer D: trade name "DMS-H11" (manufactured by Gelest, Inc.)
the average unit formula $(Me_2SiO_{2/2})_{11}(HMe_2SiO_{1/2})_2$
viscosity: 2 mPa·s (25° C.)
molecular weight: 1036

As Si—H silicones other than the components (B) and (C), the following manufactured articles were used:

As Si—H monomer E: trade name "DMS-H25" (manufactured by Gelest, Inc.)
the average unit formula $(Me_2SiO_{2/2})_{227}(HMe_2SiO_{1/2})_2$
viscosity: 3 mPa·s (25° C.)
molecular weight: 17161

HMS-501: trade name "HMS-H501" (manufactured by Gelest, Inc.)
the average unit formula:

$(Me_2SiO_{2/2})_8(MeHSiO_{2/2})_6(Me_3SiO_{1/2})_2$ viscosity: 2 mPa·s (25° C.)
molecular weight: 1102
HMS-301: trade name "HMS-301" (manufactured by Gelest, Inc.)
the average unit formula $(Me_2SiO_{2/2})_{18}(MeHSiO_{2/2})_7(Me_3SiO_{1/2})_2$ viscosity: 2 mPa·s (25° C.)
molecular weight: 1941
HMS-991: trade name "HMS-H991" (manufactured by Gelest, Inc.)
the average unit formula: $(MeHSiO_{2/2})_{25}(Me_3SiO_{1/2})_2$
viscosity: 2 mPa·s (25° C.)
molecular weight: 1689
As the component (D), the followed manufactured article was used:
an addition reaction catalyst: trade name "Pt-VTS," a xylene solution containing a platinum-divinyltetramethyldisiloxane complex, and having a content of platinum of 2.0 wt %; manufactured by N.E. CHEMCAT CORPORATION.
As the component (E), the following products were each used:
polyorganosiloxysilalkylene A: the product obtained in Production Example 4; and
polyorganosiloxysilalkylene: B: the product obtained in Production Example 5.
As the component (F), the following manufactured articles were each used:
Octope Zn: trade name "Octope Zn," zinc 2-ethylhexanoate, manufactured by Hope Chemical Co., Ltd.; and
As the component (G), the following manufactured article was used:
Ladder-type polyorganosilsesquioxane: a product obtained in Production Example 6
As materials for Comparative Examples 15 and 16, the following manufactured articles were used as alternatives for the components (A) to (G).
(Preparation A)
GS5145A: trade name "ETERLED GS5145A", manufactured by Eternal Materials Co., Ltd., containing a polyorganosiloxysilalkylene having an alkenyl group but free of the Q-unit, and a hydrosilylation catalyst, and having a methyl group content of 53 mol %, a phenyl group content of 24 mol %, and a vinyl group content of 4 mol %;
OE-6630A: trade name "OE-6630A", manufactured by Dow Corning Toray Co., Ltd., containing an alkenyl-containing MDT resin, an alkenyl-containing straight-chain polyorganosiloxane, and a hydrosilylation catalyst, and having a methyl group content of 51 mol %, a phenyl group content of 42 mol %, and a vinyl group content of 4 mol %; and
(Preparation B)
GS5145B: trade name "ETERLED GS5145B", manufactured by Eternal Materials Co., Ltd., containing an alkenyl-containing MT resin and a hydrosilyl-containing straight-chain polyorganosiloxane, and having a methyl group content of 37 mol %, a phenyl group content of 45 mol %, a vinyl group content of 8 mol %, and an SiH group content of 10 mol %;
OE-6630B: trade name: "OE-6630B", manufactured by Dow Corning Toray Co., Ltd., containing an alkenyl-containing MT resin and a hydrosilyl-containing straight-chain polyorganosiloxane, and having a methyl group content of 40 mol %, a phenyl group content of 41 mol %, a vinyl group content of 8 mol %, and an SiH group content of 10 mol %;

Examples and Comparative Examples

Examples 1 to 17 and Comparative Examples 1 to 14 were put into practice in accordance with the following protocols.
The components (A), (B) and (C), Si—H silicone other than the components (B) and (C), and components (E), (F) and (G) were mixed at a given weight ratio according to Table 1 (Examples 1 to 17) and Table 2 (Comparative Examples 1 to 14), and each mixture was stirred at 70° C. for 2 h. Next, the mixture was cooled to room temperature, and the component (D) was added at a prescribed weight ratio and then stirred for 10 min to give a curable resin composition as a uniform liquid.
For Comparative Examples 15 and 16, the same procedure as for Examples 1 to 17 and Comparative Examples 1 to 14 was repeated to prepare each curable resin composition, except that instead of using the components (A) to (G), the preparation A or B listed in Table 2 was mixed at a weight ratio designated in Table 2.
Tables 1 and 2 show a1/a2 of the component (A) included in each curable resin composition obtained in each of Examples and Comparative Examples. If two or more silicone resins were used as the component (A), a1/a2 was an average based on the blending ratio between the silicone resins.
Further, Tables 1 and 2 shows the ratio of the hydrosilyl group (SiH group) in the component (B) and the component (C) to the vinyl group (SiVi group) in the curable resin composition (SiH/SiVi ratio).
Each resin composition was subjected to the following evaluation tests.
Note that unless otherwise indicated, the amount of each component blended of each curable resin composition in Tables 1 and 2 is expressed as parts by weight; and the amount of the addition reaction catalyst is expressed by parts per million (ppm) of platinum.
<Evaluation>
[Solid Refractive Index]
Each curable resin composition as obtained above was injected into a mold made of PTFE with a thickness of 0.5 mm and was heated at 80° C. for 1 h and further heated at 150° C. for 4 h to produce, from each curable resin composition, a cured product, which was then subjected to a solid refractive index measurement.
The refractive index at 589.0 nm of each cured product obtained was calculated from the readings at 407.3 nm, 632.8 nm, 827.8 nm, and 1310.2 nm under an atmosphere at 25° C. as obtained by using a Prism Coupler Model 2010/M (manufactured by Metricon Corporation). Tables 1 and 2 show the results.
[Tensile Strength Test]
Each curable resin composition obtained above was injected into a mold made of PTFE with a thickness of 0.5 mm and was heated at 80° C. for 1 h and further heat at 150° C. for 4 h to produce, from each curable resin composition, a cured product, which was then subjected to a tensile test.
The tensile strength and the Young's modulus of the resulting cured product were measured in accordance with JIS K6251, and evaluated based on the following criteria.
Tables 1 and 2 show the results.
Tensile strength [%]
⊚ (Excellent): The tensile strength [%] is 100% or more.

○ (Good): The tensile strength [%] is not less than 85% and less than 100%.

x (Poor): The tensile strength [%] is less than 85%.

Unmeasurable: The tensile strength cannot be measured due to large tackiness.

Young's modulus [MPa]

◎ (Excellent): The Young's modulus [MPa] is less than 15 MPa.

○ (Good): The Young's modulus [MPa] is not less than 15 MPa and less than 30 MPa.

x (Poor): The Young's modulus [MPa] is 30 MPa or more.

Unmeasurable: The tensile Young's modulus cannot be measured due to large tackiness.

[Thermal Shock Test]

Each curable resin composition obtained above was injected into an LED package (InGaN element; with 5.0 mm×5.0 mm) of an aspect shown in FIG. 1 and was heated at 80° C. for 1 h and, further at 150° C. for 4 h to produce an optical semiconductor device, in which an optical semiconductor element had been encapsulated, by using the resulting cured product of each curable resin composition.

The optical semiconductor device as produced above was used as a sample. Ten of the samples were used for each of the curable resin compositions. Note that the sample was used after confirmation of lighting with a current of 20 mA passing before the test.

The sample was subjected to 200 cycles of heat shock with a thermal shock tester (model No. TSB-21, manufactured by Espec Corp.), the cycle including an exposure at a temperature of −40° C. for 5 minutes and a subsequent exposure at a temperature of 100° C. for 5 minutes as one cycle. A current of 20 mA was then applied to the sample after the 200 cycles of heat shock. The number of samples that had failed lighting was counted, and the evaluation was made based on the following criteria. Tables 1 and 2 show the results.

◎ (Excellent): The occurrence ratio of lighting failure is 0%.

○ (Good): The occurrence ratio of lighting failure is 10% to 20%.

x (Poor): The occurrence ratio of lighting failure is 30% or more.

[Aging Test]

(To Manufacture Cured Product)

Each curable resin composition as obtained above was injected into a rectangular mold with a thickness of 3 mm, a width of 10 mm, and a length of 50 mm, and was heated at 80° C. for 1 h and further at 150° C. for 4 h to manufacture, from each curable resin composition, a cured product (with a thickness of 3 mm).

The light transmittance at 450 nm of each cured product as produced above was measured by using a spectrophotometer (UV-2450, manufactured by Shimadzu Corporation). Next, each cured product was exposed to an atmosphere at 200° C. for 500 h, and the light transmittance was then measured in the same way.

The light transmittance immediately after curing was set to an "initial transmittance [%]", and the light transmittance after exposure under an atmosphere at 200° C. for 500 h was set to a "post-200° C. heat resistance test (500 h) transmittance [%]".

From the measured results, each transmittance maintenance rate was calculated by using the following equation:

Post-200° C. heat resistance test (500 h) transmittance rate=(Post-200° C. heat resistance test (500 h) transmittance [%]/Initial transmittance [%])×100.

Then, "post-200° C. heat resistance test (500 h) transmittance maintenance rate" was evaluated based on the following criteria. Tables 1 and 2 show the results.

◎ (Excellent): the transmittance maintenance rate is 95% or more;

○ (Good): the transmittance maintenance rate is not less than 90% and less than 95%; and x (Poor) the transmittance rate is less than 90%.

[Track Test]

Each curable resin composition as obtained above was injected into a mold made of PTFE with a thickness of 0.5 mm and was heated at 80° C. for 1 h and further heated at 150° C. for 4 h to produce, from each curable resin composition, a cured product, which was then subjected to a tack test. The tack was evaluated by touching a surface of the resulting cured resin film by using a finger and by determining whether the finger adhered thereto.

Then, the tack was evaluated using the criteria below. Tables 1 and 2 show the results.

○ (Good): the sample does not adhere to the finger; and x (Poor): the sample adheres to the finger.

[Hydrogen Sulfide Test]

(To Manufacture Optical Semiconductor Device)

Each curable resin composition as obtained above was injected into an LED package (InGaN elements; with 3.5 mm×2.8 mm) of an aspect shown in FIG. 1 and was heated at 80° C. for 1 h. and further heated at 150° C. for 4 h to manufacture an optical semiconductor device, in which an optical semiconductor element had been encapsulated, by using the resulting cured product of each curable resin composition.

Each optical semiconductor device (cured product) as manufactured above was used as a sample.

First, the total luminous flux (unit: 1 m) of each sample was measured by using a total luminous flux meter (a multi-spectroradiometry system "OL771," manufactured by Optronic Laboratories, Inc.) while a current at 20 mA was made to flow. This value was set to a "pre-test total luminous flux."

Next, each sample was placed in a gas corrosion tester (model "GS-UV," manufactured by Suga Test Instruments Co., Ltd.) in which the hydrogen sulfide concentration, the temperature, and the humidity were adjusted: to 25 ppm, 50° C., and 80% RH, respectively. After 48 h, each sample was taken out. The total luminous flux (unit: 1 m) of each sample as so obtained was measured in the same way as above. The total luminous flux after 48 h was set to a "post-48 h total luminous flux".

The luminous intensity maintenance rate was calculated from the total luminous flux values as measured above by using the following equation:

Post-48 h luminous intensity maintenance rate [%]= (Post-48 h total luminous flux/Pre-test total luminous flux)×100.

Then, the post-48 h luminous intensity maintenance rate after the hydrogen sulfide test was evaluated by using the criteria below:

◎Excellent): the post-48 h luminous intensity maintenance rate is 95% or more;

○ (Good): the post-48 h luminous intensity maintenance rate is not less than 70% and less than 95%; and x (Poor): the post-48 h luminous intensity maintenance rate is less than 70%.

The results are shown in the row of the "Determination of a post-48 h luminous intensity maintenance rate" of hydrogen sulfide test in Tables 1 and 2. The higher the luminous intensity maintenance rate is, the more excellent gas barrier properties against corrosive gas of the resulting cured product (encapsulant) are.

Note that each curable resin composition (each of Examples and Comparative Examples) was used to manufacture 10 pieces of an optical semiconductor device, which were subjected to the luminous intensity maintenance rate measurement and calculation. Then, the average (N=10) of them was used as a luminous intensity maintenance rate of interest.

[Appearance]

The appearance of each of the cured products was visually observed. A transparent one was evaluated as "good", and a cloudy one was evaluated as "poor".

[Overall Judgment]

From the results of the tensile test, the thermal shock test, the aging test, the tack test, the hydrogen sulfide test and the appearance, the overall judgment was made in accordance with the following criteria:

⊚ (Excellent): there is no criterion of poor;

○ (Good): one criterion of poor is present;

x (Poor) two or more criteria of poor are present; and

- (Very poor): An unmeasurable evaluation item is present.

TABLE 1

|  |  |  | Example 1 | Example 2 | Example 3 | Example 4 | Example 5 | Example 6 | Example 7 | Example 8 | Example 9 |
|---|---|---|---|---|---|---|---|---|---|---|---|
| Curable resin composition | Component (A) | Silicon resin A | 59 | 59 | 59 | 59 | 59 | 58 | 59 | 12 | 12 |
|  |  | Silicon resin B |  |  |  |  |  |  |  | 64 | 64 |
|  |  | Silicon resin C |  |  |  |  |  |  |  |  |  |
|  | Component (B) | Si—H monomer A | 15 | 15 | 15 | 15 | 15 | 15 | 15 | 15 | 15 |
|  |  | Si—H monomer B | 1 | 1 | 1 | 1 | 1 | 1 | 1 | 1 | 1 |
|  | Component (C) | Si—H monomer C | 1 | 3 | 5 | 9 | 3 |  |  | 1 | 3 |
|  |  | Si—H monomer D |  |  |  |  |  | 1 | 5 |  |  |
|  | Component (D) | Addition reaction catalyst | 1 ppm | 1 ppm | 1 ppm | 1 ppm | 1 ppm | 1 ppm | 1 ppm | 1 ppm | 1 ppm |
|  | Component (E) | Polyorganosiloxy silalkylene A | 25 | 25 | 25 | 25 | 25 | 25 | 25 |  |  |
|  |  | Polyorganosiloxy silalkylene B |  |  |  |  |  |  |  | 8 | 8 |
|  | Component (F) | Octope Zn | 0.08 | 0.08 | 0.08 | 0.08 | 0.08 | 0.08 | 0.08 | 0.08 | 0.08 |
|  | Component (G) | Ladder-type polyorganosilsesquioxane |  |  |  |  | 4 |  |  |  |  |
|  | a1/a2 of silicon resin |  | 3.86 | 3.86 | 3.86 | 3.86 | 3.86 | 3.86 | 3.86 | 1.83 | 1.83 |
|  | SiH/SiVi |  | 0.99 | 1.01 | 1.03 | 1.07 | 1.00 | 0.98 | 1.00 | 0.96 | 0.98 |
| Cured product (optical semiconductor device) | Solid refractive index |  | 1.49 | 1.49 | 1.49 | 1.48 | 1.48 | 1.49 | 1.48 | 1.50 | 1.49 |
|  | Tensile test | Tensile strength [%] | ○ | ○ | ○ | ○ | ⊚ | ○ | ○ | ○ | ⊚ |
|  |  | Young's modulus [MPa] | ○ | ○ | ⊚ | ⊚ | ⊚ | ○ | ⊚ | ○ | ⊚ |
|  | Heat shock test | Occurrence ratio of lighting failure after 200 cycles | ○ | ⊚ | ⊚ | ⊚ | ⊚ | ○ | ⊚ | ○ | ⊚ |
|  | Aging test | Judgment on post-200° C. heat resistance test (500 h) transmittance maintenance rate | ⊚ | ⊚ | ⊚ | ⊚ | ⊚ | ⊚ | ⊚ | ○ | ○ |
|  | Tack test | Judgment on tack of 0.5 mm-thick resin | ○ | ○ | ○ | ○ | ○ | ○ | ○ | ○ | ○ |
|  | Hydrogen sulfide test | Judgment on post-48 h luminous intensity maintenance rate | ⊚ | ⊚ | ⊚ | ⊚ | ⊚ | ⊚ | ⊚ | ⊚ | ⊚ |
|  | Appearance |  | ○ | ○ | ○ | ○ | ○ | ○ | ○ | ○ | ○ |
|  | Overall judgement |  | ⊚ | ⊚ | ⊚ | ⊚ | ⊚ | ⊚ | ⊚ | ⊚ | ⊚ |

TABLE 1-continued

|  |  |  |  | Example 10 | Example 11 | Example 12 | Example 13 | Example 14 | Example 15 | Example 16 | Example 17 |
|---|---|---|---|---|---|---|---|---|---|---|---|
| Curable resin composition | Component (A) | Silicon resin A | | 12 | 12 | 12 | 12 | 12 | 12 | 12 | 12 |
| | | Silicon resin B | | 64 | 64 | 64 | 64 | | | | |
| | | Silicon resin C | | | | | | 63 | 63 | 63 | 63 |
| | Component (B) | Si—H monomer A | | 15 | 15 | 15 | 15 | 16 | 16 | 16 | 16 |
| | | Si—H monomer B | | 1 | 1 | 1 | 1 | 1 | 1 | 1 | 1 |
| | Component (C) | Si—H monomer C | | 5 | 5 | 5 | | 1 | 3 | | |
| | | Si—H monomer D | | | | | 1 | | | 1 | 3 |
| | Component (D) | Addition reaction catalyst | | 1 ppm | 1 ppm | 1 ppm | 1 ppm | 1 ppm | 1 ppm | 1 ppm | 1 ppm |
| | Component (E) | Poly-organosiloxy silalkylene A | | 8 | 8 | 8 | 8 | 8 | 8 | 8 | 8 |
| | | Poly-organosiloxy silalkylene B | | | | | | | | | |
| | Component (F) | Octope Zn | | 0.08 | 0.08 | 0.08 | 0.08 | 0.08 | 0.08 | 0.08 | 0.08 |
| | Component (G) | Ladder-type polyorgano-silsesquioxane | | | 0.5 | 1 | | | | | |
| | | a1/a2 of silicon resin | | 1.86 | 1.83 | 1.83 | 1.03 | 1.03 | 1.03 | 1.03 | 1.03 |
| | | SiH/SiVi | | 1.00 | 1.00 | 1.00 | 0.96 | 0.95 | 0.97 | 0.95 | 0.95 |
| Cured product (optical semiconductor device) | | Solid refractive index | | 1.49 | 1.49 | 1.49 | 1.50 | 1.50 | 1.50 | 1.50 | 1.50 |
| | Tensile test | Tensile strength [%] | | ◎ | ○ | ○ | ○ | ◎ | ◎ | ◎ | ◎ |
| | | Young's modulus [MPa] | | ◎ | ◎ | ◎ | ○ | ◎ | ◎ | ◎ | ◎ |
| | Heat shock test | Occurrence ratio of lighting failure after 200 cycles | | ◎ | ◎ | ◎ | ○ | ○ | ◎ | ○ | ◎ |
| | Aging test | Judgment on post-200° C. heat resistance test (500 h) transmittance maintenance rate | | ○ | ○ | ○ | ○ | ○ | ○ | ○ | ○ |
| | Tack test | Judgment on tack of 0.5 mm-thick resin | | ○ | ○ | ○ | ○ | ○ | ○ | ○ | ○ |
| | Hydrogen sulfide test | Judgment on post-48 h luminous intensity maintenance rate | | ◎ | ◎ | ◎ | ◎ | ◎ | ◎ | ◎ | ◎ |
| | | Appearance | | ○ | ○ | ○ | ○ | ○ | ○ | ○ | ○ |
| | | Overall judgement | | ◎ | ◎ | ◎ | ◎ | ◎ | ◎ | ◎ | ◎ |

TABLE 2

|  |  |  | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 |
|---|---|---|---|---|---|---|---|---|---|---|---|
| Curable resin composition | Component (A) | Silicon resin A | 59 | 59 | 59 | 59 | 59 | 59 | 59 | 59 | 59 |
| | | Silicon resin B | | | | | | | | | |
| | | Silicon resin C | | | | | | | | | |
| | Component (B) | Si—H monomer A | 15 | 15 | 15 | 15 | 15 | 15 | 15 | 15 | 15 |
| | | Si—H monomer B | 1 | 1 | 1 | 1 | 1 | 1 | 1 | 1 | 1 |

TABLE 2-continued

|  |  |  |  |  |  |  |  |  |  |  |  |
|---|---|---|---|---|---|---|---|---|---|---|---|
| | Component (C) | Si—H monomer C | | | | | | | | | |
| | | Si—H monomer D | | 0.1 | 35 | | | | | | |
| | Si—H silicone other than component (B) and (C) | Si—H monomer E | | | | | 5 | | | | |
| | | HMS-501 | | | | | | 1 | 5 | | |
| | | HMS-301 | | | | | | | | 2 | 12 |
| | | HMS-991 | | | | | | | | | |
| | Component (D) | Addition reaction catalyst | 1 ppm | 1 ppm | 1 ppm | 1 ppm | 1 ppm | 1 ppm | 1 ppm | 1 ppm | 1 ppm |
| | Component (E) | Polyorganosiloxy silalkylene A | 25 | 25 | 25 | 25 | 25 | 25 | 25 | 25 | 25 |
| | | Polyorganosiloxy silalkylene B | | | | | | | | | |
| | Component (F) | Octope Zn | | 0.08 | 0.08 | 0.08 | 0.08 | 0.08 | 0.08 | 0.08 | 0.08 |
| Curable resin | Preparation A | GS5145A OE-6630A | | | | | | | | | |
| | Preparation B | GS5145B OE-6630B | | | | | | | | | |
| | a1/a2 of silicon resin | | 3.86 | 3.86 | 3.86 | 3.86 | 3.86 | 3.86 | 3.86 | 3.86 | 3.86 |
| | SiH/SiVi | | 0.98 | 0.98 | 0.98 | 1.13 | 0.98 | 0.99 | 1.06 | 0.99 | 1.09 |
| Cured product (optical semiconductor device) | Solid refractive Index | | 1.49 | 1.49 | 1.49 | 1.48 | 1.48 | 1.49 | 1.48 | 1.49 | 1.48 |
| | Tensile test | Tensile strength [%] | X | X | X | Unmeasurable | Unmeasurable | X | X | X | X |
| | | Young's modulus [MPa] | X | X | X | Unmeasurable | Unmeasurable | X | X | X | ◎ |
| | Heat shock test | Occurrence ratio of lighting failure after 200 cycles | X | X | X | X | X | X | X | X | X |
| | Aging test | Judgment on post-200° C. heat resistance test (500 h) transmittance maintenance rate | ◎ | ◎ | ◎ | ◎ | ◎ | ◎ | ◎ | ◎ | ◎ |
| | Tack test | Judgment on tack of 0.5 mm-thick resin | ○ | ○ | ○ | X | X | ○ | ○ | ○ | ○ |
| | Hydrogen sulfide test | Judgment on post-48 h luminous intensity maintenance rate | ○ | ◎ | ◎ | ◎ | ◎ | ◎ | ◎ | ◎ | ◎ |
| | Appearance | | ○ | ○ | ○ | ○ | X | ○ | ○ | ○ | ○ |
| | Overall judgement | | X | X | X | — | — | X | X | X | ○ |

|  |  |  | Comparative Example 10 | Comparative Example 11 | Comparative Example 12 | Comparative Example 13 | Comparative Example 14 | Comparative Example 15 | Comparative Example 16 |
|---|---|---|---|---|---|---|---|---|---|
| Curable resin composition | Component (A) | Silicon resin A | 59 | 59 | 12 | 12 | 12 | | |
| | | Silicon resin B | | | 64 | 64 | | | |
| | | Silicon resin C | | | | | 63 | | |
| | Component (B) | Si—H monomer A | 15 | 15 | 15 | 15 | 16 | | |
| | | Si—H monomer B | 1 | 1 | 1 | 1 | 1 | | |

TABLE 2-continued

| | | | 1 | 2 | 3 | 4 | 5 | 6 | 7 |
|---|---|---|---|---|---|---|---|---|---|
| | Component (C) | Si—H monomer C | | | | | | | |
| | | Si—H monomer D | | | | | | | |
| | Si—H silicone other than component (B) and (C) | Si—H monomer E | | | | | | | |
| | | HMS-501 | | | | | | | |
| | | HMS-301 | | | | | | | |
| | | HMS-991 | 0.5 | 3 | | | | | |
| | Component (D) | Addition reaction catalyst | 1 ppm | 1 ppm | 1 ppm | 1 ppm | 1 ppm | | |
| | Component (E) | Polyorganosiloxysilalkylene A | 25 | 25 | | | | | |
| | | Polyorganosiloxysilalkylene B | | | 8 | 8 | 8 | | |
| | Component (F) | Octope Zn | 0.08 | 0.08 | | 0.08 | | | |
| Curable resin | Preparation A | GS5145A | | | | | | 20 | |
| | | OE-6630A | | | | | | | 20 |
| | Preparation B | GS5145B | | | | | | 80 | |
| | | OE-6630B | | | | | | | 80 |
| | a1/a2 of silicon resin | | 3.86 | 3.88 | 1.83 | 1.83 | 1.03 | 0 | 0 |
| | SiH/SiVi | | 0.99 | 1.08 | 0.95 | 0.95 | 0.94 | 0.95 | 1.06 |
| Cured product (optical semiconductor device) | | Solid refractive Index | 1.49 | 1.49 | 1.50 | 1.50 | 1.50 | 1.55 | 1.55 |
| | Tensile test | Tensile strength [%] | X | X | X | X | ○ | ◎ | ○ |
| | | Young's modulus [MPa] | X | X | ○ | ○ | ○ | ○ | ◎ |
| | Heat shock test | Occurrence ratio of lighting failure after 200 cycles | X | X | X | X | X | X | X |
| | Aging test | Judgment on post-200° C. heat resistance test (500 h) transmittance maintenance rate | ◎ | ◎ | ○ | ○ | ○ | X | X |
| | Tack test | Judgment on tack of 0.5 mm-thick resin | ○ | ○ | ○ | ○ | ○ | X | X |
| | Hydrogen sulfide test | Judgment on post-48 h luminous intensity maintenance rate | ◎ | ◎ | ○ | ◎ | ○ | ○ | ○ |
| | | Appearance | ○ | ○ | ○ | ○ | ○ | ○ | ○ |
| | | Overall judgement | X | X | ○ | ○ | ○ | X | X |

INDUSTRIAL APPLICABILITY

The curable resin compositions of the present invention can be suitably used as, in particular, materials for forming encapsulant for optical semiconductor elements (LED elements) and optical lens (encapsulating agents and lens-forming resin compositions) in optical semiconductor devices.

REFERENCE SIGNS LIST

100: Reflector (light-reflecting resin composition)
101: Metal wiring (electrode)
102: Optical semiconductor element
103: Bonding wire
104: Cured product (encapsulant)

The invention claimed is:

1. A curable resin composition comprising the following components (A), (B), (C) and (D), wherein a content (amount blended) of the component (C) is not less than 0.3 wt % and not more than 20 wt %, based on the total amount (100 wt %) of the curable resin composition:

(A): a polyorganosiloxane represented by the following average unit formula (I):

$$(SiO_{4/2})_{a1}(R^1SiO_{3/2})_{a2}(R^1{}_2SiO_{2/2})_{a3}(R^1{}_3SiO_{1/2})_{a4} \quad (I)$$

wherein each $R^1$ is the same or different and is an alkyl group having 1 to 10 carbon atoms, an aryl group having 6 to 14 carbon atoms, an alkenyl group having 2 to 8 carbon atoms, an alkoxy group having 1 to 10 carbon atoms, or a hydroxyl group, when a percentage of the alkyl group is X mol %, a percentage of the aryl group is Y mol %, and a percentage of the alkenyl group is Z mol % based on the total amount (100 mol %) of $R^1$, X is 50 to 98 mol %, Y is 1 to 50 mol %, and Z is 1 to 35 mol %, and a1, a2, a3, and a4 are numbers satisfying a1>0, a2>0, a3≥0, a4>0, 0.5≤a1/a2≤10, and a1+a2+a3+a4=1;

(B): a polyorganosiloxane represented by the following average composition formula (II):

  (II)

wherein each $R^2$ is the same or different and is an alkyl group having 1 to 10 carbon atoms or an aryl group having 6 to 14 carbon atoms and at least one of $R^2$ is an aryl group, at least 2 hydrogen atoms are bonded to the silicon atom, and m and n are numbers satisfying 0.7≤m≤2.1, 0.001≤n≤1, and 0.8≤m+n≤3;

(C): a straight-chain polyorganosiloxane that is a liquid having a viscosity at 25° C. of 10000 mPa·s or less, represented by the following general formula (III-1):

[Chem. 1]

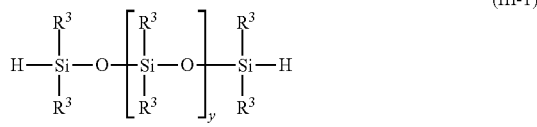  (III-1)

wherein each $R^3$ is the same or different and represents an alkyl group having 1 to 10 carbon atoms, and y represents an integer of not less than 1 and not more than 100; and (D): a hydrosilylation catalyst.

2. The curable resin composition according to claim 1, wherein the component (A) is a polyorganosiloxane that has a weight-average molecular weight of not less than 500 and not more than 50000 in terms of polystyrene, has a molecular weight distribution of not less than 1 and not more than 4, and is a liquid or solid having a viscosity at 25° C. of 10 mPa·s or more.

3. The curable resin composition according to claim 1, wherein a ratio of X to Y (X/Y) in the component (A) is 0.5 to 25.

4. The curable resin composition according to claim 1, further comprising the following component (E):

(E): a polyorganosiloxysilalkylene having a group containing one or more aliphatic carbon-carbon unsaturated bonds in a molecule.

5. The curable resin composition according to claim 1, further comprising the following component (F):

(F): at least one zinc compound selected from the group consisting of zinc carboxylates and zinc-β-diketone complexes.

6. The curable resin composition according to claim 5, wherein a content of the component (F) is 0.01 to 1 wt %, based on the total amount (100 wt %) of the curable resin composition.

7. The curable resin composition according to claim 1, further comprising the following component (G):

(G): a ladder-type polyorganosilsesquioxane having one or more alkenyl groups and one or more aryl groups in a molecule.

8. The curable resin composition according to claim 1, wherein the component (B) comprises at least two structural units represented by ($R^{2'}_2HSiO_{1/2}$) where each $R^{2'}$ is the same or different and is an alkyl group having 1 to 10 carbon atoms or an aryl group having 6 to 14 carbon atoms.

9. The curable resin composition according to claim 1, wherein the component (B) comprises a component (B1) at a content of not less than 1 wt % and not more than 99 wt %, the component (B1) being represented by the following formula (II-1):

[Chem. 2]

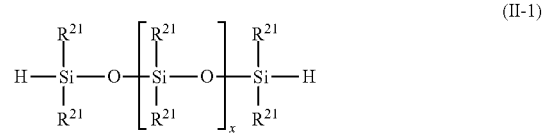  (II-1)

wherein each $R^{21}$ is the same or different and represents an alkyl group having 1 to 10 carbon atoms or an aryl group having 6 to 14 carbon atoms, at least one of $R^{21}$ is an aryl group, and x represents an integer of 0 to 1000, and the component (B1) being a liquid having a viscosity at 25° C. of 10000 mPa·s or less.

10. The curable resin composition according to claim 1, further comprising an isocyanurate compound (H) represented by the following formula (2):

[Chem. 3]

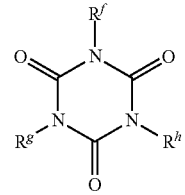  (2)

wherein $R^f$, $R^g$, and $R^h$ are the same or different and each represent a group represented by formula (2a) or a group represented by formula (2b), provided that at least one of $R^f$, $R^g$, and $R^h$ is a group represented by formula (2b):

[Chem. 4]

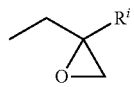  (2a)

wherein $R^i$ is a hydrogen atom, or a straight-chain or branched-chain $C_{1-8}$ alkyl group; and

[Chem. 5]

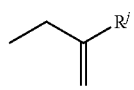  (2b)

wherein $R^j$ is a hydrogen atom or a straight-chain or branched-chain $C_{1-8}$ alkyl group.

11. The curable resin composition according to claim 1, further comprising a silane coupling agent (I).

12. A cured product of the curable resin composition according to claim 1.

13. The cured product according to claim 12, wherein a refractive index at 589 nm thereof is not less than 1.46 and not more than 1.54.

14. The curable resin composition according to claim 1, wherein the curable resin composition is an encapsulating agent.

15. A semiconductor device comprising a semiconductor element and an encapsulant that encapsulates the semiconductor element, wherein the encapsulant is a cured product of the curable resin composition according to claim 14.

16. The semiconductor device according to claim 15, wherein a refractive index at 589 nm of the cured product is not less than 1.46 and not more than 1.54.

17. The semiconductor device according to claim 15, wherein the semiconductor device is an optical semiconductor device.

18. The curable resin composition according to claim 1, wherein the curable resin composition is a lens-forming resin composition.

19. A semiconductor device comprising a semiconductor element and a lens, wherein the lens is a cured product of the curable resin composition according to claim 18.

20. A semiconductor device comprising a semiconductor element, an encapsulant that encapsulates the semiconductor element, and a lens, wherein the encapsulant is a cured product of a curable resin composition comprising the following components (A), (B), (C) and (D), wherein a content (amount blended) of the component (C) is not less than 0.3 wt % and not more than 20 wt %, based on the total amount (100 wt %) of the curable resin composition:

(A): a polyorganosiloxane represented by the following average unit formula (I):

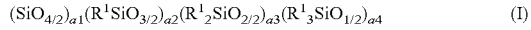  (I)

wherein each $R^1$ is the same or different and is an alkyl group having 1 to 10 carbon atoms, an aryl group having 6 to 14 carbon atoms, an alkenyl group having 2 to 8 carbon atoms, an alkoxy group having 1 to 10 carbon atoms, or a hydroxyl group, when a percentage of the alkyl group is X mol %, a percentage of the aryl group is Y mol %, and a percentage of the alkenyl group is Z mol % based on the total amount (100 mol %) of $R^1$, X is 50 to 98 mol %, Y is 1 to 50 mol %, and Z is 1 to 35 mol %, and a1, a2, a3, and a4 are numbers satisfying a1>0, a2>0, a3≥0, a4>0, 0.5≤a1/a2≤10, and a1+a2+a3+a4=1;

(B): a polyorganosiloxane represented by the following average composition formula (II):

  (II)

wherein each $R^2$ is the same or different and is an alkyl group having 1 to 10 carbon atoms or an aryl group having 6 to 14 carbon atoms and at least one of $R^2$ is an aryl group, at least 2 hydrogen atoms are bonded to the silicon atom, and m and n are numbers satisfying 0.7≤m≤2.1, 0.001≤n≤1, and 0.8≤m+n≤3;

(C): a straight-chain polyorganosiloxane that is a liquid having a viscosity at 25° C. of 10000 mPa·s or less, represented by the following general formula (III-1):

[Chem. 1]

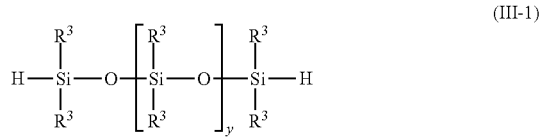  (III-1)

wherein each $R^3$ is the same or different and represents an alkyl group having 1 to 10 carbon atoms, and y represents an integer of not less than 1 and not more than 100; and (D): a hydrosilylation catalyst, and the lens is a cured product of the curable resin composition according to claim 18.

* * * * *